(12) United States Patent
Kato et al.

(10) Patent No.: US 6,876,588 B2
(45) Date of Patent: Apr. 5, 2005

(54) SEMICONDUCTOR STORAGE DEVICE FORMED TO OPTIMIZE TEST TECHNIQUE AND REDUNDANCY TECHNOLOGY

(75) Inventors: Daisuke Kato, Kamakura (JP); Takashi Taira, Yokohama (JP); Kenji Ishizuka, Yokohama (JP); Yohji Watanabe, Yokohama (JP); Munehiro Yoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/664,464

(22) Filed: Sep. 17, 2003

(65) Prior Publication Data

US 2004/0062134 A1 Apr. 1, 2004

Related U.S. Application Data

(62) Division of application No. 10/053,524, filed on Jan. 16, 2002, now Pat. No. 6,741,509.

(30) Foreign Application Priority Data

Jan. 17, 2001 (JP) ........................................ 2001-009370

(51) Int. Cl.[7] .............................................. G11C 7/00
(52) U.S. Cl. ............. 365/200; 365/230.06; 365/230.03; 365/189.05; 365/205; 365/233
(58) Field of Search ............................ 365/200, 230.03, 365/230.06, 189.05, 205, 233

(56) References Cited

U.S. PATENT DOCUMENTS

| | | | | | |
|---|---|---|---|---|---|
| 5,546,349 A | * | 8/1996 | Watanabe et al. | ...... | 365/230.04 |
| 5,615,164 A | * | 3/1997 | Kirihata et al. | ........ | 365/230.06 |
| 5,841,710 A | * | 11/1998 | Larsen | ........................ | 365/200 |
| 6,385,071 B1 | * | 5/2002 | Chai et al. | .................... | 365/49 |
| 6,396,748 B1 | * | 5/2002 | Fujita | .......................... | 365/200 |
| 6,741,509 B2 | * | 5/2004 | Kato et al. | ................... | 365/200 |

OTHER PUBLICATIONS

Yohji Watanabe et al., "A 286 mm$^2$ 256Mb DRAM with x32 Both–Ends DQ", IEEE Journal of Solid–State Circuits, vol. 31, No. 4, Apr. 1996, pp 567–574.

* cited by examiner

Primary Examiner—Viet Q. Nguyen
(74) Attorney, Agent, or Firm—Hogan & Hartson, LLP

(57) ABSTRACT

There is provided a semiconductor storage device in which only a defective element is replaced by a row redundant element to compensate for a defect if at least one of a plurality of elements is defective in a case where the plurality of elements in a memory cell array are simultaneously activated. The semiconductor storage device includes an array control circuit which is configured to interrupt the operation of the defective element by preventing a word line state signal from being received based on a signal to determine whether a row redundancy replacement process is performed or not. The word line state signal is input to the plurality of memory blocks in the cell array unit via a single signal line.

2 Claims, 48 Drawing Sheets

WL ON/OFF control circuit

SA ON/OFF control circuit

STCRST control circuit

BLKSEL latch circuit

TWLON latch circuit

SA control circuit

SA latch circuit

TRDE latch circuit

HIT control circuit

32 Arrays/banks
(shared sense amplifier system)

8k rows   8k rows

Array No.: 31 30 29 28 27 26 25 24 23 22 21 20 19 18 17 16  15 14 13 12 11 10 9 8 7 6 5 4 3 2 1 0

AR_ADD12=0
AR_ADD11=0
AR_ADD10=0
AR_ADD9=0

Active array

AR_ADD12=0
AR_ADD11=0
AR_ADD10=1
AR_ADD9=0

AR_ADD12=0
AR_ADD11=1
AR_ADD10=0
AR_ADD9=0

AR_ADD12=1
AR_ADD11=1
AR_ADD10=1
AR_ADD9=0

FIG. 39

(e.g. xAR_ADD9=AR_ADD9/bAR_ADD9)

TRDE control circuit

SEMICONDUCTOR STORAGE DEVICE FORMED TO OPTIMIZE TEST TECHNIQUE AND REDUNDANCY TECHNOLOGY

CROSS-REFERENCE TO RELATED APPLICATIONS

This application is based upon and claims the benefit of priority from the prior Japanese Patent Application No. 2001-009370, filed Jan. 17, 2001, the entire contents of which are incorporated herein by reference.

This application is a division of Ser. No. 10/053,524, filed Jan. 16, 2002, now U.S. Pat. No. 6,741,509

BACKGROUND OF THE INVENTION

1. Field of the Invention

This invention relates to a semiconductor storage device and more particularly to a semiconductor storage device which is intended to optimize the test technique and redundancy technology.

2. Description of the Related Art

Recently, the storage capacity of the semiconductor storage device keeps on increasing and various test techniques for testing whether or not semiconductor storage devices are correctly operated and redundancy technologies for repairing (compensating for) defects of semiconductor storage devices come to play an important role. In the semiconductor storage device of large storage capacity, it is essential to suppress the test time for making various function tests and enhance the efficiency of the redundancy technology for repairing defects of semiconductor storage devices and lower the cost thereof.

However, it is difficult to optimize the test technique and redundancy technology, and if an attempt is made to test a semiconductor storage device which has been repaired by use of the redundancy technology, the test time becomes longer and the test operation becomes difficult, and if an attempt is made to reduce the test time, the redundancy technology of high efficiency and low cost cannot be applied.

BRIEF SUMMARY OF THE INVENTION

According to an aspect of the present invention, there is provided a semiconductor storage device in which a plurality of word lines are activated together by causing each of the word lines which is once activated to hold the activated state during a plurality of successive word line selection cycles, comprising a latch circuit which is configured to derive the logical AND of a signal activated when a corresponding memory block is accessed and a redundancy miss is first made and a signal generated in each cycle to determine timing for activating a sense amplifier in each cycle, and generates and holds a sense amplifier activation signal.

BRIEF DESCRIPTION OF THE SEVERAL VIEWS OF THE DRAWING

FIG. 30D, FIG. 30F is a pattern plane view showing the wiring layers that connect the WLDV driver to the WL drivers in the circuit illustrated in FIG. 30C, FIG. 30F, FIG. 31 is a circuit diagram showing the concrete configuration of a TRDE control circuit in the circuit shown in FIG. 30A, FIG. 39 is a schematic diagram showing the state of a bank when two word lines are simultaneously activated in the stacked-word-line test mode.

DETAILED DESCRIPTION OF THE INVENTION

First Embodiment

Figure 1:
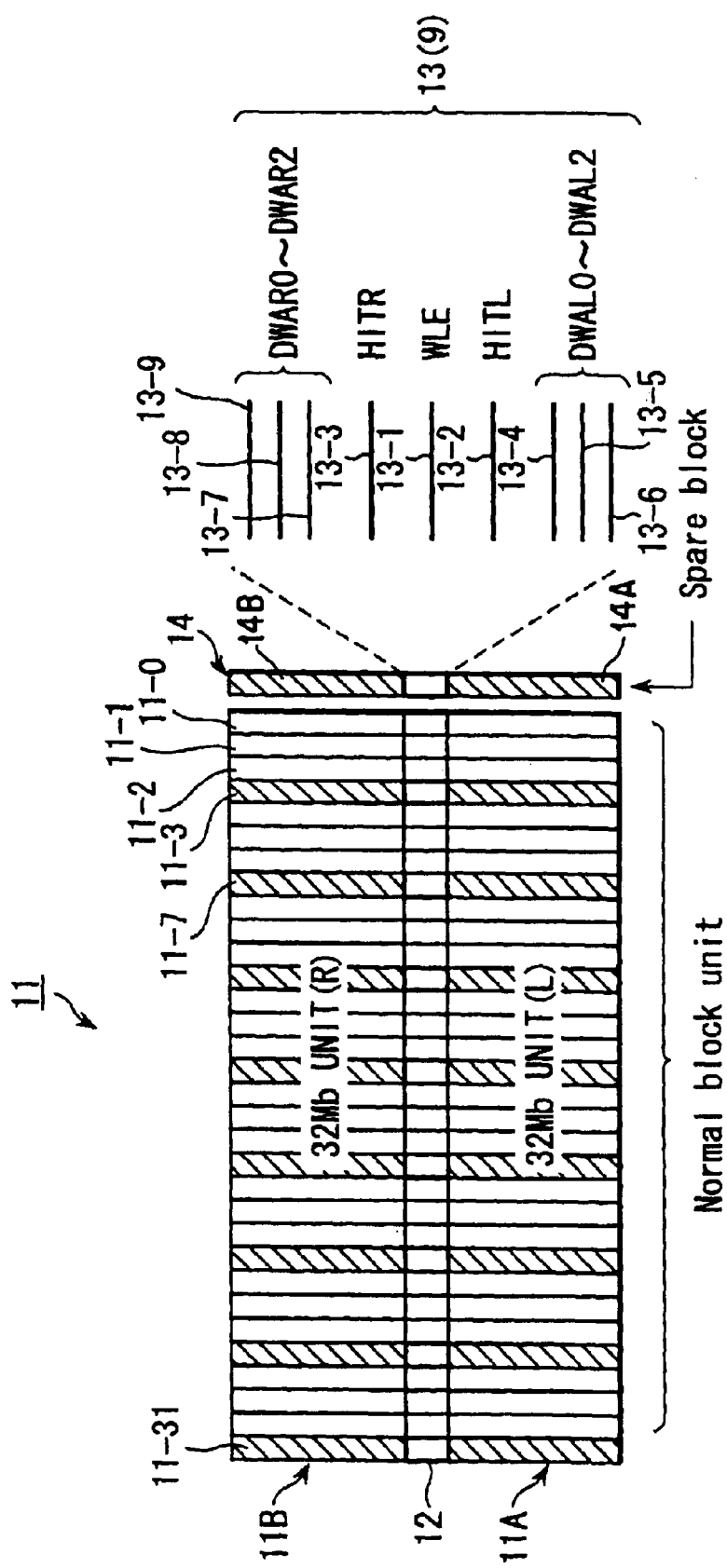
FIG. 1 is a block diagram showing a 64-Mbit memory cell array using a centralized redundancy system, for illustrating the outline of a semiconductor storage device according to a first embodiment of this invention.

FIG. 1 shows a 64-Mbit memory cell array using a centralized redundancy system, for illustrating the outline of a semiconductor storage device according to a first embodiment of this invention. As shown in FIG. 1, a memory cell array 11 is divided into a plurality of arrays 11-0 to 11-31 and an array control circuit section 12 and control signal wiring section 13 are arranged to divide each of the arrays 11-0 to 11-31 into two memory blocks. Thus, a 32-bit normal cell array unit (32 Mb UNIT(L)) 11A and a 32-bit normal cell array unit (32 Mb UNIT(R)) 11B are formed.

Further, in addition to the memory cell array (which is called a normal cell array) 11 which is normally used, a memory cell array (which includes plurality of row redundant elements and are called spare cell arrays in this example) 14 exclusively used for row redundancy replacement is provided, and when at least one of the arrays 11-0 to 11-31 in the normal cell array becomes defective, the defective element (defective word line) in the defective array is replaced and thus repaired (compensated for) by use of the row redundant element (spare word line) in the spare cell array 14 (spare memory blocks 14A and 14B).

In this case, in order to reduce the test time, eight arrays are simultaneously activated at the time of function test and, for example, the arrays 11-3, 11-7, . . . , 11-31 which are hatched in the drawing are simultaneously activated.

In the control signal wiring section 13, nine control signal lines 13-1 to 13-9 are provided. The signal line 13-1 is used for a word line state signal WLE to determine the timings of activation and deactivation of a word line. The signal lines 13-2, 13-3 are used for signals HITL, HITR indicating occurrence of redundancy replacement. The signal lines 13-4, 13-5, 13-6 are used for addresses DWAL0 to DWAL2 to specify a block containing a defective word line in the normal cell array unit 11A. The signal lines 13-7, 13-8, 13-9 are used for addresses DWAR0 to DWAR2 to specify a memory block containing a defective word line in the normal cell array unit 11B.

When replacement of the defective element (defective word line) in the defective array by the row redundant element (spare word line) in the spare memory block 14A or 14B occurs, the signal HITR or HITL rises and the addresses DWAL0 to DWAL2, DWAR0 to DWAR2 indicating the location of the defective memory block having the defective element to be replaced at this time are changed. Then, the operation is performed to prevent a memory block in a position in which coincidence with the addresses DWAL0 to DWAL2 and DWAR0 to DWAR2 occurs from receiving the word line state signal (activation signal) WLE.

Figure 2:
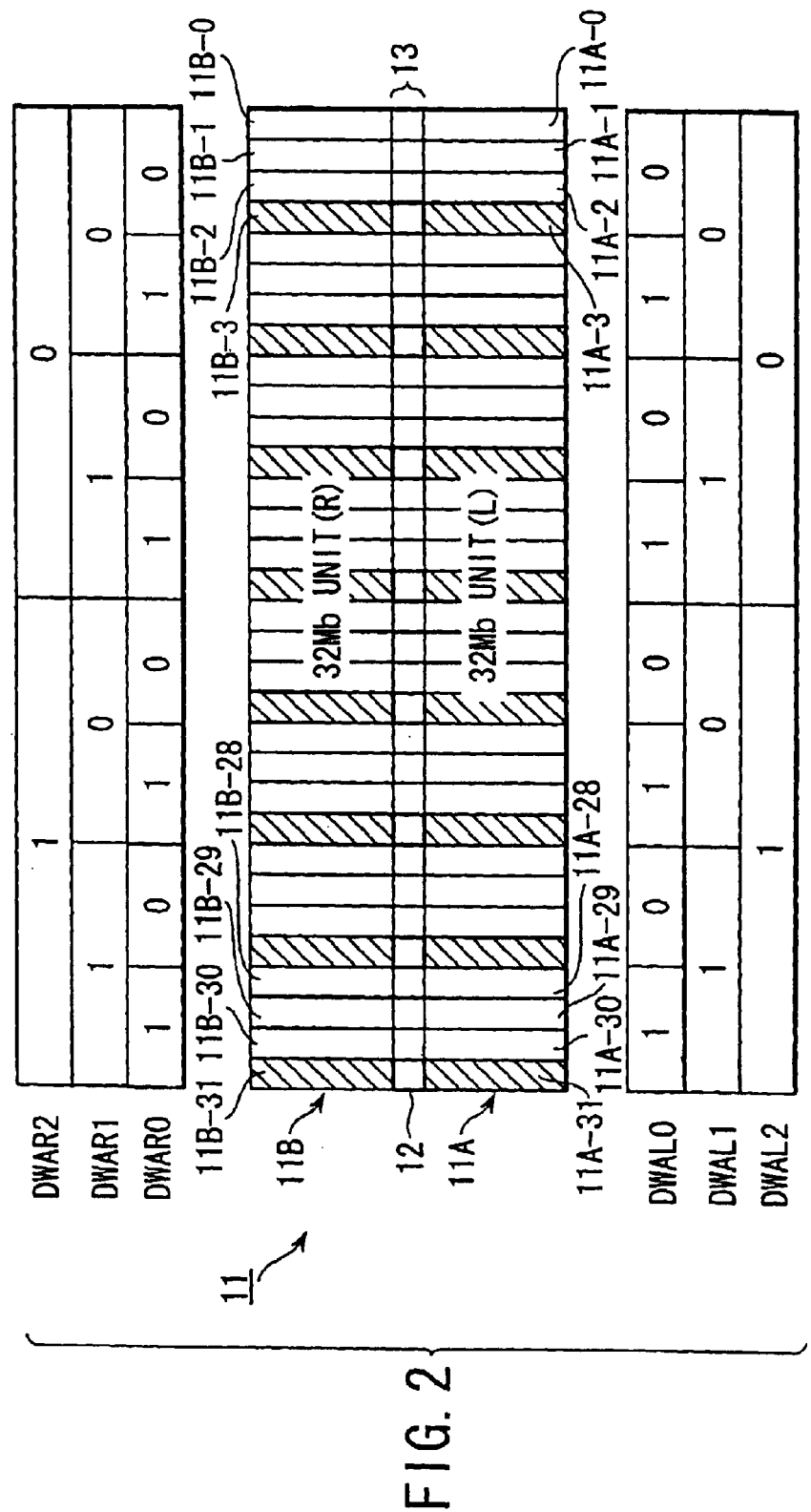
FIG. 2 is a schematic diagram showing an example of assignment of addresses in a normal cell array of the semiconductor storage device shown in FIG. 1.

FIG. 2 shows an example of allocation of the addresses DWAL0 to DWAL2, DWAR0 to DWAR2 in the normal cell array 11. The memory block in the normal cell array unit 11A is selected by the addresses DWAL0 to DWAL2 and the memory block in the normal cell array unit 11B is selected by the addresses DWAR0 to DWAR2. For example, at the time of DWAR0=1, DWAR1=1 and DWAR2=1, memory blocks 11B-28 to 11B-31 which lies in the upper left portion are selected and at the time of DWAR0=0, DWAR1=0 and DWAR2=0, memory blocks 11B-0 to 11B-3 which lies in the upper right portion are selected.

Figure 3:
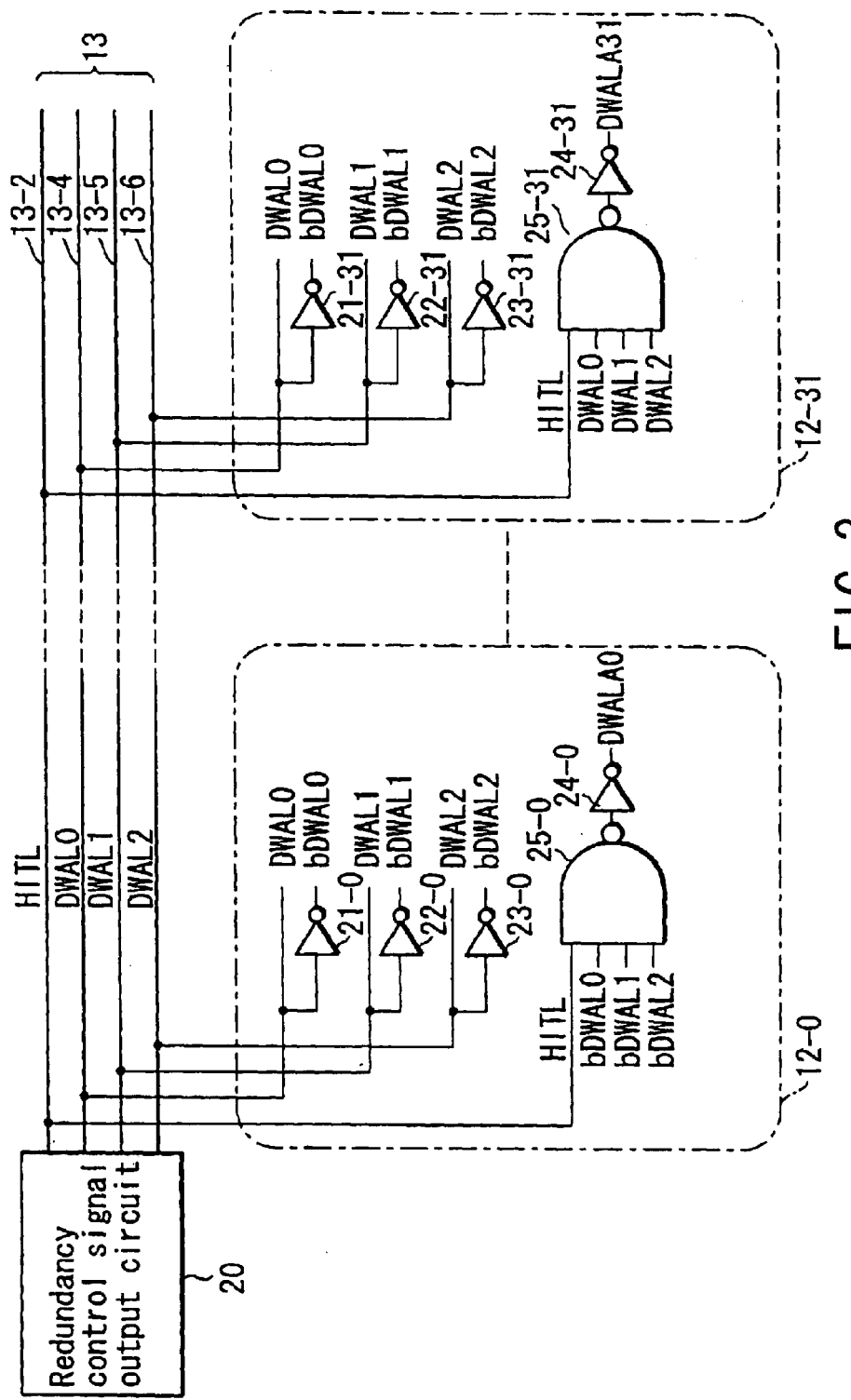
FIG. 3 is a circuit diagram specifically showing an extracted portion of an array control circuit section and control signal wiring section in the semiconductor storage device shown in FIG. 1.

FIG. 3 is a circuit diagram specifically showing an extracted portion (on the normal cell array unit 11A side) of the array control circuit section 12 and control signal wiring section 13 in the semiconductor storage device shown in FIG. 1. A signal HITL indicating that redundancy-replacement occurs and signals (addresses) DWAL0 to DWAL2 having information indicating which memory block among (out of) 11A-0 to 11A-31 to be redundancy-replaced are supplied from a redundancy control signal output circuit 20 to the signal lines 13-2, 13-4, 13-5, 13-6. Further, array control circuits 12-0 to 12-31 corresponding to the respective memory blocks are connected to the signal lines 13-2, 13-4, 13-5, 13-6.

The array control circuit 12-0 is configured by inverters 21-0, 22-0, 23-0, 24-0 and NAND gate 25-0. The addresses DWAL0 to DWAL2 are respectively supplied to the input terminals of the inverters 21-0, 22-0, 23-0 to form inverted signals bDWAL0 to bDWAL2 thereof. The signals bDWAL0 to bDWAL2 and signal HITL are supplied to the input terminals of the NAND gate 25-0. An output signal of the NAND gate 25-0 is inverted by the inverter 24-0 to form a signal DWALA0 indicating whether a corresponding memory block is disabled or not.

The array control circuits 12-1 to 12-31 are configured in the same manner as described above and signals DWALA1 to DWALA31 indicating whether corresponding memory blocks are disabled or not are respectively formed.

Further, the normal cell array unit 11B is configured in the same manner as the normal cell array unit 11A and the signal line 13-1 for the word line state signal WLE is commonly used by the normal cell array units 11A and 11B.

Figure 4A:
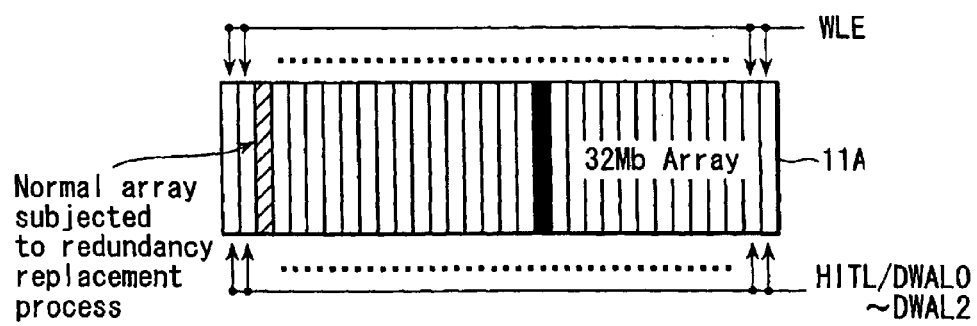
FIG. 4A is a schematic diagram for illustrating a redundancy replacement operation in the semiconductor storage device shown in FIGS. 1 to 3.
Figure 4B:
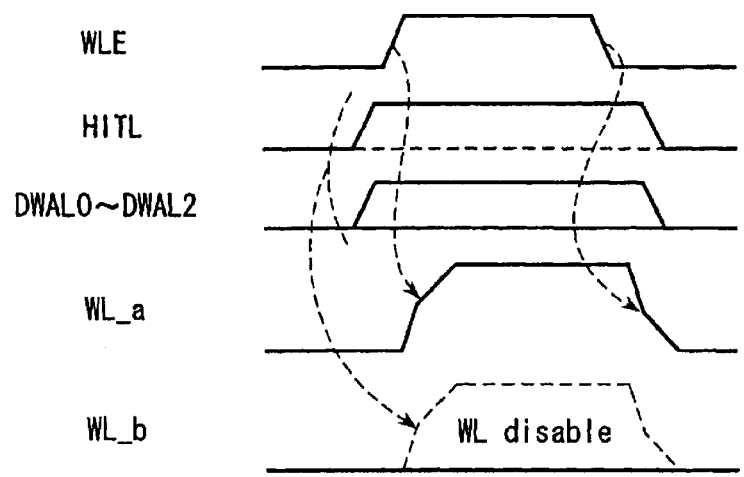
FIG. 4B is a timing chart for illustrating a redundancy replacement operation in the semiconductor storage device shown in FIGS. 1 to 3.

FIGS. 4A and 4B illustrate the redundancy-replacement operation in the semiconductor storage device shown in FIGS. 1 to 3 in which the normal cell array unit 11A is shown as an example. If one spare cell array is provided in the centralized redundancy system, the redundancy replacement operation can be performed when only one of word lines becomes defective in a case where the word lines of a plurality of memory blocks in the normal cell array unit 11A are simultaneously activated. At this time, the control operation is performed to select the spare word line of the spare memory block 14A instead of the defective word line and not to select the to-be-replaced word line in the normal cell array.

That is, as shown in the timing chart of FIG. 4B, the signal HITL indicating occurrence of redundancy-replacement first rises to the "H" level and the addresses DWAL0 to DWAL2 which indicate the position of the memory block to be replaced are set. In this state, if the signal WLE rises to the "H" level, a to-be-replaced word line WL_b of the normal cell array is set into the non-selected state (WL disable) and a spare word line WL_a of the spare memory block 14A rises to the "H" level and is set into the selected state. Then, if the signal WLE falls to the "L" level, the spare word line WL_a of the spare memory block 14A falls to the "L" level and is set into the non-selected state.

As described above, in the semiconductor storage device according to the first embodiment, a plurality of ($2^n$: n is a natural number) elements (memory block) in the normal cell array unit 11A, 11B are simultaneously activated, and if at least one of the plurality of elements is defective, the control operation for selectively replacing only the defective element by use of a row redundant element is performed by use of one signal (HITL/HITR) to determine whether row redundancy-replacement is made or not and n signals (addresses DWAL, DWAR) to determine one of the plurality of elements to be simultaneously activated at the time of row redundancy-replacement.

Further, it is also possible to consider a modification in which the redundant element in the spare cell is used to replace any one of defective elements (defective word lines) in the normal cell array unit.

That is, memory block activation signals of a number corresponding to the number of elements (memory blocks) to be simultaneously activated are not required, a word line state signal WLE which is obtained by unifying the activation signal and deactivation signal is used, and word lines whose address coincide with the input address are activated when the word line state signal WLE rises and the word lines are deactivated when the word line state signal WLE falls. Further, in the row redundancy replacement process, addresses (DWALn, DWARn) containing information which indicates which memory block to be replaced and a signal (HITL, HITR) indicating occurrence of redundancy replacement are used. In addition, the addresses DWALn, DWARn containing information which indicates which memory block to be replaced are locally decoded in the array control circuits of the memory blocks.

Therefore, with the above configuration, since a plurality of elements (memory blocks) can be simultaneously activated, the test time can be reduced and since signals containing redundancy information can be locally decoded, the number of memory blocks to be simultaneously activated can be easily increased and the test time can be made shorter. Further, an increase in the number of control signal lines can be suppressed to minimum and, for example, it is sufficient to provide nine signal lines used for the signals WLE, HITL, HITR and addresses DWAL0 to DWAL2 and DWAR0 to DWAR2 if eight memory blocks to be simultaneously activated are provided, for example. That is, if $2^n$ memory blocks to be simultaneously activated are provided, it is sufficient to use n addresses DWALn, DWARn. Thus, an increase in the number of wirings can be suppressed and the cost can be lowered by a reduction in the chip size.

Second Embodiment

FIGS. 5 to 12 illustrate a semiconductor storage device according to a second embodiment of this invention in which an attempt is made to reduce the test time by using a stacked-word-line test mode (Stacked WL Test Mode).

In this case, the stacked-word-line test mode (which is also called a Multiple WL Test Mode) is a operation mode in which N or more word lines are set into the activated state by sequentially activating the word lines with corresponding delay times if the number of word lines to be simultaneously activated in the memory cell array (or cell array unit) at the time of normal read/write operation, for example, is N.

In the above stacked-word-line test mode, in order to ensure that data can be read out from the memory cell, some restrictions are imposed on the number of word lines to be selected. That is, the number of word lines which can be activated for some bit line pares and sense amplifiers associated therewith (which are collectively referred to as a memory block) is only one. Further, when the sense amplifiers are commonly used or shared by adjacent memory blocks (shared sense amplifier), the word line can be selected in only either of the memory blocks which commonly use the sense amplifiers. In other words, word lines of only N/2 at maximum can be selected in a memory cell array (or cell array unit) having N memory blocks.

Figure 5:
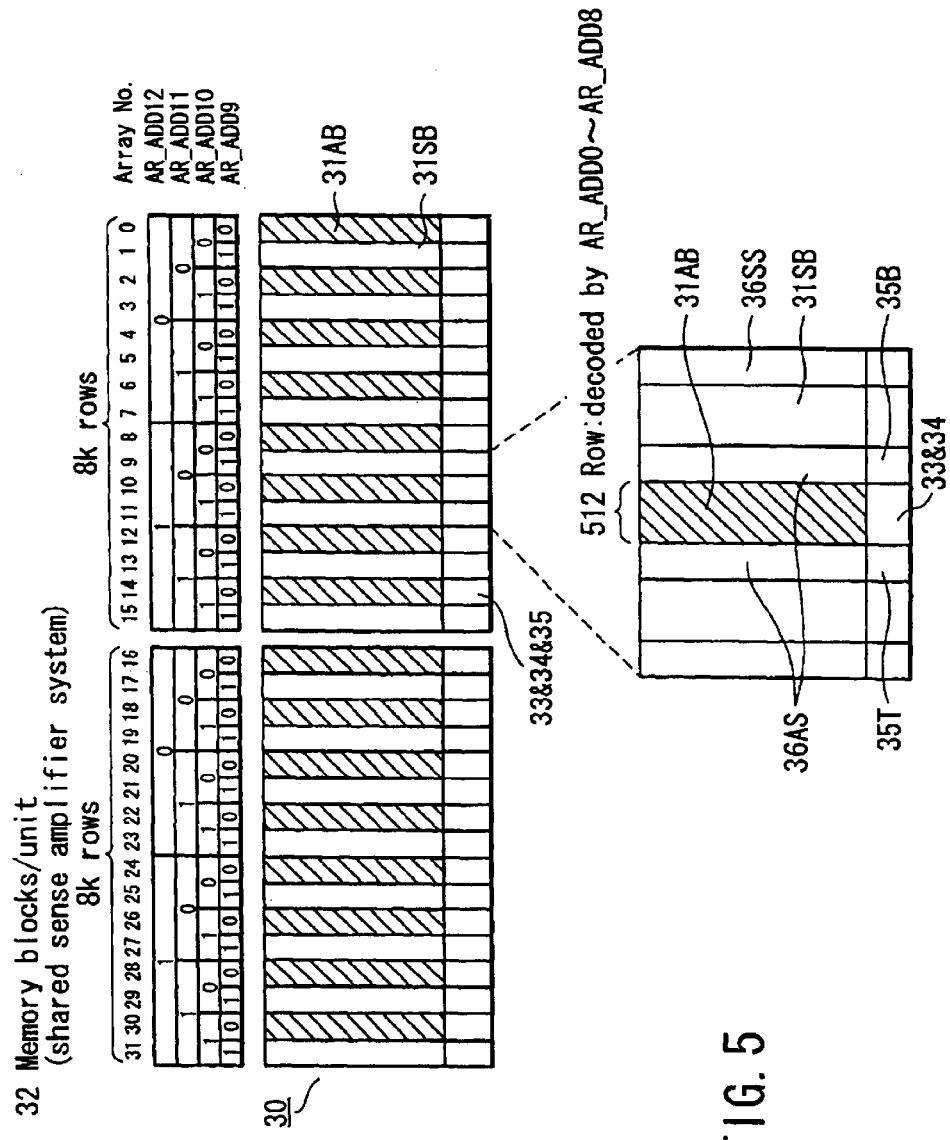
FIG. 5 is a block diagram showing part of a bank, for illustrating a semiconductor storage device according to a second embodiment of this invention.

Next, the configuration of the semiconductor storage device of shared sense amplifier system which realizes the stacked-word-line test mode is explained with reference to FIGS. 5 to 10. FIG. 5 shows part of a bank configured by a plurality of cell array units, one cell array unit 30 is configured by 32 memory blocks (32 memory blocks/unit) and active memory blocks 31AB and sleep memory blocks 31SB are alternately arranged. Row decoder sections 33, word line (WL) driver sections 34 and array control circuits 35T, 35B are respectively arranged in positions adjacent to the corresponding memory blocks 31AB, 31SB. The memory blocks (Array No. 0 to 31) are divided into two sections by 8k rows and selected by row addresses AR_ADD9 to AR_ADD12 as shown in the drawing.

More specifically, two active sense amplifiers 36AS are arranged on both sides of each of the active memory blocks 31AB and a sleep sense amplifier 36SS is arranged adjacent to each of the sleep memory blocks 31SB. Further, the row decoder sections 33 and word line driver sections 34 are arranged adjacent to each of the memory blocks and a first array control circuit (top) 35T and second array control circuit (bottom) 35B are arranged adjacent to the respective active sense amplifiers 36AS.

Although not shown in the drawing, column decoders, redundancy control circuit, re-driver, X pre-decoder and bank control circuit are provided for the memory cell array (or cell array unit) 30.

Figure 6:
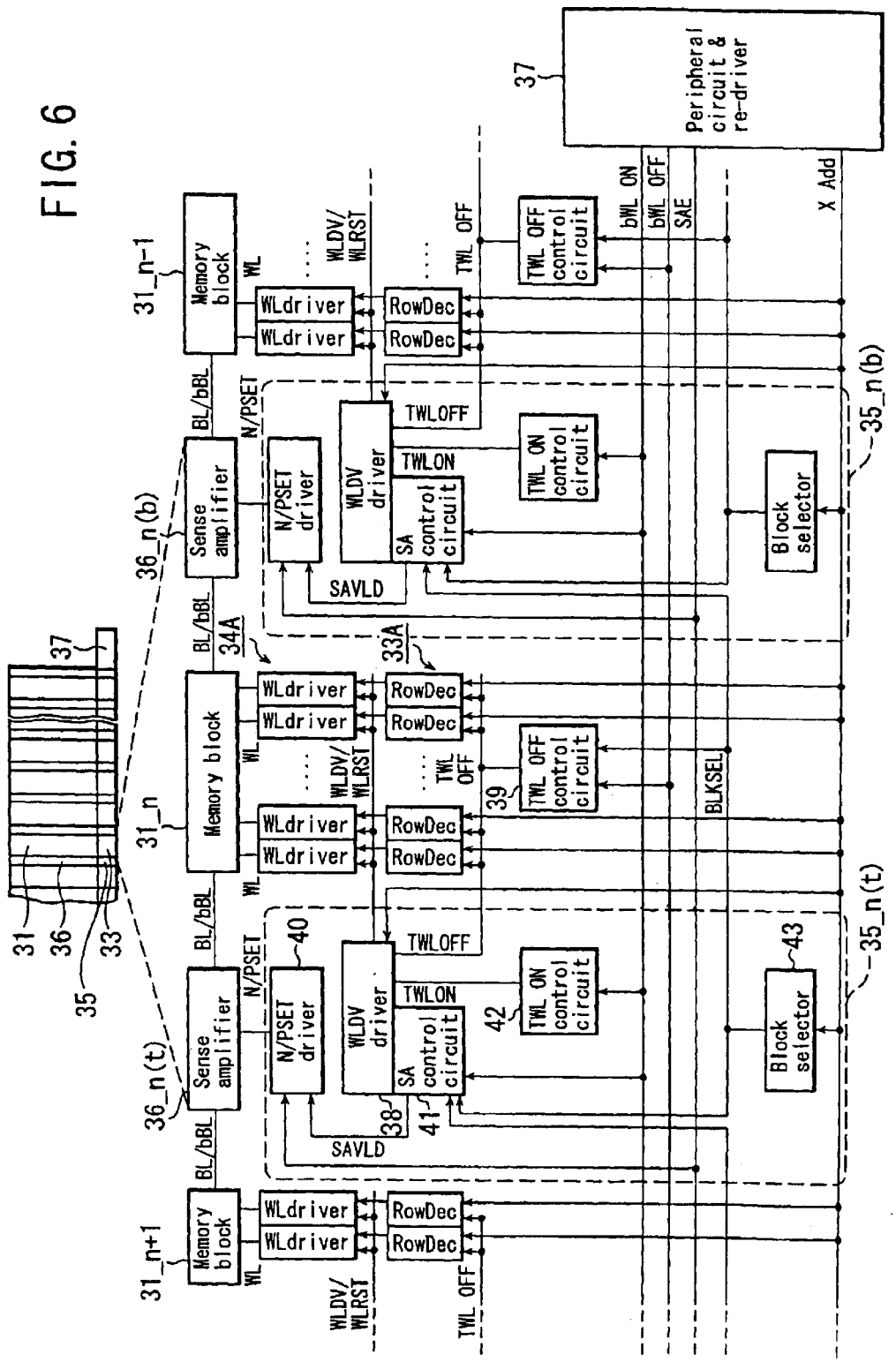
FIG. 6 is a circuit diagram showing an example of the concrete configuration of extracted portions of memory cells, sense amplifiers, row decoders and array control circuits in a memory cell array.

FIG. 6 is a circuit diagram showing an example of the concrete configuration of the memory blocks 31, sense amplifiers 36, row decoder sections 33, word line driver sections 34 and array control circuits 35T (35_n(t)), 35B (35_n(b)) extracted from the memory cell array (or cell array unit) 30. The memory block 31_n and the sense amplifiers 36_n(t), 36_n(b) are connected to each other via plurality of paired bit lines BL/bBL. The word lines WL connected to the memory block 31_n are driven by the word line drivers 34A arranged in the word line driver section 34. The word line driver 34A is supplied with a decoded signal output from the row decoder 33A and a signal WLDV/WLRST which is output from a WLDV driver 38 to control driving and resetting of the word lines. The row decoder 33A is supplied with address signals XAdd output from a peripheral circuit and re-driver 37 and a signal TWLOFF which is output from a TWLOFF control circuit 39 to interrupt driving of the word line. The TWLOFF control circuit 39 is supplied with a signal bWLOFF which is output from the peripheral circuit and re-driver 37 to interrupt driving of the word line and a block selection signal BLKSEL output from a block selector 43.

The sense amplifiers 36_n(t), 36_n(b) are respectively connected to the first and second array control circuits 35_n(t), 35_(b). The first and second array control circuits 35_n(t), 35_n(b) are each configured to include the WLDV driver 38, N/PSET driver 40, sense amplifier (SA) control circuit 41, TWLON control circuit 42, block selector 43 and the like. Activation and deactivation of the sense amplifier 36_n(t/b) are controlled by the signal N/PSET output from the N/PSET driver 40. The N/PSET driver 40 is supplied with an output signal SAVLD of the SA control circuit 41 and a sense amplifier enable signal SAE output from the peripheral circuit and re-driver 37. Further, the WLDV driver 38 is supplied with a signal TWLOFF output from the TWLOFF control circuit 39 and a signal TWLON output from the TWLON control circuit 42. Driving of the word line is determined by the signal TWLON and interruption of driving of the word line is determined by the signal TWLOFF. The TWLON control circuit 42 is supplied with the signal bWLON output from the peripheral circuit and re-driver 37. Further, the SA control circuit 41 is supplied with the signal bWLON output from the peripheral circuit and re-driver 37, a signal BLKSEL output from the block selector 43 and a signal BLKSEL output from an adjacent next-stage block selector 43. The block selector 43 is supplied with the signal XAdd output from the peripheral circuit and re-driver 37.

Figure 7:
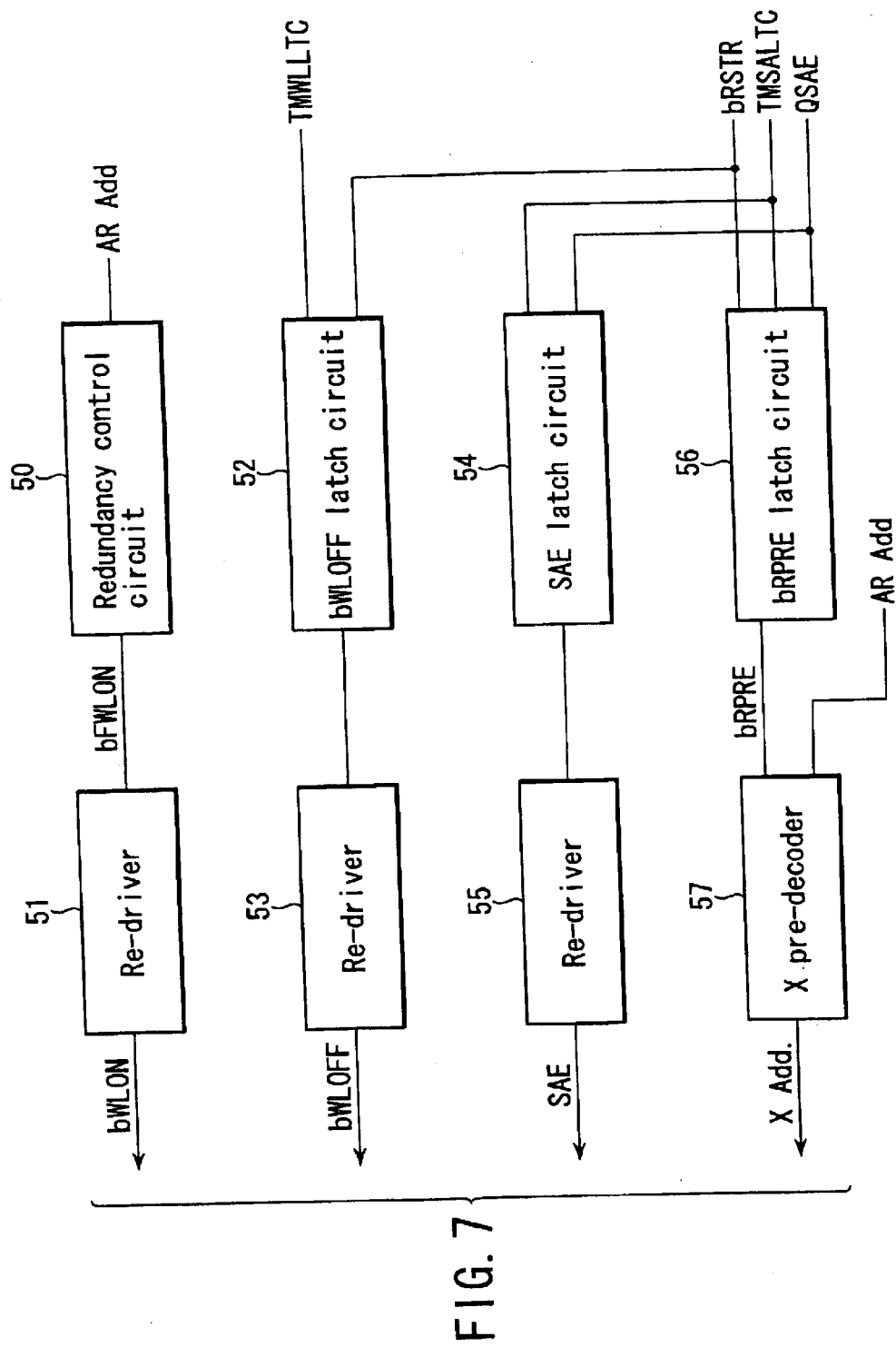
FIG. 7 is a circuit diagram showing an example of the configuration of extracted portions of an X_ADD pre-decoder, redundancy control circuit and re-drivers in a peripheral circuit and re-driver shown in FIG. 6.

FIG. 7 is a circuit diagram showing an example of the configuration of an X pre-decoder, redundancy control circuit and re-driver extracted from the peripheral circuit and re-driver 37 in the circuit shown in FIG. 6. The circuit is configured to include a redundancy control circuit 50, re-driver 51, bWLOFF latch circuit 52, re-driver 53, SAE latch circuit 54, re-driver 55, bRPRE latch circuit 56, X pre-decoder 57 and the like.

A signal ARAdd is supplied to the redundancy control circuit 50 and a signal bFWLON output from the redundancy control circuit 50 is supplied to the re-driver 51. The signal bWLON is output from the re-driver 51.

Signals TMWLLTC and bRSTR are supplied to the bWLOFF latch circuit 52, an output signal of the bWLOFF latch circuit 52 is supplied to the re-driver 53 and the signal bWLOFF is output from the re-driver 53.

Further, signals TMSALTC and QSAE are supplied to the SAE latch circuit 54, and an output signal of the SAE latch circuit 54 is supplied to the re-driver 55 and the signal SAE is output from the re-driver 55.

The signals bRSTR, TMSALTC and QSAE are supplied to the bRPRE latch circuit 56, an output signal bRPRE of the bRPRE latch circuit 56 and the signal ARAdd are supplied to the X pre-decoder 57 and the signal XAdd is output from the X pre-decoder 57.

Figure 8:
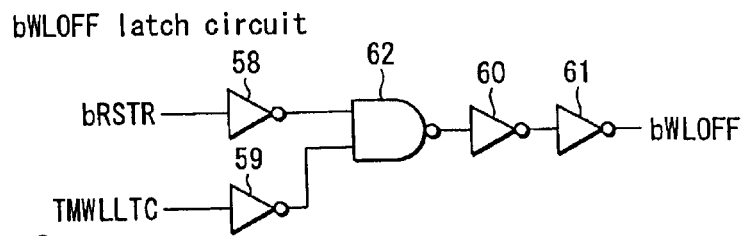
FIG. 8 is a circuit diagram showing an example of the configuration of a bWLOFF latch circuit shown in FIG. 7.

FIG. 8 is a circuit diagram showing an example of the configuration of the bWLOFF latch circuit 52 in the circuit shown in FIG. 7. The bWLOFF latch circuit 52 is configured by inverters 58 to 61 and NAND gate 62. The signals bRSTR and TMWLLTC are respectively supplied to the input terminals of the inverters 58 and 59. Output signals of the inverters 58, 59 are supplied to the NAND gate 62 and an output signal of the NAND gate 62 is output as a signal bWLOFF via the inverters 60, 61.

Figure 9:
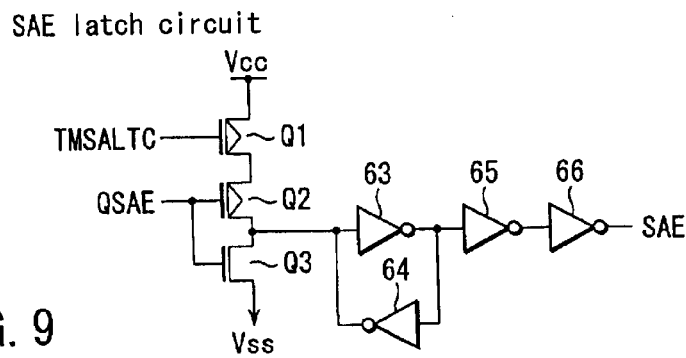
FIG. 9 is a circuit diagram showing an example of the configuration of an SAE latch circuit shown in FIG. 7.

FIG. 9 is a circuit diagram showing an example of the configuration of the SAE latch circuit 54 in the circuit shown in FIG. 7. The SAE latch circuit 54 is configured by P-channel MOS transistors Q1, Q2, N-channel MOS transistor Q3 and inverters 63 to 66. The current paths of the MOS transistors Q1 to Q3 are serially connected between a power supply Vcc and a ground node Vss. The signal TMSALTC is supplied to the gate of the MOS transistor Q1 and the signal QSAE is supplied to the gates of the MOS transistors Q2, Q3. A connection node of the current paths of the MOS transistors Q2 and Q3 is connected to the input terminal of the inverter 63. The input terminal and output terminal of the inverter 63 are respectively connected to the output terminal and input terminal of the inverter 64. Further, the output terminal of the inverter 63 is connected to the input terminal of the inverter 65, and the output terminal of the inverter 65 is connected to the input terminal of the inverter 66. The signal SAE is output from the output terminal of the inverter 66.

Figure 10A:
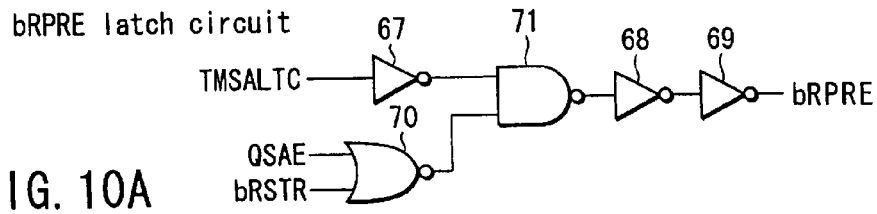
FIG. 10A is a circuit diagram showing an example of the configuration of a bRPRE latch circuit shown in FIG. 7.
Figure 10B:
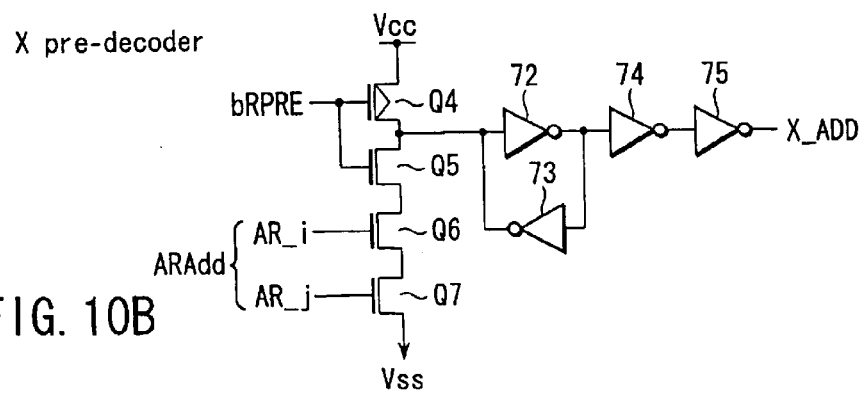
FIG. 10B is a circuit diagram showing an example of the configuration of an X pre-decoder shown in FIG. 7.

FIGS. 10A and 10B are circuit diagrams respectively showing examples of the configurations of the bRPRE latch circuit 56 and X pre-decoder 57 in the circuit shown in FIG. 7. The bRPRE latch circuit 56 shown in FIG. 10A is configured to include inverters 67 to 69, NOR gate 70 and NAND gate 71. The signal TMSALTC is supplied to one input terminal of the NAND gate 71 via the inverter 67. The signals QSAE and bRSTR are supplied to the input terminals of the NOR gate 70 and an output signal of the NOR gate 70 is supplied to the other input terminal of the NAND gate 71. An output signal of the NAND gate 71 is output as the signal bRPRE via the inverters 68, 69.

The X pre-decoder 57 shown in FIG. 10B is configured to include a P-channel MOS transistor Q4, N-channel MOS transistor Q5 to Q7 and inverters 72 to 75. The current paths of the MOS transistors Q4 to Q7 are serially connected between the power supply Vcc and the ground node Vss. The signal bRPRE output from the bRPRE latch circuit 56 is supplied to the gates of the MOS transistors Q4, Q5, an address signal AR__i is supplied to the gate of the MOS transistor Q6 and an address signal AR__j is supplied to the gate of the MOS transistor Q7. A connection node of the current paths of the MOS transistors Q4 and Q5 is connected to the input terminal of the inverter 72. The input terminal and output terminal of the inverter 72 are respectively connected to the output terminal and input terminal of the inverter 73. Further, the output terminal of the inverter 72 is connected to the input terminal of the inverter 74 and the output terminal of the inverter 74 is connected to the input terminal of the inverter 75. A signal X__ADD is output from the output terminal of the inverter 75.

The signal X__ADD (XAdd) is input to the WLDV drivers 38, row decoders 33A and block selectors 43. In the case of 8k rows and 32 memory blocks/unit, a signal X__ADD01 (AR__ADD0, AR__ADD1) is input to the WLDV drivers 38, signals X__ADD23, 45, 678 (AR__ADD2 to AR__ADD8) are input to the row decoders 33A and signals X__ADD910, 1112 (AR__ADD9 to AR__ADD12) are input to the block selectors 43. The 8k word lines are selectively activated by use of the addresses X__ADD.

Figure 11:
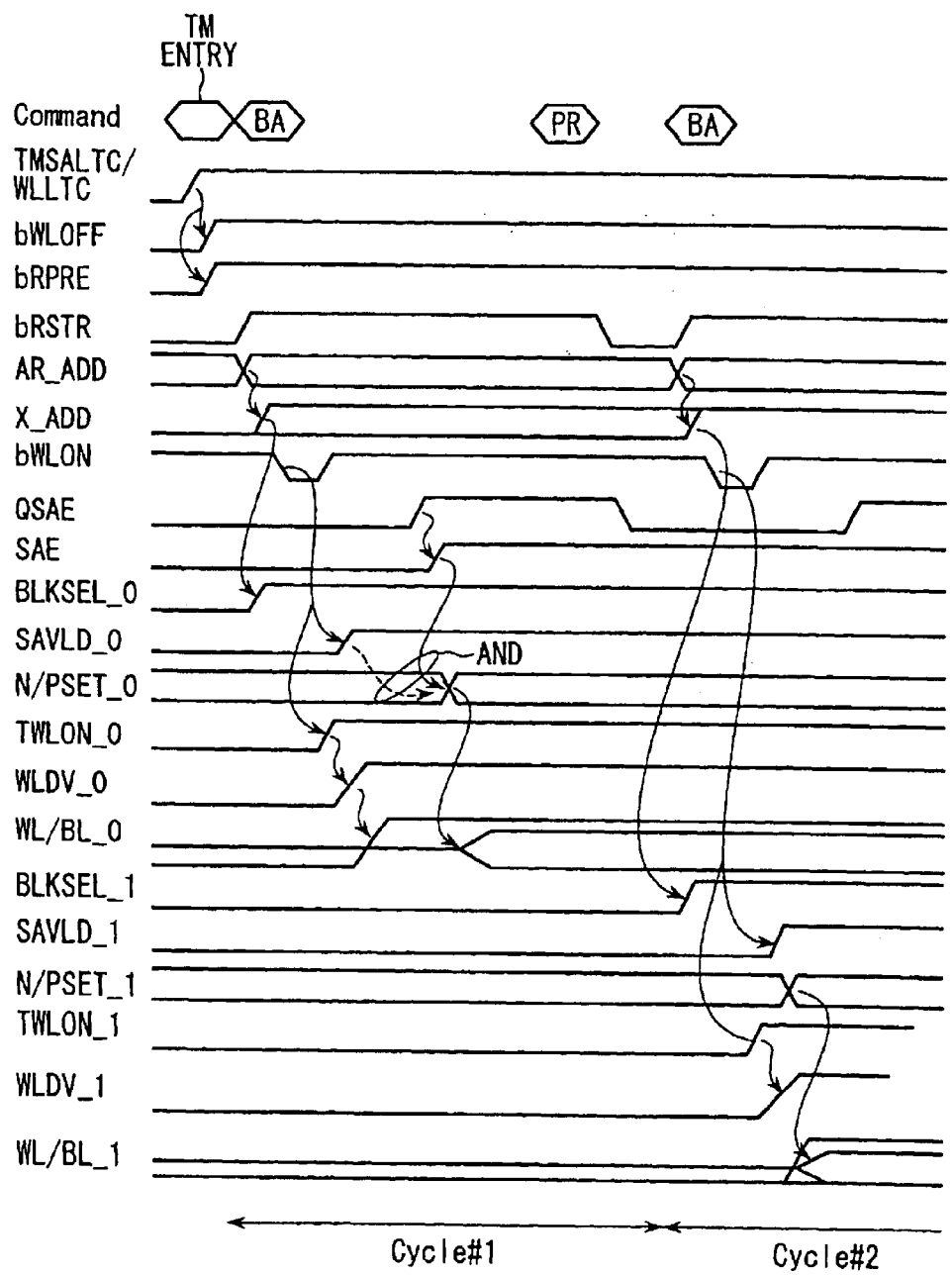
FIG. 11 is a timing chart for illustrating the operation in the stacked-word-line test mode (in the case of redundancy miss)

Next, the operation in the stacked-word-line test mode is explained with reference to the timing chart shown in FIG. 11. If entry is made into the stackedword-line test mode (TM ENTRY), TMSALTC becomes "H" and TMWLLTC becomes "H". In response to this, bWLOFF is changed from "L" to "H", bRPRE is changed from "L" to "H" and the state is kept unchanged unless the operation departs from the test mode.

First, a first word line is selected and the potential thereof is set to the "H" level (cycle #1). In this example, since the 32 memory blocks/memory cell array (cell array unit) are used, the number of selectable word lines for each memory cell array (cell array unit) is 16 at maximum. Since only one of the word lines in each of the memory blocks is selected, the row address (AR__ADD0 to AR__ADD8) used for decoding the array (specifying the row in the array) is fixedly set. Since the 16 memory blocks are selected without activating the adjacent memory block on the condition that the shared sense amplifier system is used, row addresses AR__ADD10, AR ADD11, AR__ADD12 used for selecting the memory blocks are sequentially added and fetched (the row address AR__ADD9 is fixedly set).

When a bank active command BA is received, a signal bRSTR (internal RAS) is changed from "L" to "H", the fetched row address is transferred to AR_ADD9, AR_ADD10, AR_ADD11, AR ADD12 to activate the addresses X_ADD910_0, X_ADD1112_0. In response to the activated addresses X_ADD910_0, X_ADD1112_0, a signal BLKSEL_0 output from the block selector 43 is changed from "L" to "H". In response to the change, the TWLOFF control circuit 39 sets TWLOFF from "L" to "H" to release the row decoders 33A from the precharge state. As a result, a word line driver 34A determined by a row decoder selected by the previously activated addresses X_ADD23, X_ADD45, C_ADD678 is activated.

Further, the fetched address AR_ADD is also input to the redundancy control circuit 50 and compared with redundancy information. That is, the input address AR_ADD and previously programmed redundancy information (for example, address information determined by cut-off of the fuse) are compared with each other. As a result, if no coincidence can be attained (non-coincidence, which is hereinafter referred to as a miss or redundancy miss), the signal bFWLON becomes a pulse of "L" level. If coincidence can be attained (coincidence, which is hereinafter referred to as a hit or redundancy hit), the signal bFWLON is kept at the "H" level.

In the case of redundancy miss, TWLON_0(b/t) is changed from "L" to "H" and WLDV_0 and WLRST_0 determined by the signal X_ADD01_0 are changed from "L" to "H" and "H" to "L", respectively, in response to the "L" level pulse of the signal bWLON. Further, the previously activated word line driver sets the word line WL_0 from "L" to "H" in response to WLDV_0 of "H" and WLRST_0 of "L" so as to transfer data stored in the memory cell onto the bit line BL_0.

Next, activation of the sense amplifier 36_n(t/b) is explained. When the sense amplifier control circuit 41 selected by the signal BLKSEL_0 receives bWLON of "L", SAVLD_0(b/t) is set from "L" to "H". When a sufficiently long time has elapsed so that WL can be expected to be sufficiently set to "H" by use of the word line delay ensuring circuit arranged in the peripheral circuit section, QSAE is set from "L" to "H". In response to QSAE of "H", the SAE latch circuit 54 outputs SAE which is changed from "L" to "H" via the re-driver 55. At present, since TMSALTC is held at "H", SAE of "H" is kept unchanged unless the operation departs from the test mode. In response to SAE which is changed from "L" to "H", the N/PSET driver 40 sets NSET_0(b/t) from "L" to "H" and sets bPSET_0(b/t) from "H" to "L" to activate the sense amplifier 36_n(t/b). Therefore, the sensing operation of the bit lines BL/bBL can be performed by use of the sense amplifier 36_n(t/b).

After this, when a bank precharge command PR is received, bRSTR is set from "H" to "L" and QSAE is set from "H" to "L". In the normal read/write operation, bWLOFF is set from "H" to "L" and selected WL is set from "H" to "L" in response to bRSTR of "L". Further, in response to QSAE of "L", SAE is set to "L" and NSET= "L"/bPSET="H" so as to deactivate the sense amplifier 36_n(t/b) and equalize the bit lines BL/bBL.

However, in this case, since bWLOFF of "H"/SAE of "H" is maintained if entry is made into the test mode, the word line WL is selected and kept in the activated state, the sense amplifier 36_n(t/b) is kept in the activated state and the potentials of the bit lines BL/bBL are kept latched. Further, since bRPRE is held at "H", all of the selected signals X_ADD are held in the activated state (X_ADD is not reset). In other circuits, the states are transferred to the same states as those in which the bank precharge command of the normal operation is received.

Next, the operation for selecting the next word line WL is started (cycle #2). Like the case of the first cycle, when a bank active command BA is received, a new row address (AR_ADD) is fetched. The signal bRSTR (internal RAS) is changed from "L" to "H", the fetched row address is transferred to the addresses AR ADD9, AR ADD10, AR_ADD11, AR_ADD12 to activate X_ADD910_1, X_ADD1112_1. At this time, the signals X_ADD910_0, X_ADD1112_0 which were activated in the preceding cycle are kept in the activated state. Then, the same operation as that in the first cycle is performed and the word line driver 34A determined by the selected row decoder 33A is activated. Further, the fetched address AR_ADD is also input to the redundancy control circuit and compared with redundancy information.

In the case of redundancy miss, TWLON_1(b/t) is changed from "L" to "H" and WLDV_1 and WLRST_1 determined by the signal X_ADD01_1 are changed from "L" to "H" and "H" to "L", respectively, in response to the "L" level pulse of the signal bWLON. Further, the previously activated word line driver 34A sets the word line WL_1 from "L" to "H" in response to WLDV_1 of "H" and WLRST_1 of "L" so as to transfer data stored in the memory cell onto the bit line BL_1.

The operation for activation of the sense amplifier 36_n (t/b) is different in the first cycle and in the second and succeeding cycles. The operation is the same as that in the first cycle until the sense amplifier control circuit 41 selected by the signal BLKSEL_1 receives bWLON of "L" to set SAVLD_1(b/t) from "L" to "H". In this case, since SAE is held at "H", the N/PSET driver 40 immediately sets NSET_1(b/t) from "L" to "H" and sets bPSET_1(b/t) from "H" to "L" in response to SAVLD_1(b/t) of "H". Therefore, since the sense amplifier 36_n(t/b) is activated before the word line WL_1 is activated to sufficiently transfer data of the memory cell to the bit line BL_1 and the sense amplifying operation for the bit line is performed by use of undetermined data, memory cell data stored in the word line WL_1 may be destroyed and the correct operation cannot be ensured.

After this, all of the activated word lines are returned to the precharge state. If a command which causes the operation to depart from the stacked-wordline test mode is received, TMSALTC is set from "H" to "L" and TMWLLTC is set from "H" to "L". In response to the change, bWLOFF is set from "H" to "L" and bRPRE is set from "H" to "L" to return all of the bit lines and word lines which are activated in the test mode to the precharge state. However, since the operation for setting WL from "H" to "L" and the operation for equalizing the bit lines are started at the same time, the equalize operation of the bit lines is started before the word line potential is lowered to a sufficiently low level (the transistor of the memory cell is completely turned OFF). Therefore, data of the memory cell cannot be ensured.

Figure 12:
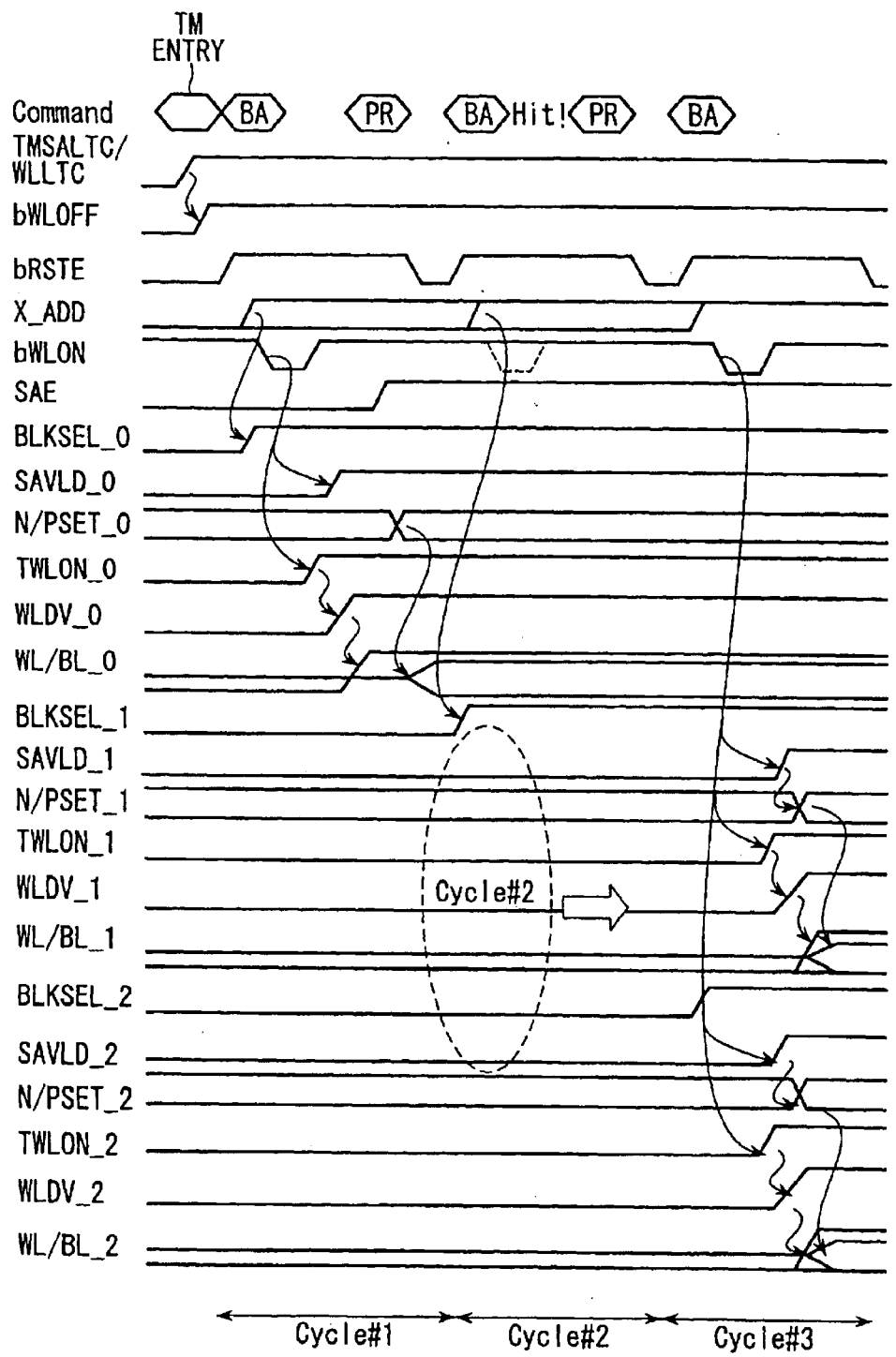
FIG. 12 is a timing chart for illustrating the operation in the stacked-word-line test mode (in the case of redundancy hit)

Next, the case of redundancy hit is considered (refer to the timing chart of FIG. 12). In this case, the explanation is made on the assumption that the redundancy hit is made in the second cycle. The same operation as that in the case of redundancy miss is performed until entry (TM ENTRY) is made into the test mode and the bank activation process and bank precharge operation of the cycle #1 are performed.

In the second cycle, the operation for selecting a next word line is started. Like the case of the first cycle, when the bank active command BA is received, a new row address (AR_ADD) is fetched. Then, the same operation as that in the first cycle is performed to activate the word line driver 34A selected by the row decoder 33A. Further, the fetched row address AR_ADD is also input to the redundancy control circuit and compared with redundancy information. In the case of redundancy hit, since the signal bWLON is kept at the "H" level state by the redundancy control circuit, TWLON_1(b/t) is maintained at "L" and WLDV_1 and WLRST_1 determined by the signal X_ADD01_1 are respectively kept at "L" and "H". Therefore, the previously activated word line driver 34A sets the word line WL_1 to "L" in response to WLDV_1 of "L" and WLRST_1 of "H" so as to maintain the deactivated state.

The operation for activation of the sense amplifier 36_n (t/b) is different in the case of miss and in the case of hit. Since the signal bWLON is set at "H" at the time of redundancy hit, the sense amplifier control circuit 41 selected by the signal BLKSEL_1 continues to output SAVLD_1(b/t) of "L". Thus, though (Although) SAE is held at "H" since TMSALTC is set at "H", the N/PSET driver 40 sets NSET_1(b/t) to "L" and sets bPSET_1(b/t) to "H" in response to SAVLD_1(b/t) of "L" so that the sense amplifier 36_n(t/b) will not be activated. The operation is the same as that at the time of redundancy hit in normal operation. That is, a desired operation is performed.

In the third cycle (cycle #3), the operation for selecting a next word line is started. Like the case of the first and second cycles, when a bank active command BA is received, a new row address (AR_ADD) is fetched. Then, the word line driver 34A determined by a newly selected row decoder is activated by the same operation as those in the first and second cycles. Further, the fetched row address AR_ADD is also input to the redundancy control circuit and compared with redundancy information.

Next, the case of redundancy miss is considered. Like the case of the first cycle, TWLON_2(b/t) is changed from "L" to "H" and WLDV_2 and WLRST_2 determined by the signal X_ADD01_2 are respectively changed from "L" to "H" and "H" to "L" in response to the "L" level pulse of the signal bWLON. Further, the previously activated word line driver sets the word line WL_2 from "L" to "H" in response to WLDV_2 of "H" and WLRST_2 of "L" so as to transfer data stored in the memory cell onto the bit line. The word line selected in this cycle is activated.

In this case, attention is paid to the word line which is not activated in the second cycle of redundancy hit. The states of the row decoder and array control circuit selected in the second cycle of redundancy hit are maintained even in the third cycle of redundancy-miss because the states of all of the signals X_ADD which are once activated are maintained. That is, even in the third cycle, all of the signals X_ADD910_1, X_ADD1112_1 accessed in the second cycle are held in the activated state. Further, BLKSEL_1 is held at 'H' level in the block selector 43. Since bWLOFF is kept at "H", the state in which TWLOFF_1 of "H" is held and the word line driver 34A selected by the row decoder 33A is activated is maintained. At this time, if a pulse of bWLON of "L" is output in the third cycle, a pulse of TWLON_1(b/t) of "H" in the array control circuit selected in the second cycle is output since the signal bWLON is a global signal in the memory cell array (cell array unit). In response to the pulse, the signal WLDV_1 which has been set in the deactivated state in the second cycle is activated and there occurs a possibility that a defective word line which should not be selected is selected.

That is, the semiconductor storage device according to the second embodiment performs a desired operation in which the word line/sense amplifier is deactivated in the cycle of redundancy hit, but in the next and succeeding cycles, when the sense amplifier and word line selected in the cycle are activated, the word line and sense amplifier which are previously deactivated in the cycle of redundancy hit also will be activated, and therefore, the correct operation cannot be ensured under this condition.

Third Embodiment

In the second embodiment, the operation for holding redundancy repair information and reading out (bit line sensing) data from the memory cell with respect to the word line activated in the second and succeeding cycles cannot be perfectly ensured in the operation mode (for example, stacked-word-line test mode) in which a plurality of word lines can be set into the selected state together by sequentially activating the word lines with corresponding delay times. Therefore, the stacked-word-line test mode cannot be used in the products after redundancy repair (after fuse blow process) and only chips before redundancy repair or good products which do not require repair (replacement) can be tested with this test mode.

In the third embodiment, the memory cell readout operation (bit line sensing operation) for the word line activated in the second or succeeding cycle and the operation for holding redundancy information can be ensured and data of the memory cell in the product after redundancy repair can be ensured. However, the number of word lines activated for each memory block is one at maximum.

Figure 13:
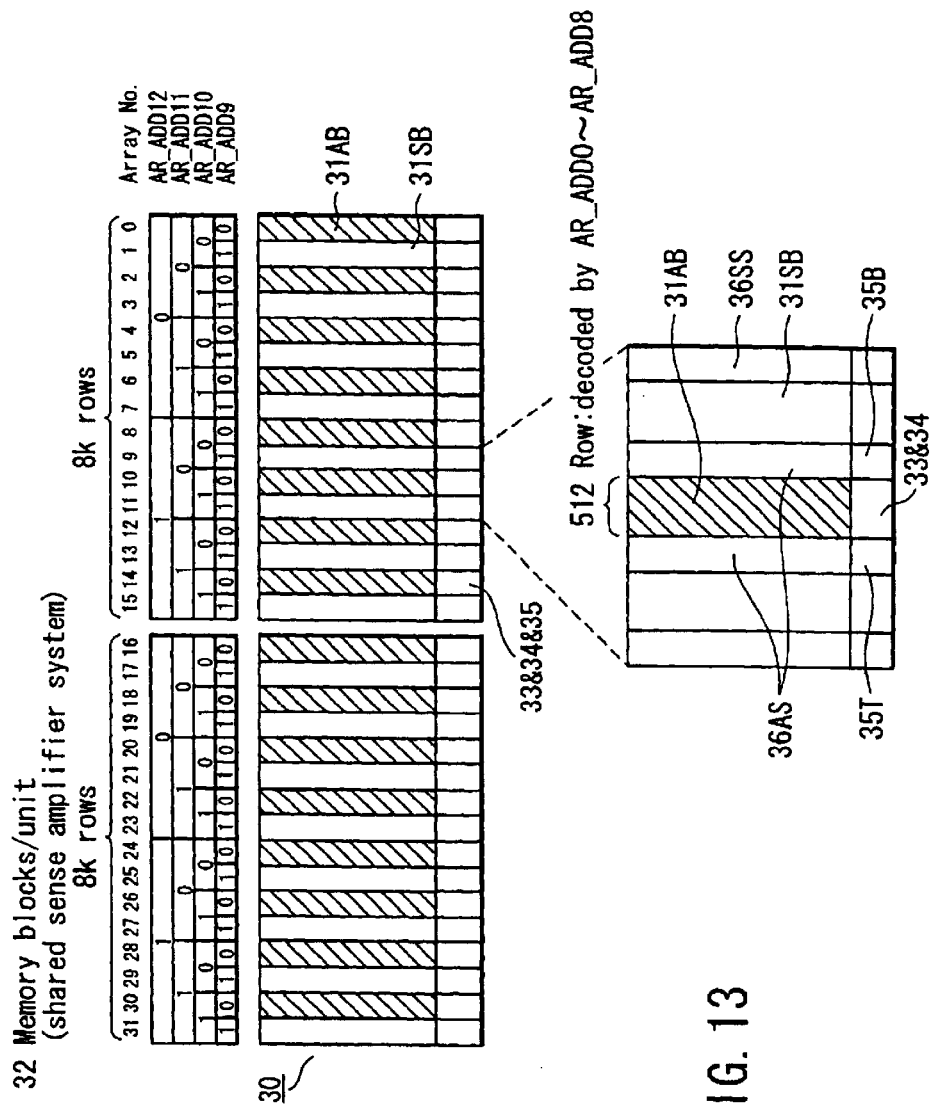
FIG. 13 is a block diagram showing part of a bank, for illustrating a semiconductor storage device according to a third embodiment of this invention.

FIGS. 13 to 27 illustrate a semiconductor storage device according to the third embodiment of this invention. FIG. 13 shows part of a bank configured by a plurality of memory cells and basically shows the same configuration as that of the second embodiment shown in FIG. 5.

That is, one memory cell array (or cell array unit) 30 is configured by 32 memory blocks (32 memory blocks/unit) and active memory blocks 31AB and sleep memory blocks 31SB are alternately arranged. Row decoder sections 33, word line (WL) driver sections 34 and array control circuits 35T, 35B are arranged in positions adjacent to the memory blocks. The memory blocks (Array No. 0 to 31) are divided into two sections by 8k rows and selected by row addresses AR_ADD9 to AR_ADD12 as shown in the drawing.

More specifically, active sense amplifiers 36AS are arranged on both sides of each of the active memory blocks 31AB and a sleep sense amplifier 36SS is arranged adjacent to each of the sleep memory blocks 31SB. Further, the row decoder sections 33 and word line driver sections 34 are arranged adjacent to each of the memory blocks and a first array control circuit (top) 35T and second array control circuit (bottom) 35B are arranged adjacent to the respective active sense amplifiers 36AS.

Although not shown in the drawing, column decoders, redundancy control circuit, re-driver, X pre-decoder and bank control circuit are provided for the memory cell array (or cell array unit) 30.

Figure 14:
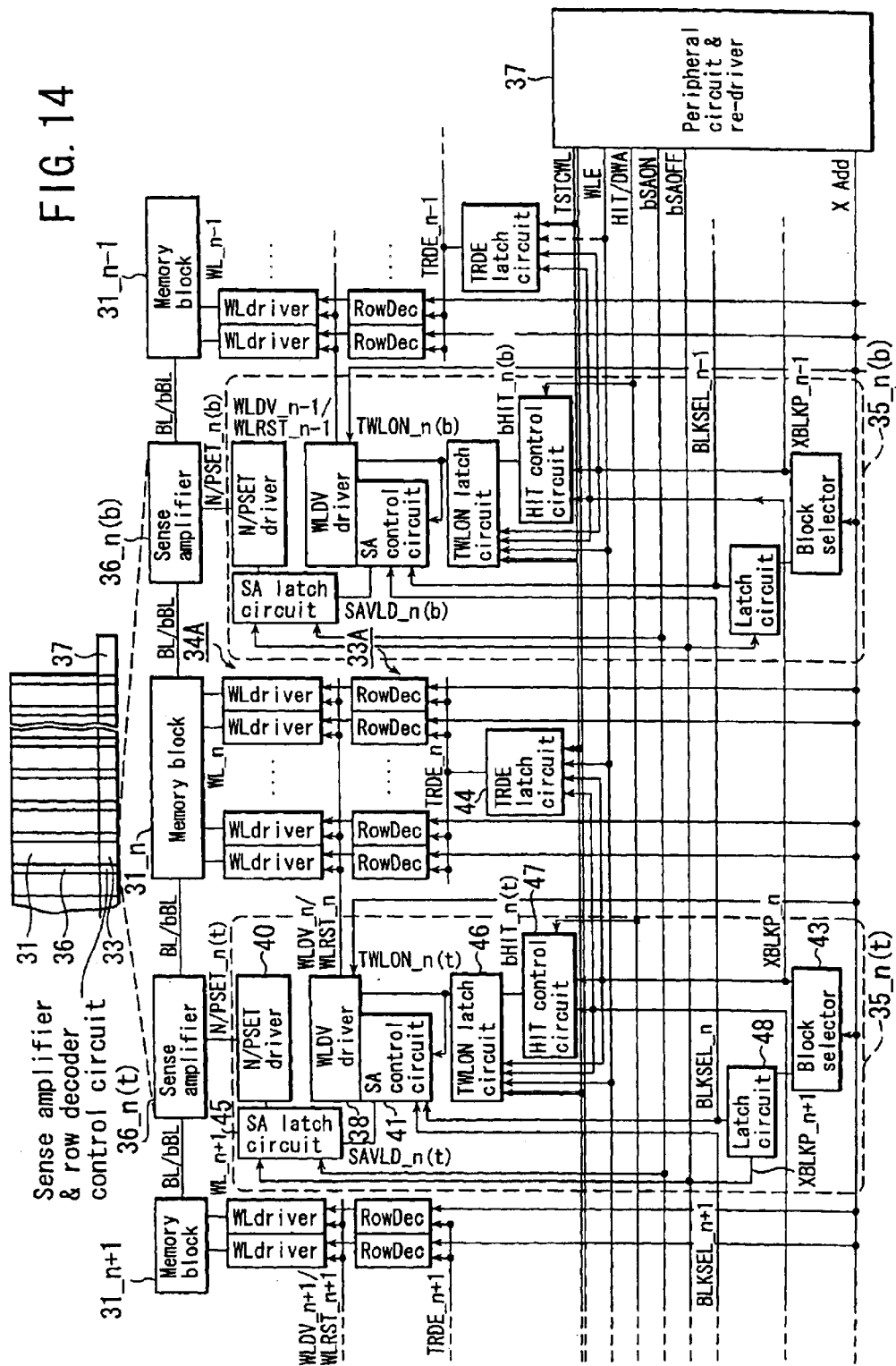
FIG. 14 is a block diagram showing an example of the concrete configuration of extracted portions of memory cells, sense amplifiers, row decoders, word line drivers and array control circuits in a memory cell array.

FIG. 14 is a circuit diagram showing an example of the concrete configuration of the memory block 31_n, sense amplifiers 36_n(t), 36_n(b), row decoder section 33, word line driver section 34 and array control circuits 35T (35_n(t)), 35B (35_n(b)) extracted from the memory cell array (or cell array unit) 30. The memory block 31_n and the sense amplifiers 36_n(t), 36_n(b) are connected to each other via plurality of paired bit lines BL/bBL. The word lines WL_n connected to the memory block 31_n are driven by the word line drivers 34A. The word line driver 34A is supplied with a decoded signal output from the row decoder 33A and a signal WLDV_n/WLRST_n which is output from a WLDV driver 38 to control driving and resetting of the word line. The row decoder 33A is supplied with address signals XAdd output from a peripheral circuit and re-driver 37 and a latch output TRDE_n of a TRDE latch circuit 44. The TRDE latch circuit 44 is supplied with signals TSTCWL, WLE output from the peripheral circuit and re-driver 37, a signal XBLKP_n output from a block selector 43 in a corresponding array control circuit and a signal XBLKP_n+1 output from a block selector in a succeeding-stage array control circuit.

The sense amplifiers 36_n(t), 36_n(b) are respectively connected to the first and second array control circuits 35_n(t), 35_n(b). The first and second array control circuits 35_n(t), 35_n(b) are each configured to include the WLDV driver 38, N/PSET driver 40, sense amplifier (SA) latch circuit 45, sense amplifier (SA) control circuit 41, TWLON latch circuit 46, HIT control circuit 47, latch circuit (BLKSEL latch circuit) 48, block selector 43 and the like. Activation and deactivation of the sense amplifier 36_n(t/b) are controlled by the signal N/PSET output from the N/PSET driver 40. The N/PSET driver 40 is supplied with a latch output of the SA latch circuit 45. The SA latch circuit is supplied with an output signal SAVLD_n of the SA control circuit 41 and signals bSAON, bSAOFF output from the peripheral circuit and re-driver 37.

Further, the WLDV driver 38 is supplied with a signal TWLON_n output from the TWLON latch circuit 46 and a signal XAdd output from the peripheral circuit and re-driver 37. The SA control circuit 41 is supplied with a signal BLKSEL_n output from the latch circuit 48 in a corresponding array control circuit and a signal BLKSEL_n+1 output from the latch circuit 48 in a succeeding-stage array control circuit. Further, the TWLON latch circuit 46 is supplied with the signals TSTCWL, WLE output from the peripheral circuit and re-driver 37.

The HIT control circuit 47 is supplied with a signal HIT/DWA output from the peripheral circuit and re-driver 37, a signal XBLKP_n output from the block selector 43 in a corresponding array control circuit and a signal XBLKP_n+1 output from the block selector 43 in a succeeding-stage array control circuit. Further, the latch circuit 48 is supplied with a signal bSAOFF output from the peripheral circuit and re-driver 37 and the output signal XBLKP_n of the block selector 43. The block selector 43 is supplied with the signal XAdd output from the peripheral circuit and re-driver 37.

That is, the semiconductor storage device according to the third embodiment includes one set of the BLKSEL latch circuit 48 which keeps the state of BLKSEL of "H" in the stacked-word-line test mode, the SA latch circuit 45 which keeps the state of NSET of "H"/bPSET of "L", the TWLON latch circuit 46 having both of function of controlling TWLON of "L"/"H" and function of holding the "H" level state in the stackedword-line test mode and the TRDE latch circuit having both of function of controlling TRDE of "L"/"H" and function of holding the state of TRDE of "H" level in each of the array control circuits.

Figure 15:
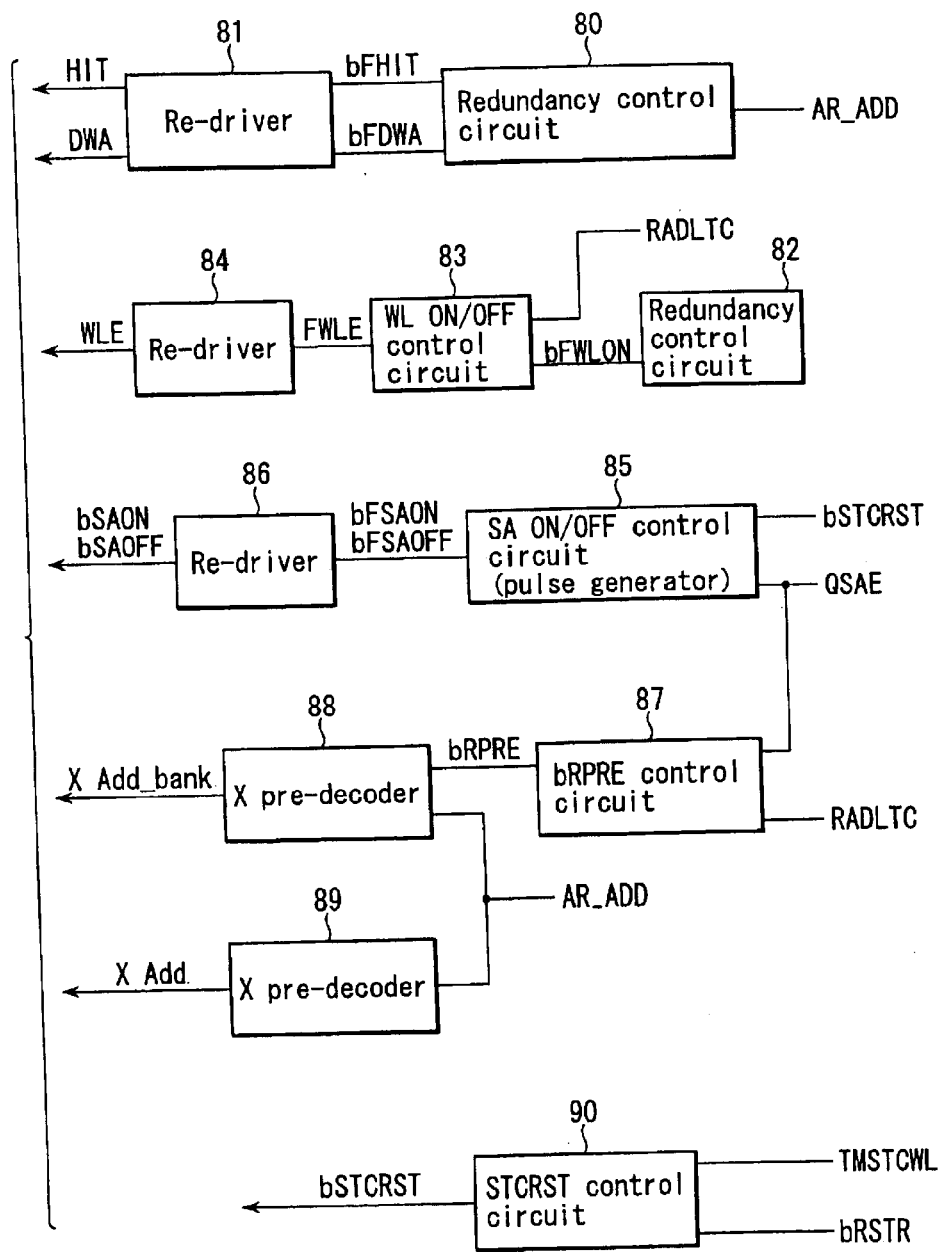
FIG. 15 is a block diagram showing an example of the configuration of extracted portions of an X pre-decoder, redundancy control circuit and re-drivers in a peripheral circuit and re-driver shown in FIG. 14.

FIG. 15 is a circuit diagram showing an example of the configuration of the X pre-decoder, redundancy control circuit and re-driver extracted from the peripheral circuit and re-driver 37 in the circuit shown in FIG. 14. The circuit is configured to include a redundancy control circuit 80, re-driver 81, redundancy control circuit 82, WLON/OFF control circuit 83, re-driver 84, SAON/OFF control circuit (pulse generator) 85, re-driver 86, bRPRE control circuit 87, X pre-decoder 88, X pre-decoder 89, STCRST control circuit 90 and the like.

A signal AR_ADD is supplied to the redundancy control circuit 80 and a signal bFDWA and signal bFHIT output from the redundancy control circuit 80 are supplied to the re-driver 81. Then, signals HIT and DWA are output from the re-driver 81.

A signal RADLTC and a signal bFWLON output from the redundancy control circuit 82 are supplied to the WLON/OFF control circuit 83. A signal FWLE output from the WLON/OFF control circuit 83 is supplied to the re-driver 84 and a signal WLE is output from the re-driver 84.

The signal WLE is a word line state signal obtained by combining the signals bWLON and bWLOFF in the second embodiment. The fall of the signal bWLON and the fall of the signal bWLOFF in the second embodiment are respectively equivalent in timing to the rise and fall of the word line state signal WLE in the third embodiment.

Further, signals bSTCRST and QSE are supplied to the SAON/OFF control circuit 85 and signals bFSAON and bFSAOFF output from the SAON/OFF control circuit 85 are supplied to the re-driver 86. Then, signals bSAON and bSAOFF are output from the re-driver 86.

The signals bSAON and bSAOFF are obtained by dividing the signal SAE in the second embodiment into two signals. The rise of the signal SAE in the second embodiment is equivalent in timing to the fall of the "L" pulse of the signal bSAON in the third embodiment. In this case, however, the "L" state of the signal bSAON is not maintained even in the stacked-word-line test mode and an "L" pulse is generated in each cycle. The signal bSAOFF is different from that in the second embodiment in the following respects. That is, at the time of normal read/write operation, the fall of the signal SAE is equivalent in timing to the fall of the "L" pulse of the signal bSAOFF in the third embodiment, but in the stacked-word-line test mode, the signal bSAOFF produces an "L" pulse in response to bSTCRST which is changed from "H" to "L".

The signal QSAE and a signal RADLTC are supplied to the bRPRE control circuit 87 and a signal AR_ADD and a signal output from the bRPRE control circuit 87 are supplied to the X pre-decoder 88. Then, a signal XAdd_bank used to select a memory block is output from the X pre-decoder 88. Further, the signal AR_ADD is supplied to the X pre-decoder 89 and a signal XAdd is output from the X pre-decoder 89.

Further, signals TMSTCWL and bRSTR are supplied to the STCRST control circuit 90 and a signal bSTCRST is output from the STCRST control circuit 90. The signal bSTCRST is used to delay the signal bSAOFF in the stacked-word-line test mode.

The semiconductor storage device according to the third embodiment is different from that of the second embodiment and uses two types of X pre-decoders depending on addresses. The X pre-decoder 89 is of a system in which the signal X_ADD is not reset by the signal bRPRE and is used for addresses which are used for selection of WLDV/WLRST and the row decoder. On the other hand, the X pre-decoder 88 is of a system in which the signal X_ADD is reset by the signal bRPRE like the case of the second embodiment and is used for addresses which are used for selection of the array control circuit. The signal X_ADD is input to the WLDV driver 38 and row decoders 33A. Further, the signal X_ADD_bank is input to the block selector 43.

In the case of 8k rows, X_ADD01 (AR_ADD0, AR_ADD1) is input to the WLDV drivers 38, X_ADD23, X_ADD45, X_ADD678 (AR_ADD2 to AR_ADD8) are input to the row decoders 33A and X_ADD910, X_ADD1112 (AR_ADD9 to AR_ADD12) are input to the block selectors 43. The above row address signals X_ADD are used to select the 8k word lines.

Figure 16:
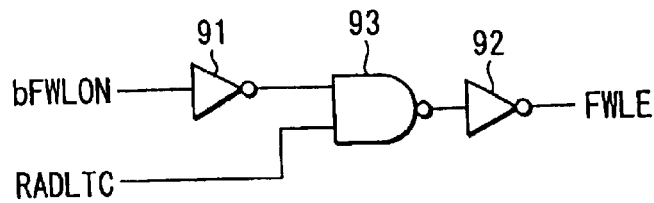
FIG. 16 is a circuit diagram showing an example of the concrete configuration of a WLON/OFF control circuit in the circuit shown in FIG. 15.

FIG. 16 is a circuit diagram showing an example of the concrete configuration of the WLON/OFF control circuit 83 in the circuit shown in FIG. 15. The WLON/OFF control circuit 83 is configured by inverters 91, 92 and NAND gate 93. A signal bFWLON is supplied to one input terminal of the NAND gate 93 via the inverter 91 and a signal RADLTC is supplied to the other input terminal of the NAND gate 93. An output signal of the NAND gate 93 is supplied to the input terminal of the inverter 92 and a signal FWLE is output from the output terminal of the inverter 92.

Figure 17:
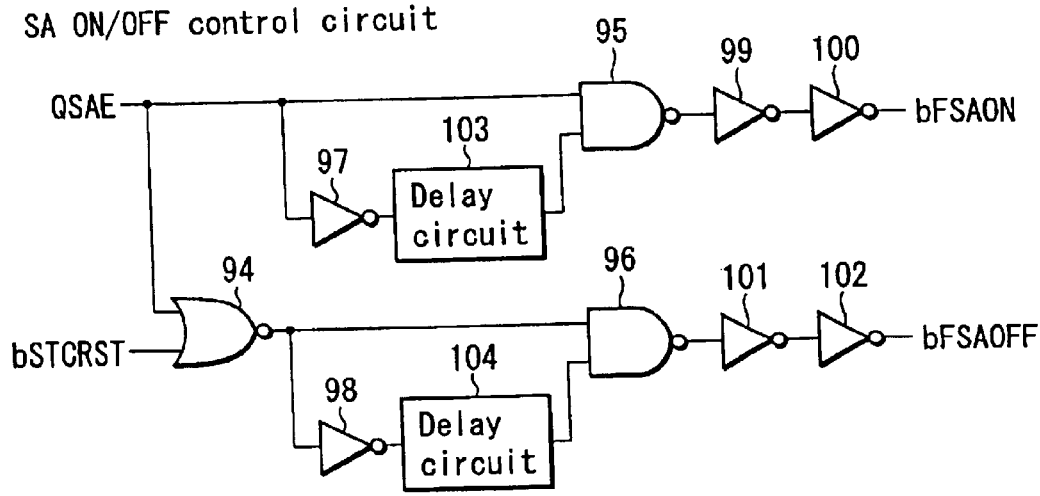
FIG. 17 is a circuit diagram showing an example of the concrete configuration of an SAON/OFF control circuit in the circuit shown in FIG. 15.

FIG. 17 is a circuit diagram showing an example of the concrete configuration of the SAON/OFF control circuit 85 in the circuit shown in FIG. 15. The SAON/OFF control circuit 85 is configured to include a NOR gate 94, NAND gates 95, 96, inverters 97 to 102 and delay circuits 103, 104. A signal QSAE is supplied to one input terminal of the NAND gate 95 and supplied to the other input terminal of the NAND gate 95 via the inverter 97 and delay circuit 103. An output signal of the NAND gate 95 is output via the inverters 99, 100 as a signal bFSAON. The signals QSAE and bSTCRST are supplied to the input terminals of the NOR gate 94. An output signal of the NOR gate 94 is supplied to one input terminal of the NAND gate 96 and supplied to the other input terminal of the NAND gate 96 via the inverter 98 and delay circuit 104. An output signal of the NAD gate 96 is output via the inverters 101, 102 as a signal bFSAOFF.

Figure 18:
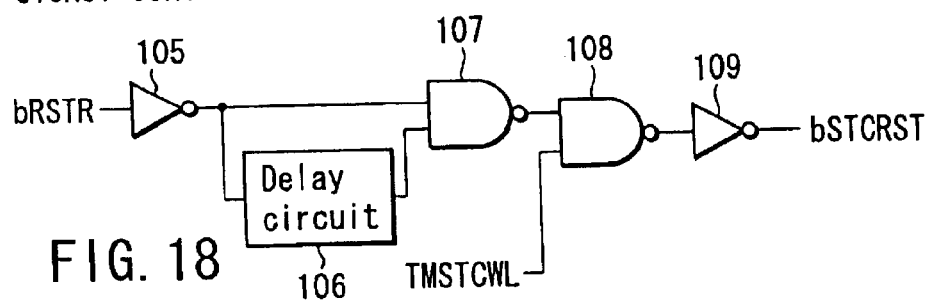
FIG. 18 is a circuit diagram showing an example of the concrete configuration of an STCRST control circuit in the circuit shown in FIG. 15.

FIG. 18 is a circuit diagram showing an example of the concrete configuration of the STCRST control circuit 90 in the circuit shown in FIG. 15. The STCRST control circuit 90 is configured by inverters 105, 109, delay circuit 106 and NAND gates 107, 108. A signal bRSTR is supplied to the input terminal of the inverter 105. An output signal of the inverter 105 is supplied to one input terminal of the NAND gate 107 and supplied to the other input terminal of the NAND gate 107 via the delay circuit 106. An output signal of the NAND gate 107 is supplied to one input terminal of the NAND gate 108 and a signal TMSTCWL is supplied to the other input terminal of the NAND gate 108. An output signal of the NAND gate 108 is supplied to the inverter 109 and a signal bSTCRST is output from the inverter 109.

FIGS. 19 to 24 are circuit diagrams for illustrating the latch circuits which hold address and redundancy information and the control circuits shown in FIG. 14. Examples of the concrete configurations of the control circuits and latch circuits are explained below.

Figure 19:
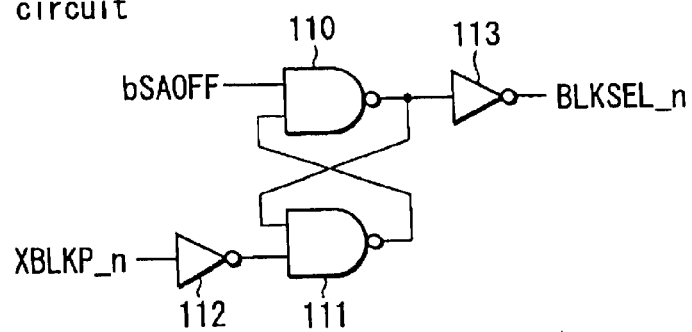
FIG. 19 is a circuit diagram showing an example of the concrete configuration of a BLKSEL latch circuit, for illustrating a latch circuit which holds address and redundancy information items and a control circuit shown in FIG. 14.

FIG. 19 is a circuit diagram showing an example of the concrete configuration of the BLKSEL latch circuit 48. The latch circuit 48 is configured by NAND gates 110, 111 and inverters 112, 113. A signal bSAOFF is supplied to one input terminal of the NAND gate 110 and an output signal of the NAND gate 111 is supplied to the other input terminal of the NAND gate 110. An output signal of the NAND gate 110 is supplied to the input terminal of the inverter 113 and to one input terminal of the NAND gate 111. A signal XBLKP_n is supplied to the other input terminal of the NAND gate 111 via the inverter 112. A signal BLKSEL_n is output from the inverter 113.

Figure 20:
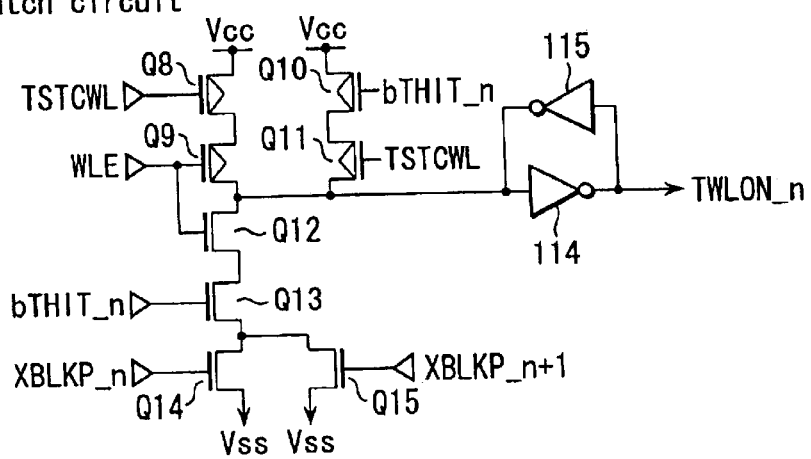
FIG. 20 is a circuit diagram showing an example of the concrete configuration of a TWLON latch circuit.

FIG. 20 is a circuit diagram showing an example of the concrete configuration of the TWLON latch circuit 46. The latch circuit 46 is configured by P-channel MOS transistors Q8 to Q11, N-channel MOS transistors Q12 to Q15 and inverters 114, 115. The current paths of the MOS transistors Q8, Q9, Q12, Q13, Q14 are serially connected between the power supply Vcc and the ground node Vss. The current paths of the MOS transistors Q10 and Q11 are serially connected between the power supply Vcc and a connection node of the current paths of the MOS transistors Q9 and Q12. Further, the current path of the MOS transistor Q15 is connected between a connection node of the current paths of the MOS transistors Q13 and Q14 and the ground node Vss. A signal TSTCWL is supplied to the gate of the MOS transistor Q8 and a signal WLE is supplied to the gates of the MOS transistors Q9, Q12. Further, a signal bTHIT_n is supplied to the gate of the MOS transistor Q10 and the signal TSTCWL is supplied to the gate of the MOS transistors Q11. In addition, the bTHIT_n is supplied to the gate of the MOS transistor Q13, a signal XBLKP_n is supplied to the gate of the MOS transistor Q14 and a signal XBLKP_n+1 is supplied to the gate of the MOS transistor Q15. The input terminal of the inverter 114 is connected to a connection node of the current paths of the MOS transistors Q9, Q11, Q12. The output terminal of the inverter 114 is connected to the input terminal of the inverter 115 whose output terminal is connected to the input terminal of the inverter 114. A signal TWLON_n is output from the output terminal of the inverter 114.

Figure 21:
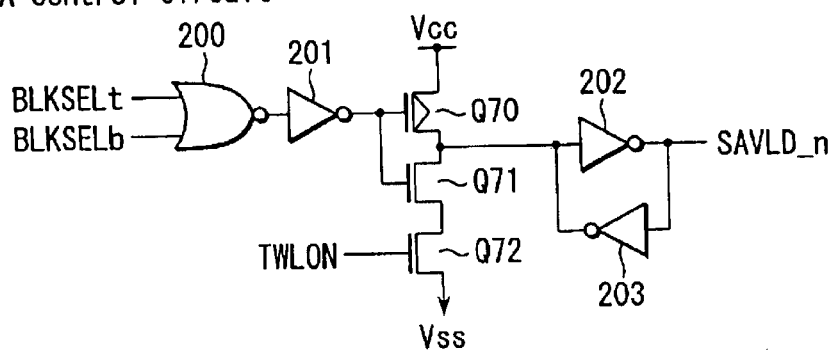
FIG. 21 is a circuit diagram showing an example of the concrete configuration of an SA control circuit.

FIG. 21 is a circuit diagram showing an example of the concrete configuration of the SA control circuit 41. The control circuit 41 is configured by a NOR gate 200, inverters 201 to 203, P-channel MOS transistor Q70 and N-channel MOS transistors Q71, Q72. The current paths of the MOS transistors Q70 to Q72 are serially connected between the power supply Vcc and the ground node Vss. Signals BLKSELt, BLKSELb are supplied to the input terminals of the NOR gate 200 and an output signal of the NOR gate 200 is supplied to the gates of the MOS transistors Q70, Q71 via the inverter 201. A signal TWLON is supplied to the gate of the MOS transistor Q72. The input terminal of the inverter 202 is connected to a connection node of the current paths of the MOS transistors Q70, Q71. The output and input terminals of the inverter 202 are respectively connected to the input and output terminals of the inverter 203. A signal SAVLD_n is output from the output terminal of the inverter 202.

Figure 22:
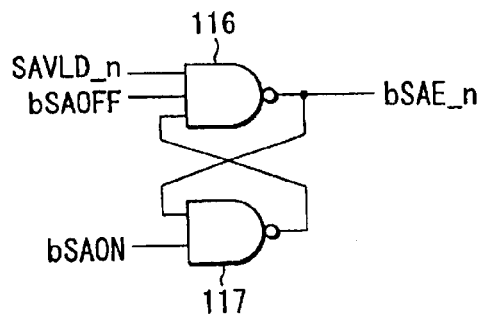
FIG. 22 is a circuit diagram showing an example of the concrete configuration of an SA latch circuit.

FIG. 22 is a circuit diagram showing an example of the concrete configuration of the SA latch circuit 45. The latch circuit 45 is configured by NAND gates 116, 117. The signals SAVLD_n and bSAOFF are respectively supplied to the first and second input terminals of the NAND gate 116 and an output signal of the NAND gate 117 is supplied to the third input terminal of the NAND gate 116. An output signal of the NAND gate 116 is supplied to one input terminal of the NAND gate 117 and the signal bSAON is supplied to the other input terminal of the NAND gate 117. A sense amplifier activation signal bSAE_n is output from the output terminal of the NAND gate 116.

Figure 23:
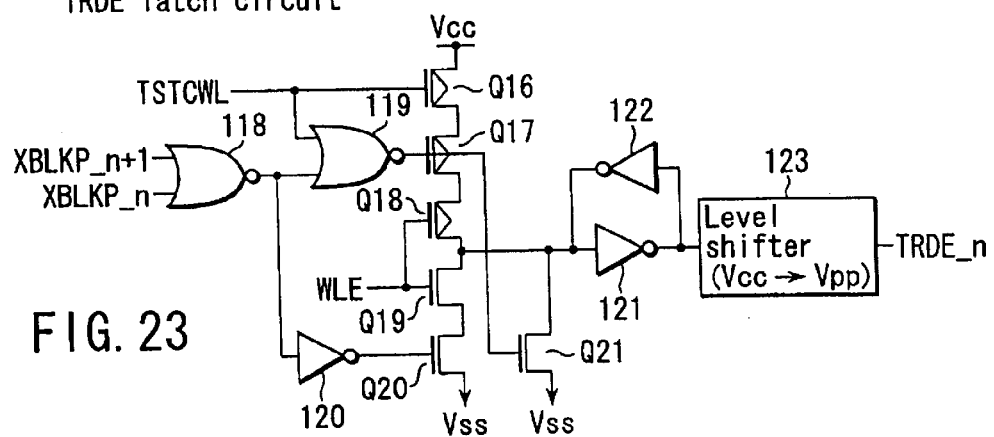
FIG. 23 is a circuit diagram showing an example of the concrete configuration of a TRDE latch circuit.

FIG. 23 is a circuit diagram showing an example of the concrete configuration of the TRDE latch circuit 44. The latch circuit 44 is configured by NOR gates 118, 119, inverters 120 to 122, a level shifter 123 configured to convert the "Vcc" level to the "Vpp" level, P-channel MOS transistors Q16 to Q18 and N-channel MOS transistors Q19 to Q21. The current paths of the MOS transistors Q16 to Q20 are serially connected between the power supply Vcc and the ground node Vss. Further, the current path of the MOS transistor Q21 is connected between a connection node of the current paths of the MOS transistors Q18 and Q19 and the ground node Vss.

The signal TSTCWL is supplied to the gate of the MOS transistor Q16 and to one input terminal of the NOR gate 119. The signals XBLKP_n, XBLKP_n+1 are supplied to the input terminals of the NOR gate 118 and an output signal of the NOR gate 118 is supplied to the other input terminal of the NOR gate 119 and supplied to the gate of the MOS transistor Q20 via the inverter 120. An output signal of the NOR gate 119 is supplied to the gates of the MOS transistors Q17, Q21.

The input terminal of the inverter 121 is connected to a connection node of the current paths of the MOS transistors Q18, Q19, Q21 and the output terminal of the inverter 121 is connected to the input terminal of the inverter 122 and the input terminal of the level shifter 123. The output terminal of the inverter 122 is connected to the input terminal of the inverter 121. A signal TRDE_n is output from the output terminal of the level shifter 123.

Figure 24:
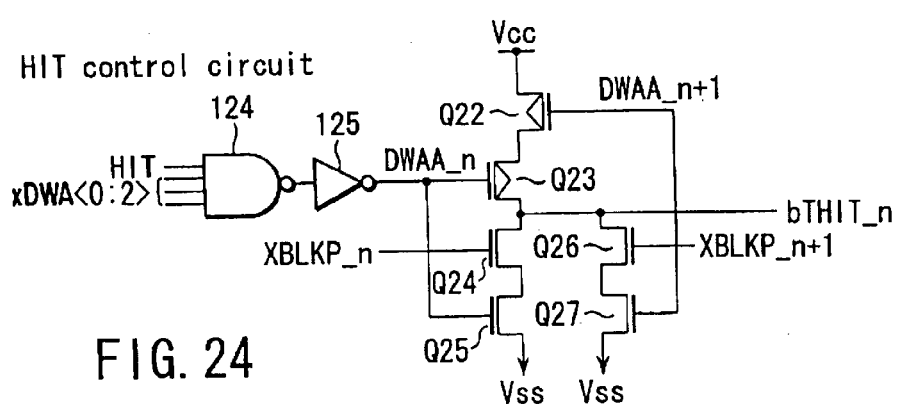
FIG. 24 is a circuit diagram showing an example of the concrete configuration of a HIT control circuit.

FIG. 24 is a circuit diagram showing an example of the concrete configuration of the HIT control circuit 47. The control circuit 4.7 is configured to include a NAND gate 124, inverter 125, P-channel MOS transistors Q22, Q23 and N-channel MOS transistors Q24 TO Q27. The current paths of the MOS transistors Q22 to Q25 are serially connected between the power supply Vcc and the ground node Vss. The current paths of the MOS transistors Q26, Q27 are serially connected between a connection node of the current paths of the MOS transistors Q23, Q24 and the ground node Vss.

Signals HIT, xDWA<0:2> (the "x" indicate DWA<0:2> and bDWA<0:2>) are supplied to the input terminals of the NAND gate 124. An output signal of the NAND gate 124 is supplied to the inverter 125. A signal DWAA_n output from the inverter 125 is supplied to the gates of the MOS transistors Q23, Q25. A signal DWAA_n+1 is supplied to the gates of the MOS transistors Q22, Q27. The signals XBLKP_n, XBLKP_n+1 are respectively supplied to the gates of the MOS transistors Q24, Q26. A signal bTHIT_n is output from a connection node of the current paths of the MOS transistors Q23, Q24, Q26.

Figure 25:
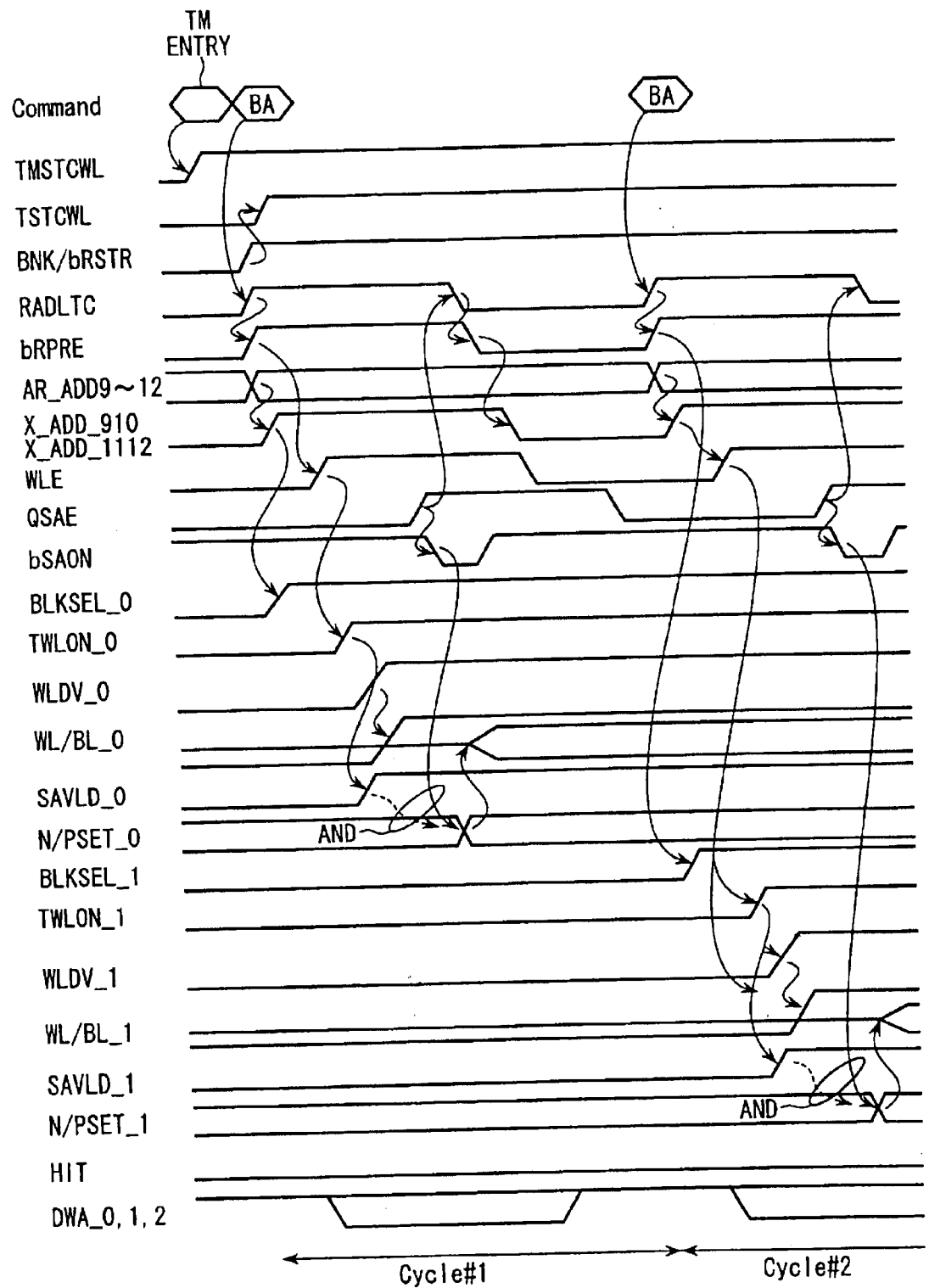
FIG. 25 is a timing chart for illustrating the operation in the stacked-word-line test mode in the semiconductor storage device according to the third embodiment.

Next, the operation of the semiconductor storage device according to the third embodiment in the stacked-word-line test mode is explained with reference to the timing chart of FIG. 25. If entry is made into the stacked-word-line test mode (TM ENTRY), TMSTCWL is changed from "L" to "H". The present state is kept maintained unless the operation mode departs from the test mode. As a signal indicating activation/deactivation in the array control circuit 35, there are provided two signals including an array control circuit state signal XBLKP which is set into the activated state by a signal X_ADD in the stacked-word-line test mode, releases the holding state by itself and is set into the activated state again by a next signal X_ADD and an array control circuit state signal BLKSEL which holds the present state until the operation mode departs from the test mode if the signal XBLKP is once received.

First, a first word line is selected (cycle #1). In this example, since the 32 memory blocks/memory cell array are used, the number of selectable word lines in each memory cell array (cell array unit) is 16 at maximum due to the restriction that the number of word lines which can be activated for each memory block is one. Since only one of the word lines in the memory block is selected, the row address (AR_ADD0 to AR_ADD8) used for decoding the array (specifying the row in the array) is fixedly set. Since the 16 memory blocks are selected without activating the adjacent memory block on the condition that the shared sense amplifier system is used, row addresses AR_ADD10, AR_ADD11, AR_ADD12 used for selecting the memory blocks are sequentially added and fetched (the row address AR_ADD9 is fixedly set).

When a bank active command BA is received, a signal bRSTR (internal RAS)/RADLTC (row address latch) is changed from "L" to "H". In response to the change, the latch circuit activation signal TSTCWL of the array control circuit is changed from "L" to "H". The row address fetched in the bank active command is transferred to AR_ADD to activate X_ADD. In response to the activated addresses X_ADD910_0, X_ADD1112_0 which are changed from "L" to "H", the block selector 43 changes XBLKP_0 from "L" to "H". The state is held in the BLKSEL latch circuit 48 in the circuit shown in FIG. 14. After this, the information held in the latch circuit 48 is not subjected to a state release (reset) process in the transition of X_ADD910_*, X_ADD1112_*. In order to release the latched state, it is necessary to set bSAOFF to "L". Thus, the activated state of the array control circuit can be held.

In the second embodiment, the activated state of the array control circuit is held by holding X_ADD globally used in the memory cell array, but in the third embodiment, the latch circuit 48 in which the state holding mode is not released unless the reset signal is supplied thereto is provided in the array control circuit to attain a local state holding operation.

In response to XBLKP of "H" and WLE of "H", TRDE_0 of the TRDE latch circuit shown in FIG. 14 is changed from "L" to "H" to release the precharge state of the row decoders 33A. Thus, a word line (WL) driver determined by the row decoder selected by the previously activated addresses X_ADD23, X_ADD45, X_ADD678 is activated. Further, the fetched address AR_ADD is also input to the redundancy control circuit and compared with redundancy information. That is, the input address AR_ADD and previously programmed redundancy information (for example, address information determined by cut-off of the fuse) are compared with each other. As a result, if no coincidence can be attained (non-coincidence, which is hereinafter referred to as a miss or redundancy miss), a signal HIT is maintained at the "L" level. If coincidence can be attained (coincidence, which is hereinafter referred to as a hit or redundancy hit), the signal HIT is changed from "L" to "H". Thus, the word line in the array control circuit decoded by XDWA_* (DWA_0, DWA_1, DWA_2, . . . , bDWA_0, bDWA_1, bDWA_2, . . . ) can be prevented from being activated.

After the address comparison triggered by a change of RADLTC from "L" to "H" finishes in the redundancy control circuit and a certain delay time passes, WLE is changed from "L" to "H". The delay time is so set that WLE will be changed from "L" to "H" after HIT is changed from "L" to "H".

In the case of redundancy miss, bTHIT_0(t/b) is held at "H" because of the "L" level of HIT. When WLE is changed from "L" to "H", the TWLON latch circuit changes TWLON_0(t/b) from "L" to "H" in response to the above change. Since TSTCWL is now set at "H", the present state is held in the TWLON latch circuit 46. After this, information held in the TWLON latch circuit (t/b), that it is selected by the address and indicates occurrence of miss, is not subjected to a state release (reset) process in the transition of WLE/bTHIT_0/XBLKP_0. In order to release the latched state, it is necessary to set TSTCWL to "L". WLRST_0 and WLDV_0 determined by the signal X_ADD01_0 are changed from "H" to "L" and "L" to "H", respectively, and the previously activated word line driver sets the word line WL_0 from "L" to "H" in response to WLDV_0 of "H" and WLRST_0 of "L" so as to transfer data stored in the memory cell onto the bit line. Thus, the activated state of the word line WL_0 is held.

XBLKP_n, XBLKP$_{13}$ n+1 are address information activated when they are selected by an input address in the present cycle, bTHIT_N is redundancy information indicating the hit/miss in the present cycle and both of the information items are reset in each cycle.

The TWLON latch circuit of FIG. 20 is a circuit having function of fetching the part of address information (XBLKP_n, XBLKP_n+1) which specifies a word line to be selected in each cycle and redundancy information (bTHIT_n) indicating whether or not the address coincides with an address programmed in the fuse sets and activating and holding a word line activation signal (TWLON_n) to activate a word line when it is selected according to the address information and a miss occurs in a certain cycle. That is, TWLON$_{13}$ n can be said to be a word line activation signal which is a word line control signal for each memory block.

Next, activation of the sense amplifier is explained. When the sense amplifier control circuit selected by the signal BLKSEL_0 receives TWLON_n(t/b) of "H", SAVLD_0 (t/b) is set from "L" to "H". That is, SAVLD_0(t/b) is a signal which is activated when the memory block is accessed and a miss occurs for the first time and the state is held as it is until the operation mode departs from the test mode. When a sufficiently long time has elapsed so that the word line WL_0 can be expected to be sufficiently set to the "H" level by use of the word line delay ensuring circuit arranged in the peripheral circuit section, QSAE is set from "L" to "H". In response to QSAE of "H", an "L" pulse of bSAON is output from the SAON/OFF circuit, via re-driver. The "L" pulse is received by the SA latch circuit 45 which in turn sets NSET_0(t/b) from "L" to "H" and bPSET_0 (t/b) from "H" to "L" via the N/PSET driver 40. Then, the state (NSET_0(t/b) of "H"/bPSET_0(t/b) of "L") is held by the SA latch circuit 45. Information latched in the SA latch circuit 45 is not released (reset) even if bSAON is set to "H" after this. In order to release the latched state, it is necessary to set bSAOFF to "L". In this embodiment, since the state of NSET_*(t/b) of "H", bPSET_*(t/b) of "L" is hold in each array control circuit section, it is not necessary to hold bSAON at "L" unlike the technique of the second embodiment ("H" of SAE is held). The N/PSET driver 40 outputs NSET_0(t/b) which is changed from "L" to "H" and bPSET_0(t/b) which is changed from "H" to "L", activates the sense amplifier and permits the bit line sensing operation to be performed via the sense amplifier. Thus, the activated state of the sense amplifier 36_n(t/b) is held.

In response to QSAE which is changed from "L" to "H", RADLTC is changed from "H" to "L", WLE is changed from "H" to "L", bRPRE is changed from "H" to "L" and X_ADD_* is changed from "H" to "L", and thus it resets by itself so as to make ready for fetching a new row address. In response to RADLTC of "L", QSAE is changed from "H" to "L" in the word line delay ensuring circuit. Unlike the second embodiment, in the third embodiment, even if the bank precharge command PR is not input after the bank active command BA is input, it is possible to fetch an address in the next cycle in the stacked-word-line test mode.

The operation for selecting the next word line is started (cycle #2). The bank active command BA may be input in a second or succeeding cycle. Like the case of the first cycle, when the bank active command BA is received, a new row address (AR_ADD) is fetched. The block selector 43 sets XBLKP_1 from "L" to "H" in response to a change of the activated signals X_ADD910_1, X_ADD1112_1 from "L" to "H". The state is held in the BLKSEL latch circuit 48 in the array control circuit which is activated in the second cycle. After this, information held in the latch circuit 48 is not subjected to a state release (reset) process in the transition of X_ADD910_*, X_ADD1112_*. BLKSEL_0 activated in the first cycle is also kept held in the latch circuit 48 of the array control circuit activated in the first cycle.

In the case of redundancy miss, bTHIT_1(t/b) is held at "H" since HIT is kept at the "L" level. After this, like the case of the first cycle, TWLON_1(t/b) of "H" is held in the TWLON latch circuit 46 and WLRST_1 and WLDV_1 determined by the signal X_ADD01_1 are changed from "H" to "L" and "L" to "H", respectively. Then, the word line WL_1 is changed from "L" to "H" and the activated state of the word line WL_1 is held. TWLON_0 activated in the first cycle is also kept held in the latch circuit 46 of the array control circuit activated in the first cycle.

The operation for activation of the sense amplifiers 36_n (t), 36_n(b) is explained below. When the sense amplifier control circuit selected by the signal BLKSEL_1 receives TWLON_1(t/b) of "H", SAVLD_1(t/b) is set from "L" to "H". After this, like the case of the first cycle, NSET_0(t/b) of "H"/bPSET_0(t/b) of "L" are held in the SA latch circuit 45. Then, the N/PSET driver 40 respectively sets NSET_0 (t/b) and bPSET_0(t/b) from "L" to "H" and "H" to "L" and activates the sense amplifier so as to permit the bit line sensing operation to be performed via the sense amplifier. Thus, the activated state of the sense amplifier 36_n(t/b) can be held. Unlike the case of the second embodiment, bSAON of "L" is not held (SAE of "H" in the case of the second embodiment) and a pulse of bSAON is generated in each cycle. Therefore, like the case of the first cycle, in the second or succeeding cycle, the sense amplifier can be activated with delay time of the word line delay ensuring circuit determined based on activation of the word line. As a result, in the present embodiment, destruction of cell data will not occur in the word line activated in the second or succeeding cycle.

Figure 26:
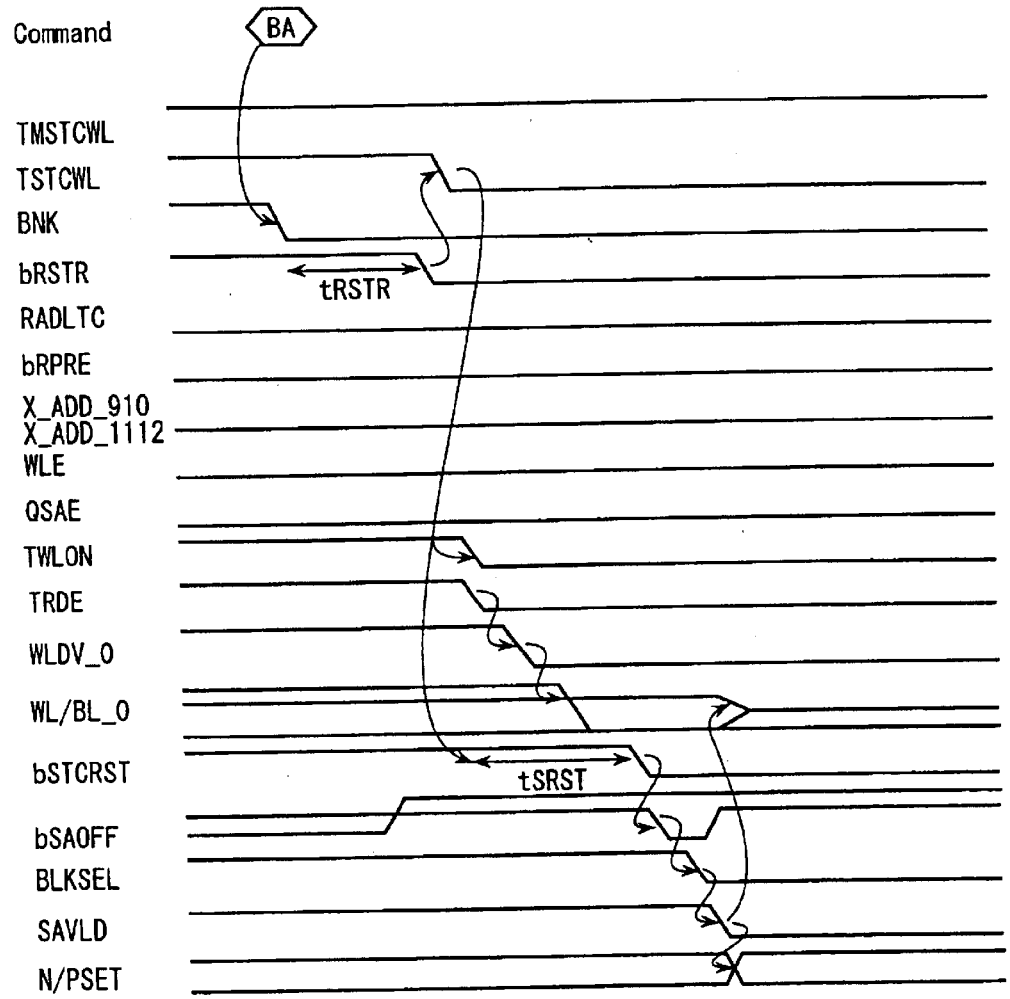
FIG. 26 is a timing chart for illustrating the operation for returning all of activated word lines to a precharge state in the semiconductor storage device according to the third embodiment.

Next, the operation for returning all of the activated word lines to the precharge state is explained (refer to the timing chart of FIG. 26). If a bank precharge command BP is received, the bank activation signal BNK is set from "H" to "L". After restore delay time tRSTR determined by a bit line restore delay circuit has elapsed after BNK "L" is received, TSTCWL is changed from "H" to "L". In response to TSTCWL of "L", all of the TWLON latch circuits 46 and TRDE latch circuits 44 in the bank are released from the latched state. By releasing the latched state, all of the signals TWLON, TRDE, WLDV, WLRST in the bank are set into the precharge state and all of the word lines activated during the test mode are set from "H" to "L".

The operation for equalizing all of the activated bit lines is explained. When all of the word lines are reset in the stacked-word-line test mode, charges which are several times larger than those in the case of the normal read/write operation flow from the activated word lines into the ground node Vss. As a result, the Vss potential of the word line driver 34A locally rises and the reset timing of the word lines is delayed in comparison with the case of the normal read/write operation. Therefore, the bit line equalizing operation is started after the elapse of word line reset delay time tSRST determined by the STCRST control circuit 90 in the stacked-word-line test mode.

When bRSTR of "L" is received, bSTCRST is changed from "H" to "L" after the word line reset delay time tSRST has elapsed and the SAON/OFF control circuit 85 outputs a pulse of bSAOFF of "L". In response to the pulse, the latched states of the BLKSEL latch circuits 48 and SA latch circuits 45 in all of the array control circuits are released. By releasing the latched states, all of NSET/bPSET in the bank are set into the precharge state and all of the bit lines activated in the test mode are equalized.

Figure 27:
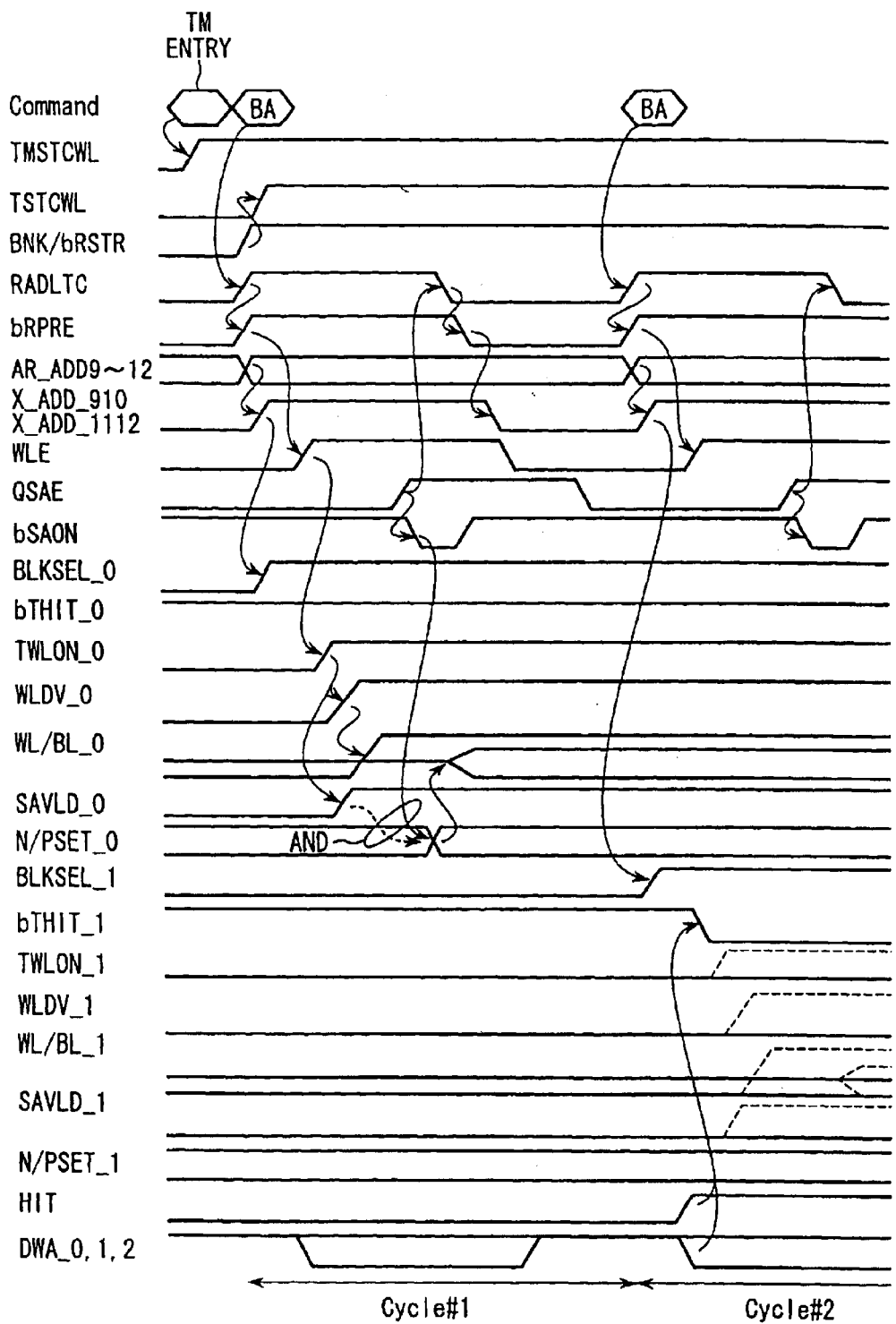
FIG. 27 is a timing chart for illustrating the operation when a redundancy hit is made in the semiconductor storage device according to the third embodiment.

Next, the case of redundancy hit is considered (refer to the timing chart of FIG. 27). First, assume that the redundancy hit is made in the second cycle. Then, the same operation as that in the case of redundancy miss is performed until entry (TM ENTRY) is made into the test mode and the bank activation process and bank precharge operation of the cycle #1 are performed.

In the second cycle, the operation for selecting a next word line is started (cycle #2). When the bank active command BA is received, RADLTC (internal RAS) is transited from "L" to "H". A row address fetched in the bank activation process is transferred to AR_ADD to activate X_ADD. The block selector 43 sets XBLKP_1 from "L" to "H" in response to the activated signals X_ADD910_1, X_ADD1112_1 changed from "L" to "H". Likewise, BLKSEL_1 is changed from "L" to "H" and the thus obtained state is latched in the BLKSEL latch circuit 48. Thus, the activated state of the array control circuit can be held.

In the case of redundancy hit, bTHIT_1(t/b) is changed from "H" to "L" in response to a change of HIT from "L" to "H". Then, WLE is changed from "L" to "H" and the TWLON latch circuit 46 receives the signal, but since bTHIT_1(t/b) is set at "L", it maintains TWLON_0(t/b) at "L". This state causes WLDV/WLRST selected by X_ADD01_1 to maintain the state in which WLDV_1 is set at "L" and WLRST_1 is set at "H" and the word line WL_1 is also kept at the "L" level. That is, the word line WL_1 keeps the deactivated state.

Next, the operation for activation of the sense amplifiers 36_n(t), 36_n(b) is explained below. Since the sense amplifier control circuit selected by BLKSEL_1 receives TWLON_1(t/b) of "L", SAVLD_1(t/b) is maintained at "L". The SAON/OFF control circuit 85 outputs an "L" level pulse of bSAON at the same timing as that in the case of miss, but since SAVLD_1(t/b) is set at "L", the SA latch circuit 45 is kept in the deactivated state. The N/PSET driver 40 which receives the above signal is also kept in the deactivated state and respectively keeps NSET_1(t/b) and bPSET_1(t/b) at "L" and "H". Thus, sense amplifier is kept in the deactivated state. Even when an "L" pulse of bSAON is generated in the next or succeeding cycle, the sense amplifier is not activated unless SAVLD_1(t/b) is set to "H". Thus, the sense amplifier 36_n(t/b) is kept in the deactivated state.

With the above configuration, the stacked-wordline test mode can be used in products which have been subjected to the redundancy repair (compensation) process and test time in all of the products can be reduced.

However, in order to ensure the operation for reading out data from the memory cell in the stackedword-line test mode in the third embodiment, the number of word lines which can be selected has the following limitations (1), (2).

(1) The number of word lines which can be activated for each memory block is one.

(2) When a sense amplifier is shared by adjacent memory blocks (shared sense amplifier), the word line can be selected in only either of the memory blocks which commonly use the sense amplifier (only N/2 word lines at maximum can be selected in the memory cell array (cell array unit) having N memory blocks).

Fourth Embodiment

Next, a semiconductor storage device according to a fourth embodiment of this invention is explained. The fourth embodiment is obtained by modifying the semiconductor storage device of the third embodiment so that M word lines (M=2, 3, 4, 5, . . . ) can be activated in each memory block. However, the fourth embodiment has the following limitation (3) when a plurality of word lines are selected in each memory block.

(3) The contents of memory cells connected to a plurality of word lines selected in the memory block must be the same on the identical column. This is the condition that data destruction will not occur on the identical column.

The configuration of the semiconductor storage device of the fourth embodiment in which two word lines are selected in the memory block is schematically explained with reference to FIGS. 28 and 29. A row address used for decoding the memory block into two half sections is additionally provided for the decoding process of the TRDE latch circuit 44 in the array control circuits 35T, 35B used in the third embodiment. Further, the output signal TRDE is cut off at a location designated by the row address used for decoding the memory block into two sections and input to decoders of a half section of an adjacent memory block as well. The same number of inputs as those to the row decoders 33A in the third embodiment are input to row decoders of the same number which are symmetrically provided on both sides of the array control circuit.

Likewise, a row address used for decoding the memory block into two half sections and a signal bTHITP having redundancy information are input to the row decoders 33A together with of the signal TRDE. The signal bTHITP is a signal obtained by decoding the signal bTHIT by use of a row address used for decoding the memory block into two half sections.

Signal lines for the signals TRDE_0/bTHITP_0 and TRDE_1/bTHITP_1 are each arranged in the common wiring area and will not cross one another. Thus, it becomes possible to suppress the wiring area used to minimum.

Figure 28:
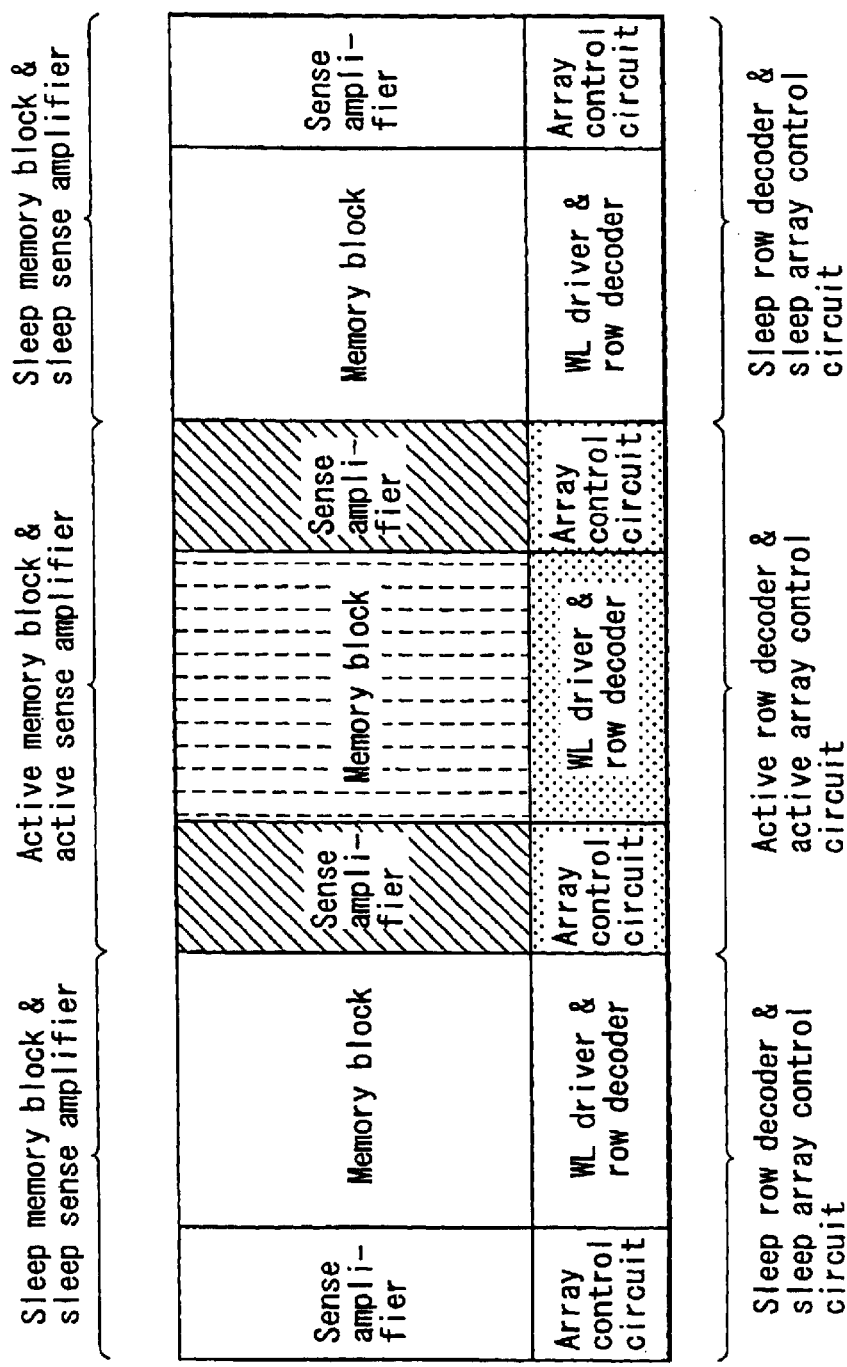
FIG. 28 is a block diagram for illustrating the configuration of a semiconductor storage device according to a fourth embodiment of this invention.
Figure 29:
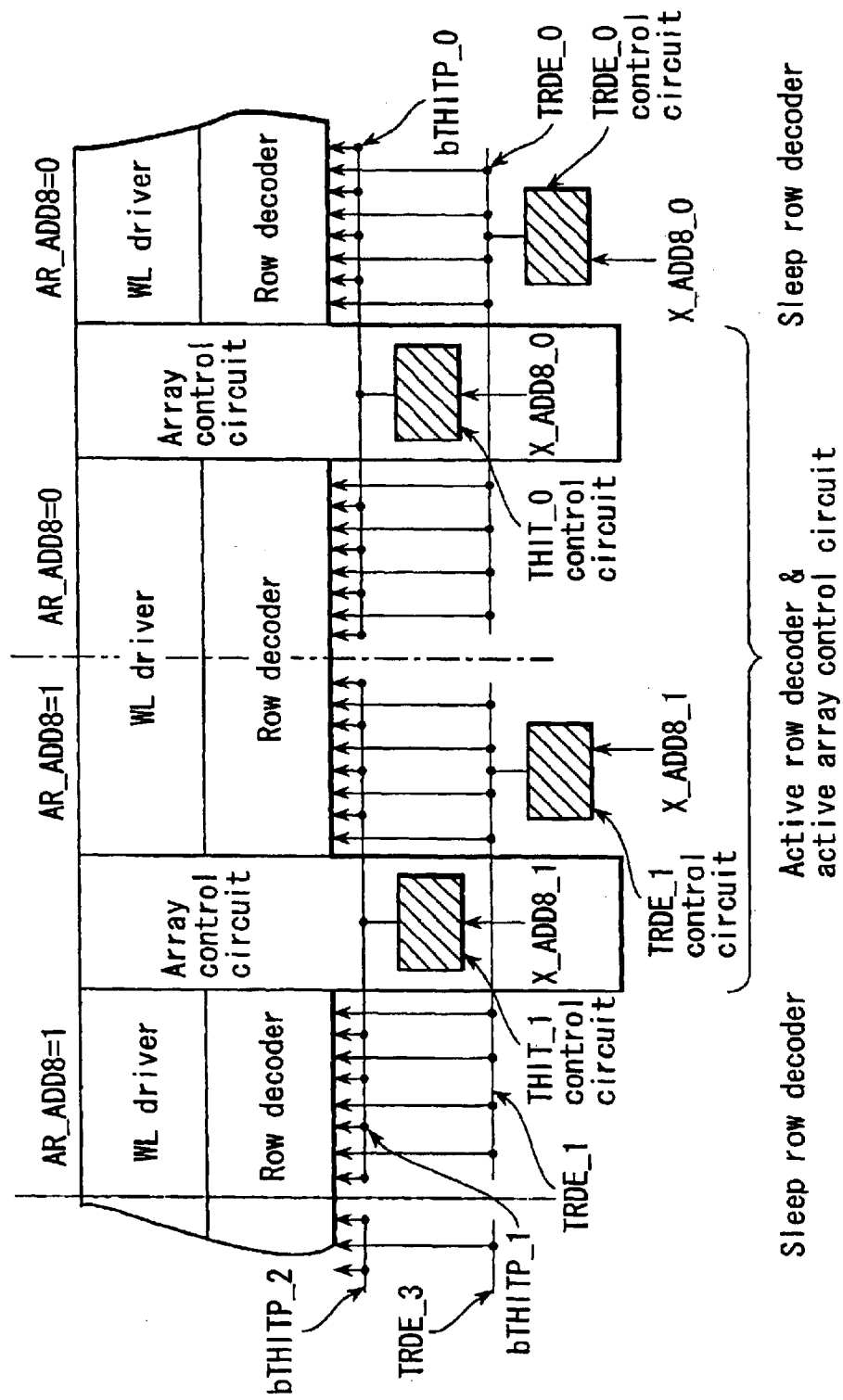
FIG. 29 is a block diagram for illustrating an example of the configuration of portions containing word line drivers, row decoders and array control circuits in the semiconductor storage device shown in FIG. 28.
Figure 30A:
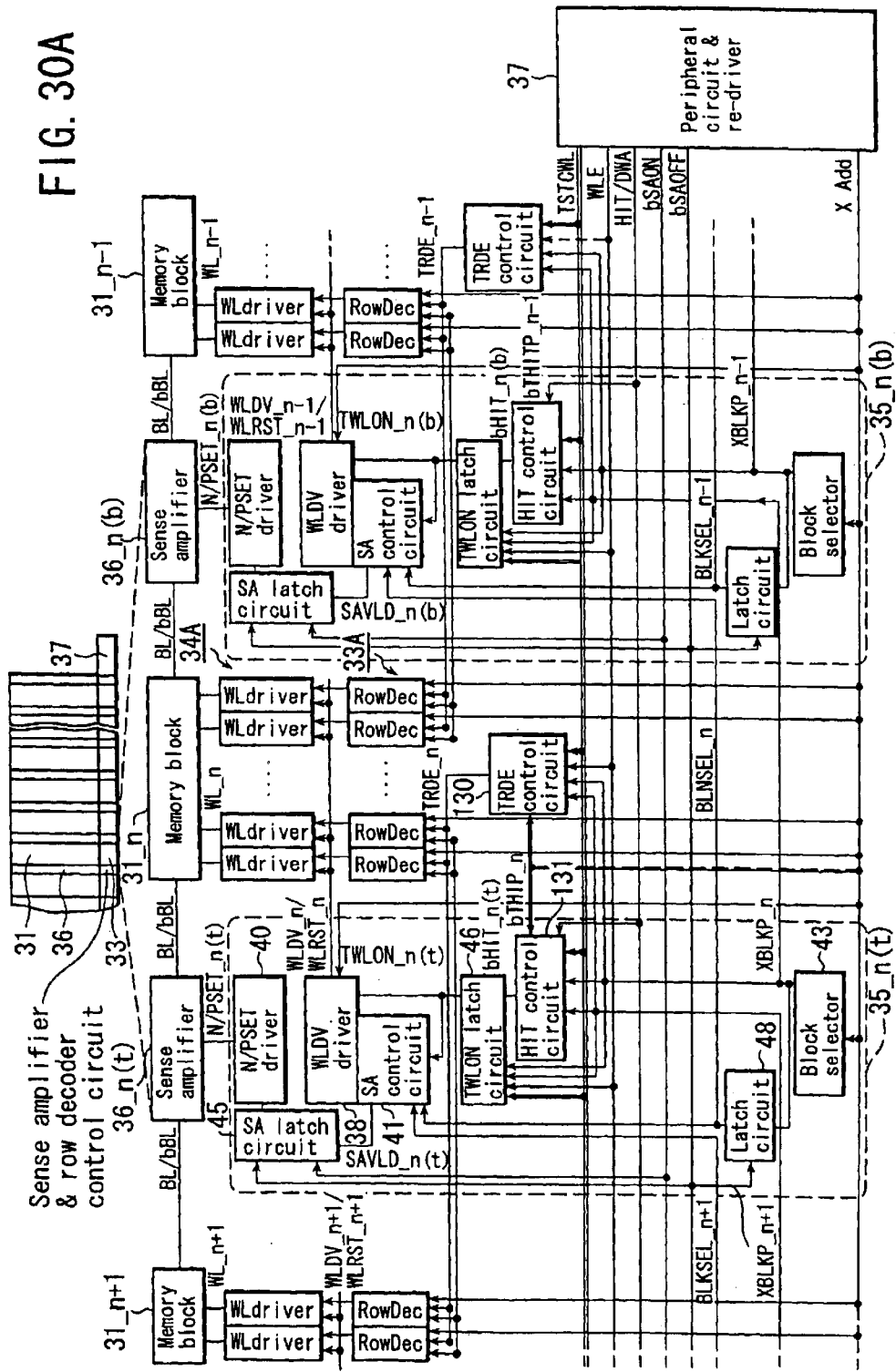
FIG. 30A is a block diagram showing an example of the concrete configuration of extracted portions of memory cells, sense amplifiers, row decoders and array control circuits in a memory cell array in the circuit shown in FIGS. 28 and 29, FIGS. 30B and 30C are block diagrams, each showing a modification of the circuit illustrated in FIG. 30A.

FIG. 30A is a circuit diagram showing an example of the configuration of extracted portions of memory blocks, sense amplifiers, row decoders and array control circuits in the memory cell array in the circuit shown in FIGS. 28 and 29. The circuit is configured such that a TRDE control circuit 130 is provided instead of the TRDE latch circuit 44 in the circuit of FIG. 14, a HIT control circuit 131 is provided instead of the HIT control circuit 47, TRDE/bTHITP is cut off at the location designated by a row address used for decoding the array into two half sections and input to row decoders of the same number which are symmetrically provided on both sides of the array control circuit. In FIG. 30A, portions which are the same as those of FIG. 14 are denoted by the same reference numerals and the explanation thereof is omitted.

Figure 30B:
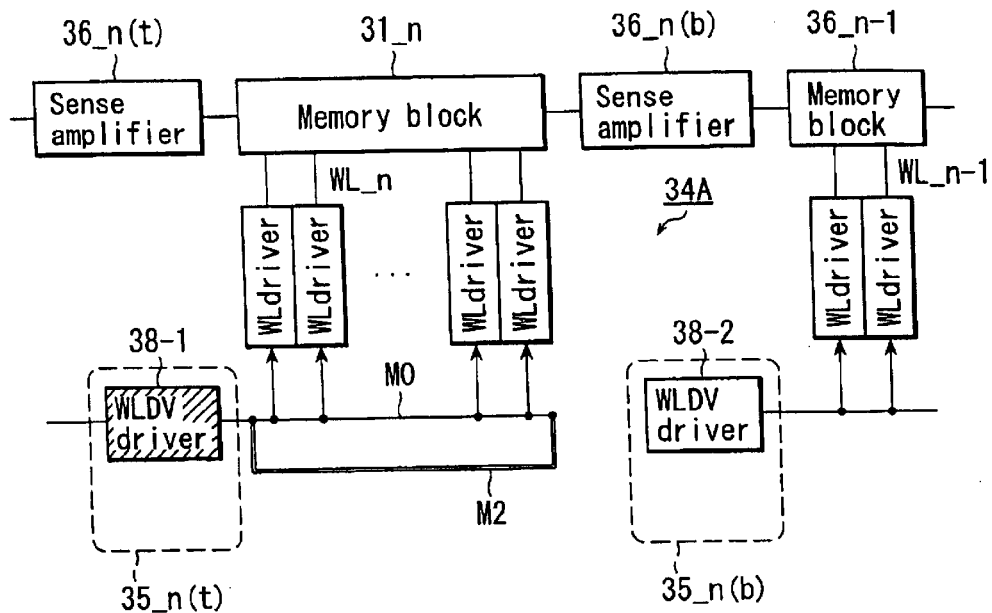
Figure 30C:
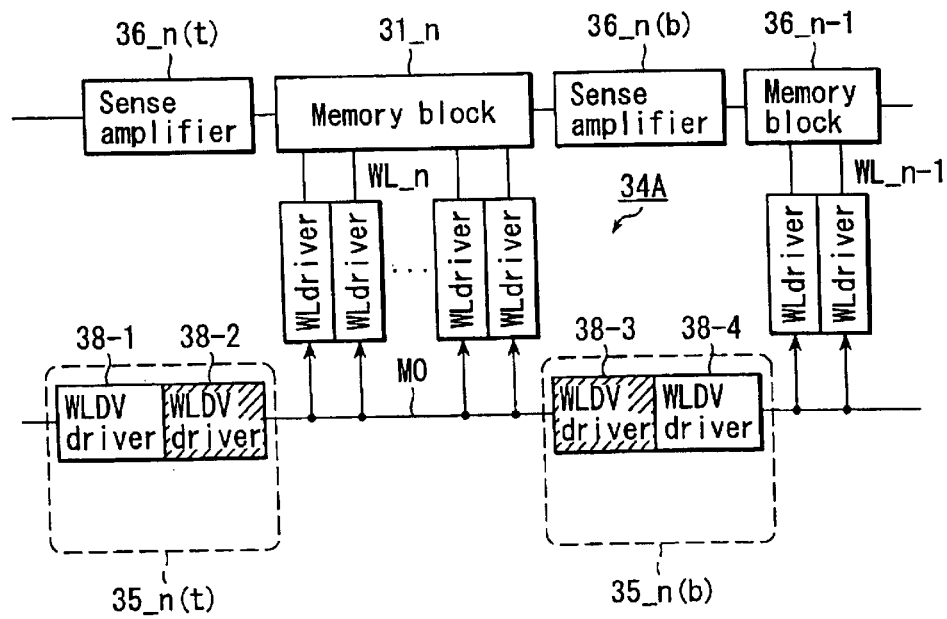
Figure 30D:
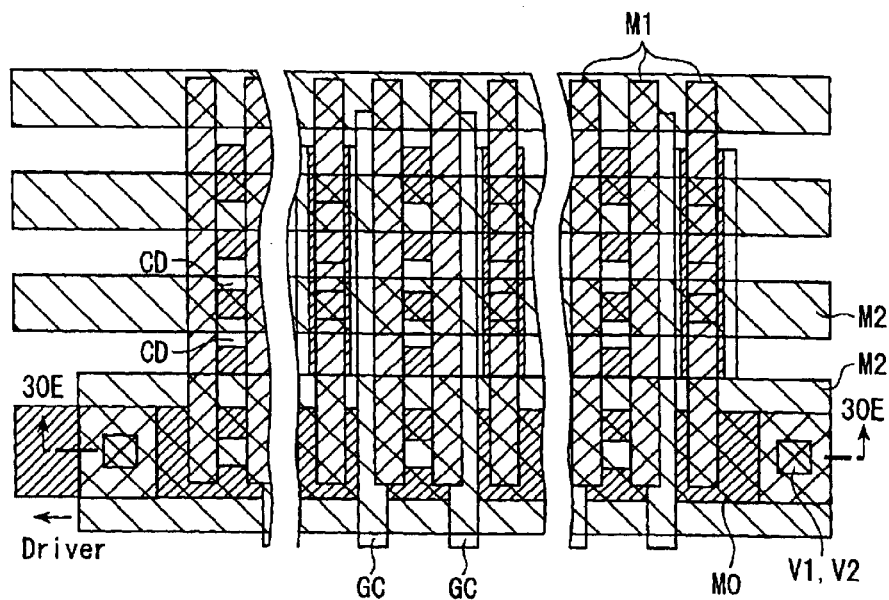
FIG. 30D is a pattern plane view showing the wiring layers that connect the WLDV driver to the WL drivers in the circuit illustrated in FIG. 30B.
Figure 30E:
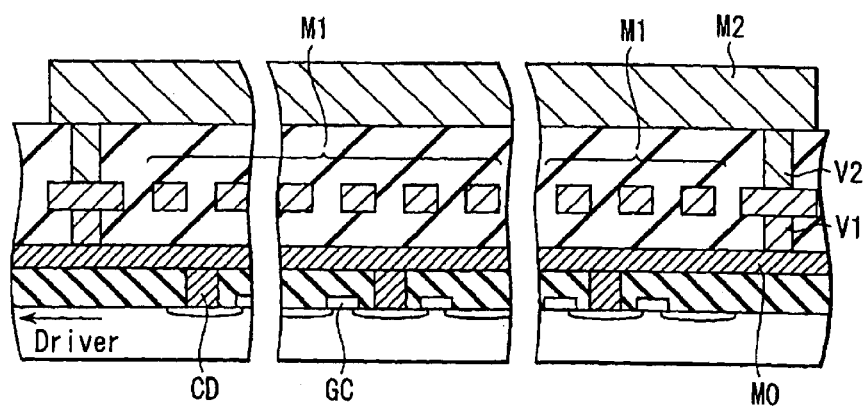
FIG. 30E is a sectional view taken along line 30E—30E shown in FIG.
Figure 30F:
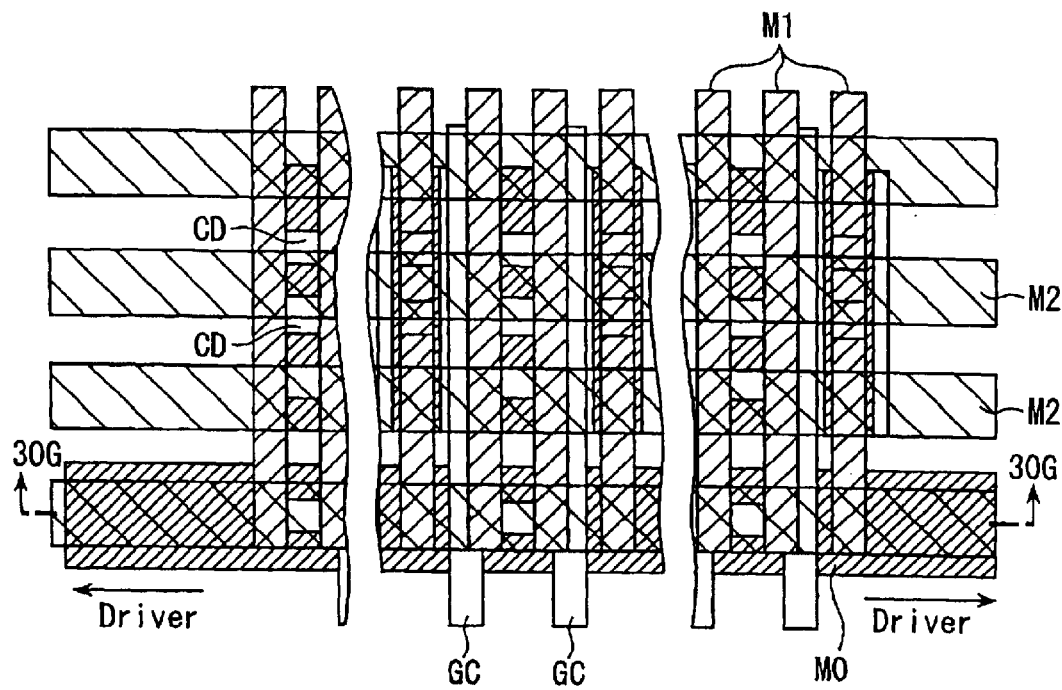
Figure 30G:
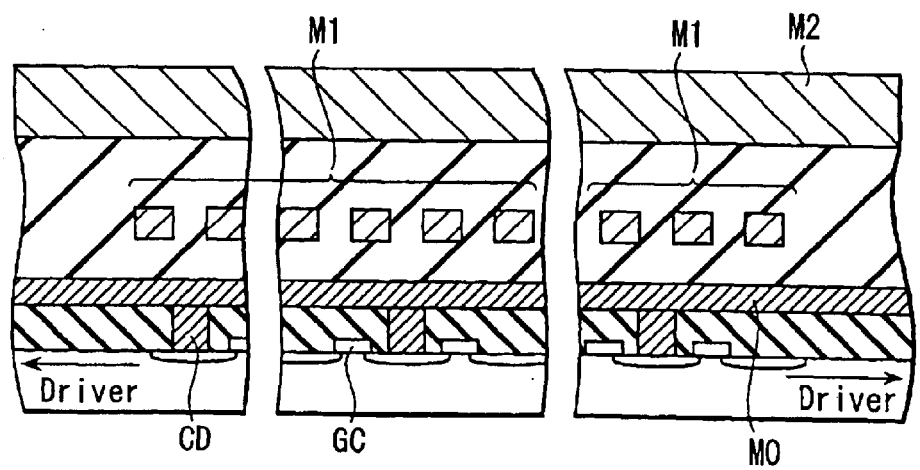
FIG. 30G is a sectional view taken along line 30G—30G shown in FIG.

FIGS. 30B and 30C are circuit diagrams, each showing a modification of the circuit illustrated in FIG. 30A. In the circuit shown in FIG. 30B, only one WLDV diver drives the signals WLDV and WLRST input to the WL drivers. In the circuit shown in FIG. 30C, both WLDV drivers drive the signals WLDV and WLRST input to the WL drivers. FIG. 30D represents the layout pattern of the wires that connect the WLDV driver to the WL drivers in the circuit illustrated in FIG. 30B. FIG. 30E is a sectional view taken along line 30E-30E shown in FIG. 30D. FIG. 30F depicts the layout pattern of the wires that connect the WLDV driver to the WL drivers in the circuit illustrated in FIG. 30C. FIG. 30G is a sectional view taken along line 30G-30G shown in FIG. 30F.

In the circuit shown in FIGS. 30B, 30D and 30E, the wires that connect the active driver (WLDV driver 38-1) to the WL drivers 34A are first-level metal wires M0. The first-level metal wires M0 are connected by contacts CD to the drain regions of the output transistors incorporated in the WLDV driver 38-1. Second-level metal wires (word lines) M1 are provided on an inter-level insulating film that has been formed on the first-level metal wires M0. The metal wires M1 intersect with the first-level metal wires M0. Third-level metal wires M2 are provided on an inter-level insulating film that has been formed on the second-level metal wires M1. The metal wires M2 extend parallel to the first-level metal wires M0. The third-level metal wires M2 are stitched together with the first-level metal wires M0, at the nearest and remotest ends of the WLDV driver 38-1. In other words, each metal wire M2 is electrically connected at one end to one metal wire M0 through a contact V1 and a contact V2, and at the other end through a contact V2 and a contact V1. The metal wires M2 and metal wires M0 serve to transfer a WLDV signal from the WLDV driver 38-1, which remains active, to the WL drivers 34A. This is because the third-level metal wires M2 are connected in parallel to the first-level metal wires M0, respectively, and each wire pair (a combination of one wire M2 and one wire M0) has thus a lower resistance than the first-level metal wires M0 that has a relatively high resistance.

In the circuit show in FIGS. 30C, 30F and 30G, both WLDV drivers drive the signals WLDV and WLRST input to the WL drivers. Only the first-level metal wires M0 connect the WLDV drivers (drivers 38-2 and 38-3), both active, to the WL drivers 34A. The metal wires M0 are connected by contacts CD to the drain regions of the output transistors provided in the WLDV drivers 38-2 and 38-3. Second-level metal wires (word lines) M1 are provided on an inter-level insulating film that has been formed on the first-level metal wires M0. The metal wires M1 intersect with the first-level metal wires M0. Third-level metal wires M2 are provided on an inter-level insulating film that has been formed on the second-level metal wires M1. The metal wires M2 extend parallel to the first-level metal wires M0. Only the metal wires M0 function to transfer WLDV signals from the WLDV drivers 38-2 and 38-3, both active, to the WL drivers 34A.

Since the two WLDV drivers drive the signals WLDV and WLRST at the two end of each metal wire M0, respectively, the third-level metal wires M2 need not be used to transfer the WLDV signals from the WLDV drivers 38-2 and 38-3 to the WL drivers 34A in the circuit of FIGS. 30C, 30F and 30G. Some of the third-level metal wires M2 are used as power lines, and the remaining metal wires M2 are used to supply signals other than the WLDV signals above the WL driver section. Since the total number of the wires M2 above the WL driver and row decoder sections can be reduced, it is, it is possible to reduce the areas that the WL drivers 34A and the row decoder 33A occupy.

Figure 31:
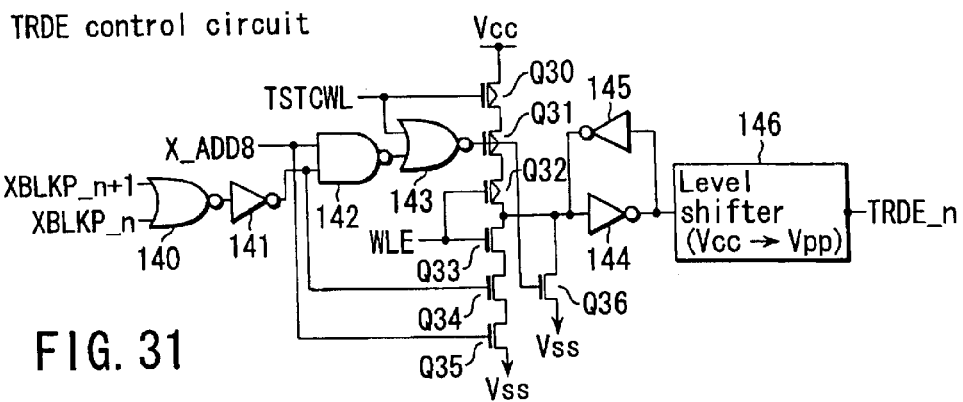

FIG. 31 is a circuit diagram showing the concrete configuration of the TRDE control circuit 130 in the circuit shown in FIG. 30A. The TRDE control circuit 130 is configured by a NOR gate 140, inverter 141, NAND gate 142, NOR gate 143, inverters 144, 145, level shifter 146 configured to convert the "Vcc" level to the "Vpp" level, P-channel MOS transistors Q30 to Q32 and N-channel MOS transistors Q33 to Q36. The current paths of the MOS transistors Q30 to Q35 are serially connected between the power supply Vcc and the ground node Vss and the current path of the MOS transistor Q36 is connected between a connection node of the current paths of the MOS transistors Q32 and Q33 and the ground node Vss.

A signal TSTCWL is supplied to the gate of the MOS transistor Q30 and one input terminal of the NOR gate 143. Further, a signal X_ADD8 is supplied to one input terminal of the NAND gate 142 and the gate of the MOS transistor Q35. Signals XBLKP_n+1 and XBLKP_n are supplied to the input terminals of the NOR gate 140 and an output signal of the NOR gate 140 is supplied to the other input terminal of the NAND gate 142 and the gate of the MOS transistor Q34 via the inverter 141. An output signal of the NAND gate 142 is supplied to the other input terminal of the NOR gate 143 which in turn supplies an output signal to the gates of the MOS transistors Q31, Q36. The signal WLE is supplied to the gates of the MOS transistors Q32, Q33.

The input terminal of the inverter 144 is connected to a connection node of the current paths of the MOS transistors Q32, Q33. The output terminal of the inverter 144 is connected to the input terminal of the inverter 145 and the output terminal of the inverter 145 is connected to the input terminal of the inverter 144. The output terminal of the inverter 144 is connected to the input terminal of the level shifter 146. A signal TRDE_n is output from the output terminal of the level shifter 146.

Figure 32:
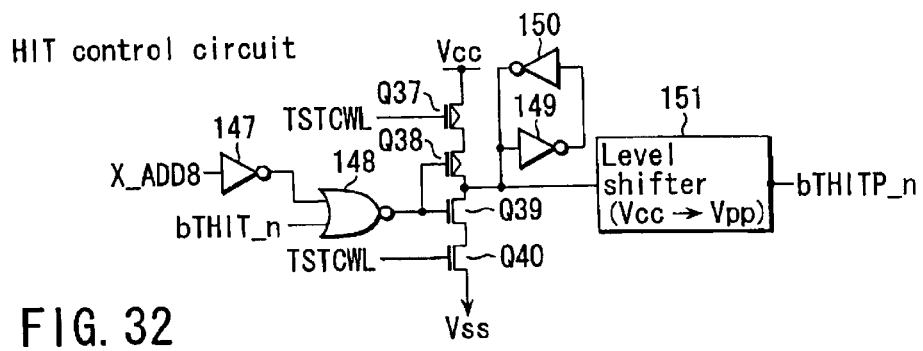
FIG. 32 is a circuit diagram showing the concrete configuration of a HIT control circuit in the circuit shown in FIG. 30A.

FIG. 32 is a circuit diagram showing the concrete configuration of a portion of the HIT control circuit 131 in the circuit shown in FIG. 30A. The HIT control circuit 131 of FIG. 30A is configured by the circuit shown in FIG. 24 and the circuit shown in FIG. 32. The circuit section shown in FIG. 32 is configured by an inverter 147, NOR gate 148, inverters 149, 150, level shifter 151 configured to convert the "Vcc" level to the "Vpp" level, P-channel MOS transistors Q37, Q38 and N-channel MOS transistors Q39, Q40. The current paths of the MOS transistors Q37 to Q40 are serially connected between the power supply Vcc and the ground node Vss.

A signal TSTCWL is supplied to the gates of the MOS transistors Q37, Q40. A signal X_ADD8 is supplied to one input terminal of the NOR gate 148 via the inverter 147. A signal bTHIT_n is supplied to the other input terminal of the NOR gate 148 which in turn supplies an output signal to the gates of the MOS transistors Q38, Q39.

The input terminal of the inverter 149 and the output terminal of the inverter 150 are connected to a connection node of the current paths of the MOS transistors Q38, Q39. The output terminal of the inverter 149 is connected to the input terminal of the inverter 150. Further, the input terminal of the level shifter 146 is connected to the connection node of the current paths of the MOS transistors Q38, Q39 and a signal bTHITP_n is output from the output terminal of the level shifter.

Figure 33:
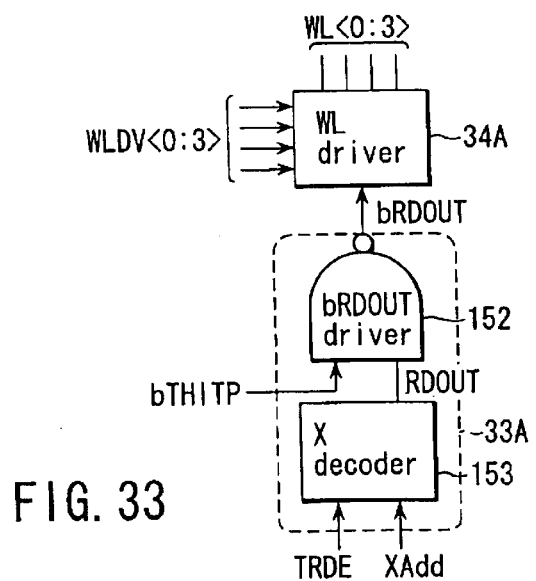
FIG. 33 is a circuit diagram showing the concrete configuration of a row decoder in the circuit shown in FIG. 30A.

FIG. 33 is a circuit diagram showing the concrete configuration of the row decoder 33A in the circuit shown in FIG. 30A. The row decoder 33A is configured by a NAND gate (bRDOUT driver) 152 and X decoder 153. The X decoder 153 is supplied with signals TRDE and XAdd and an output signal RDOUT thereof is supplied to one input terminal of the NAND gate 152. A signal bTHITP is supplied to the other input terminal of the NAND gate 152 and an output signal bRDOUT thereof is supplied to the word line driver 34A.

With the above configuration, the row decoders of a memory block arranged adjacent to the corresponding memory block with the array control circuit disposed therebetween are also activated, but the memory block adjacent to the activated memory block is set in the deactivated state without fail. Therefore, since the WLDV driver 38 of the adjacent memory block is set in the deactivated state without fail, all of the word lines therein are certainly set in the deactivated state. That is, even if the row decoders 33A of the adjacent memory block is activated, it can be neglected.

Next, the operation of the semiconductor storage device according to the fourth embodiment is explained. Like the case of the third embodiment (refer to FIGS. 25 to 27), a bank active command BA is received after entry (TM ENTRY) is made into the stacked-word-line test mode.

First, a first word line is selected (cycle #1). In this example, since 32 memory blocks/memory array (cell array unit) are used, the number of selectable word lines in each memory cell array is 32 at maximum. Since two word lines are selected in the memory block, row addresses (AR_ADD0 to AR_ADD7) used for decoding or specifying rows in the memory block is fixedly set. Since the 16 memory blocks are selected without activating the adjacent memory block on the condition that the shared sense amplifier system is used, row addresses (AR_ADD10, AR_ADD11, AR_ADD12) used for selecting the memory blocks and a row address (AR_ADD8) used for dividing the block into two half sections are sequentially added and fetched (the row address AR_ADD9 is fixedly set).

In this case, different word lines in the same memory block are sequentially activated in order. At this time, the condition is classified into one of the four cases of (1) $1^{st}$-MISS/$2^{nd}$-MISS, (2) $1^{st}$-MISS/$2^{nd}$-HIT, (3) $1^{st}$-HIT/$2^{nd}$-MISS, (4) $1^{st}$-HIT/$2^{nd}$-HIT depending on the redundancy state.

First, in the case of (1) $1^{st}$-MISS/$2^{nd}$-MISS, like the case of the third embodiment, when a bank active command BA is received, BLKSEL_0 is set from "L" to "H" and the state is latched in the BLKSEL latch circuit 48.

In the case of $1^{st}$-redundancy miss, the TRDE control circuit 130 sets TRDE_0 from "L" to "H" in response to XBLKP_0 of "H", X_ADD8_0 of "H" and WLE of "H" to release the precharge state of the row decoders 33A. WLE is set from "L" to "H" and the TWLON latch circuit 46 sets TWLON_0(t/b) from "L" to "H" in response to the change of WLE. Since TSTCWL is now set at "H", the state is latched in the TWLON latch circuit 46. After this, like the case of the third embodiment, WLDV_0 and WLRST_0 determined by X_ADD01_0 are respectively changed from "L" to "H" and "H" to "L" and the word line WL_0 is set from "L" to "H" and the activated state of the word line WL_0 is maintained.

Next, the operation for activating the sense amplifiers 36_n(t), 36_n(b) is explained below. When the sense amplifier control circuit 41 selected by the signal BLKSEL_0 receives TWLON_0(t/b) of "H", SAVLD_0 (t/b) is set from "L" to "H". After this, like the case of the third embodiment, the N/PSET driver 40 outputs NSET_0 (t/b) which is changed from "L" to "H" and bPSET_0(t/b) which is changed from "H" to "L" to activate the sense amplifiers 36_n(t), 36_n(b). Then, the bit line sensing operation for the bit line pairs BL/bBL is performed via the sense amplifiers 36_n(t), 36_n(b).

Next, an area having a different address AR_ADD8 in the same array is activated (cycle #2). At this time, the bank active command BA is received, but BLKSEL_0 is already held at "H" by the previously received bank active command.

In the case of $2^{nd}$-redundancy miss, the TRDE control circuit 130 sets TRDE_1 from "L" to "H" in response to XBLKP_0 of "H", X_ADD8_1 of "H" and WLE of "H" to release the precharge state of the row decoders 33A. The TWLON latch circuit 46 already holds TWLON_0(t/b) of "H", WLDV_0 of "H" and WLRST_0 of "L" in response to the previous bank active command BA. Therefore, the word line driver 34A determined by X_ADD23, X_ADD45, X_ADD67 is activated by releasing the precharge state of the row decoder 33A and the word line WL_1 is set from "L" to "H" and the activated state is maintained.

In the second cycle, the sense amplifier is already activated before the word line WL_1 is changed from "L" to "H", the sense operation of the bit line is terminated and the state is held. That is, as the contents of all of the memory cells connected to the word line which is secondly selected in the same memory block, the same contents as those of the memory cells connected to the first selected word line are written when the second word line is selected and the word line potential rises. Destruction of data in the memory cell will not occur by writing the same data for each bit line since the polarities of data are the same.

Next, in the case of (2) $1^{st}$-MISS/$2^{nd}$-HIT, the word line WL_0 is selected in the same manner as in the case (1) after the bank active command BA is received.

Next, an area having a different address AR_ADD8 in the same array is activated (cycle #2). At this time, the bank active command BA is received, but BLKSEL_0 of "H" is already held by the previously received bank active command.

In the case of $2^{nd}$-redundancy hit, the TRDE control circuit 130 sets TRDE_1 from "L" to "H" in response to XBLKP_0 of "H", X_ADD8_1 of "H" and WLE of "H" to release the precharge state of the X decoder section of the row decoders 33A. The TWLON latch circuit 46 already holds TWLON_0(t/b) of "H", WLDV_0 of "H" and WLRST_0 of "L" in response to the previous bank active command. RDOUT determined by X_ADD23, X_ADD45, X_ADD67 is changed from "L" to "H" and held in this state by releasing the precharge state of the X decoder section of the row decoder 33A. However, since the redundancy hit is made, bTHIT_1 is changed from "H" to "L" and bTHITP is changed from "H" to "L". Therefore, the bRDOUT driver (NAND gate) 152 refuses reception of the signal RDOUT and holds bRDOUT_1 of "H" and the word line driver 34A is not activated. Since the word line driver 34A is kept deactivated although WLDV_1 is set at "H", the word line WL_1 is set at "L" and the deactivated state is maintained. The signal bTHITP holds its state as long as TSTCWL is kept at "H".

That is, in a case where the word line which is once accessed is a defective word line, redundancy hit information (bTHITP="L") is continuously held during the test mode period so as not to select the defective word line.

In this case, two signals each holding the hit information are provided in each memory block and it is possible to increase the number of word lines which can be activated in the memory block by increasing the number of the above signals.

The sense amplifier is already activated, the bit line sensing operation is terminated and the state is held, but since the word line WL_1 is deactivated and the memory cells connected to the word line WL_1 are not accessed, data destruction will not occur.

In the case of (3) $1^{st}$-HIT/$2^{nd}$-MISS, the word line and sense amplifier are held in the deactivated state at the time of $1^{st}$-HIT like the case of the redundancy hit of the third embodiment.

At the time of second access, the word line and sense amplifier of the memory block are set in the deactivated state. Therefore, like the case of the first access in the cases (1) and (2) described before, the word line WL_1 is selected in response to the bank active command BA and the sense amplifier is activated in response to a change of bSAON from "H" to "L" to perform the bit line sensing operation.

In the case of (4) $1^{st}$-HIT/$2^{nd}$-HIT, since the redundancy hit described before successively occurs twice, the array control circuit is activated, but the word line and sense amplifier are held in the deactivated state at the time of first and second accesses.

Fifth Embodiment

A semiconductor storage device according to a fifth embodiment of this invention is explained below. In each bank configured by two memory cell arrays and sense amplifiers arranged in the upper and lower positions to commonly use row decoders, the redundancy control operation can be independently performed for word lines which are simultaneously activated in the upper and lower memory blocks commonly using the row decoders in the stacked-word-line test mode.

In the stacked-word-line test mode, the same restriction as those provided in the third and fourth embodiments is provided.

Figure 34:
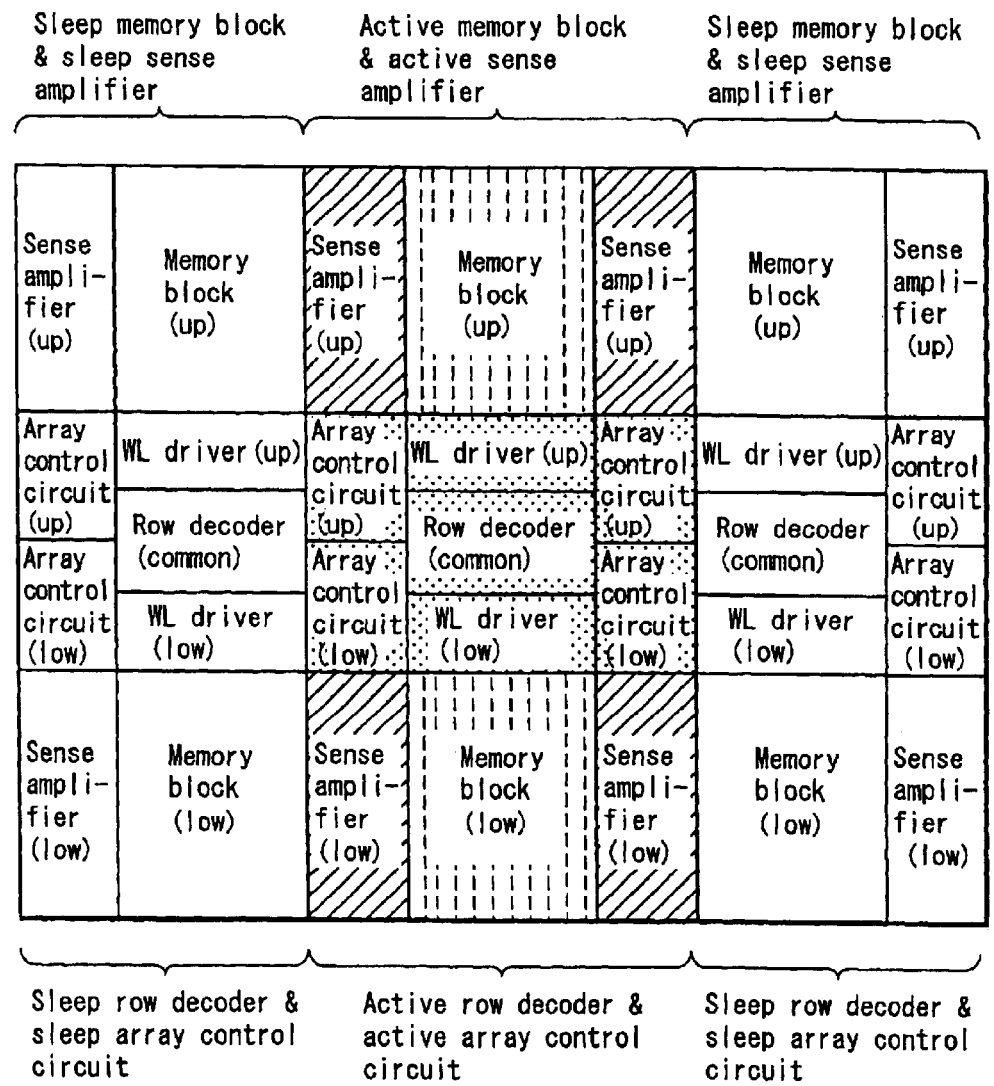
FIG. 34 is a block diagram for illustrating an example of the configuration of a semiconductor storage device according to a fifth embodiment of this invention.
Figure 35:
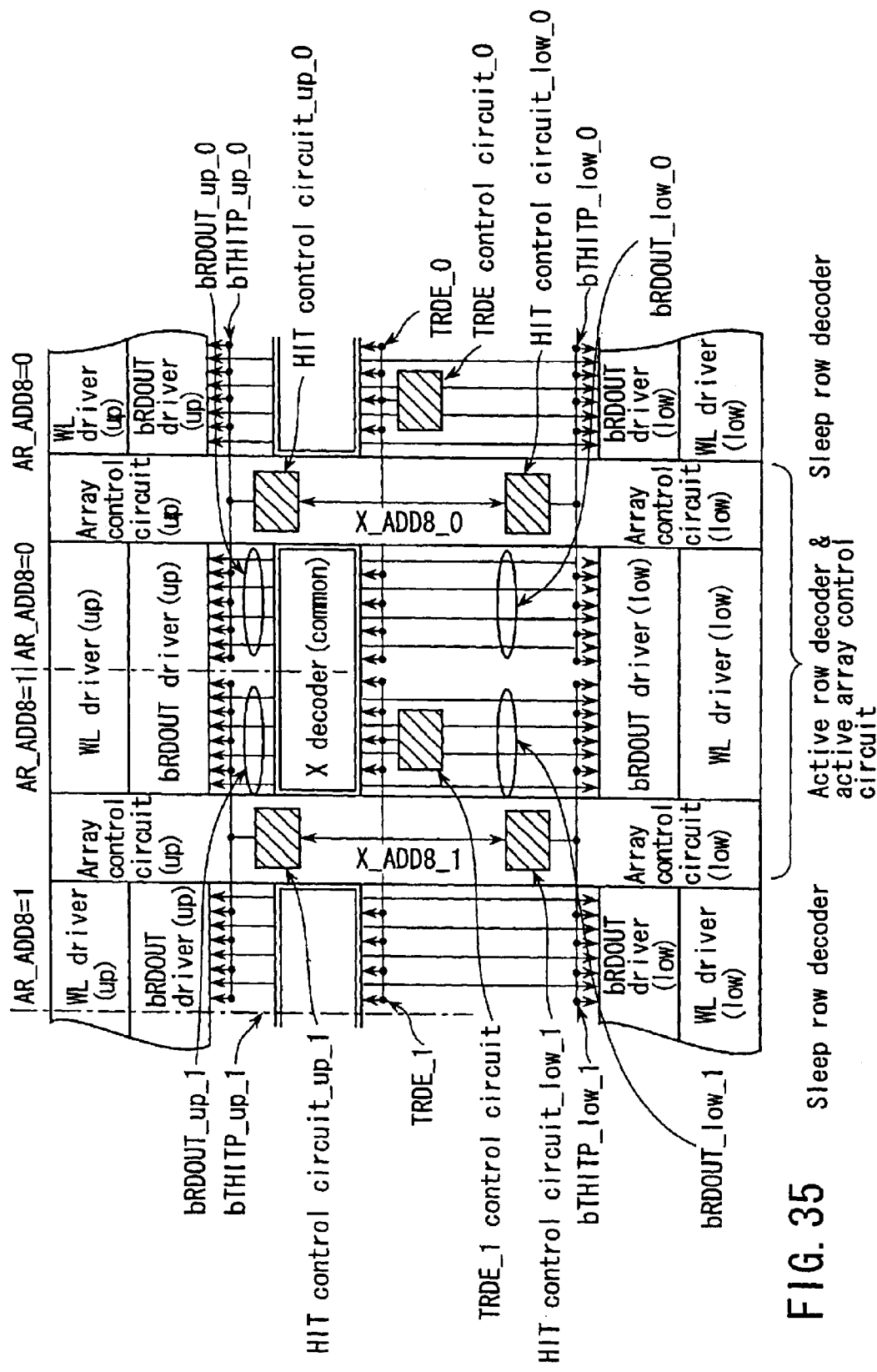
FIG. 35 is a block diagram for illustrating an example of the configuration of portions containing word line drivers, row decoders and array control circuits in the semiconductor storage device shown in FIG. 34.
Figure 36:
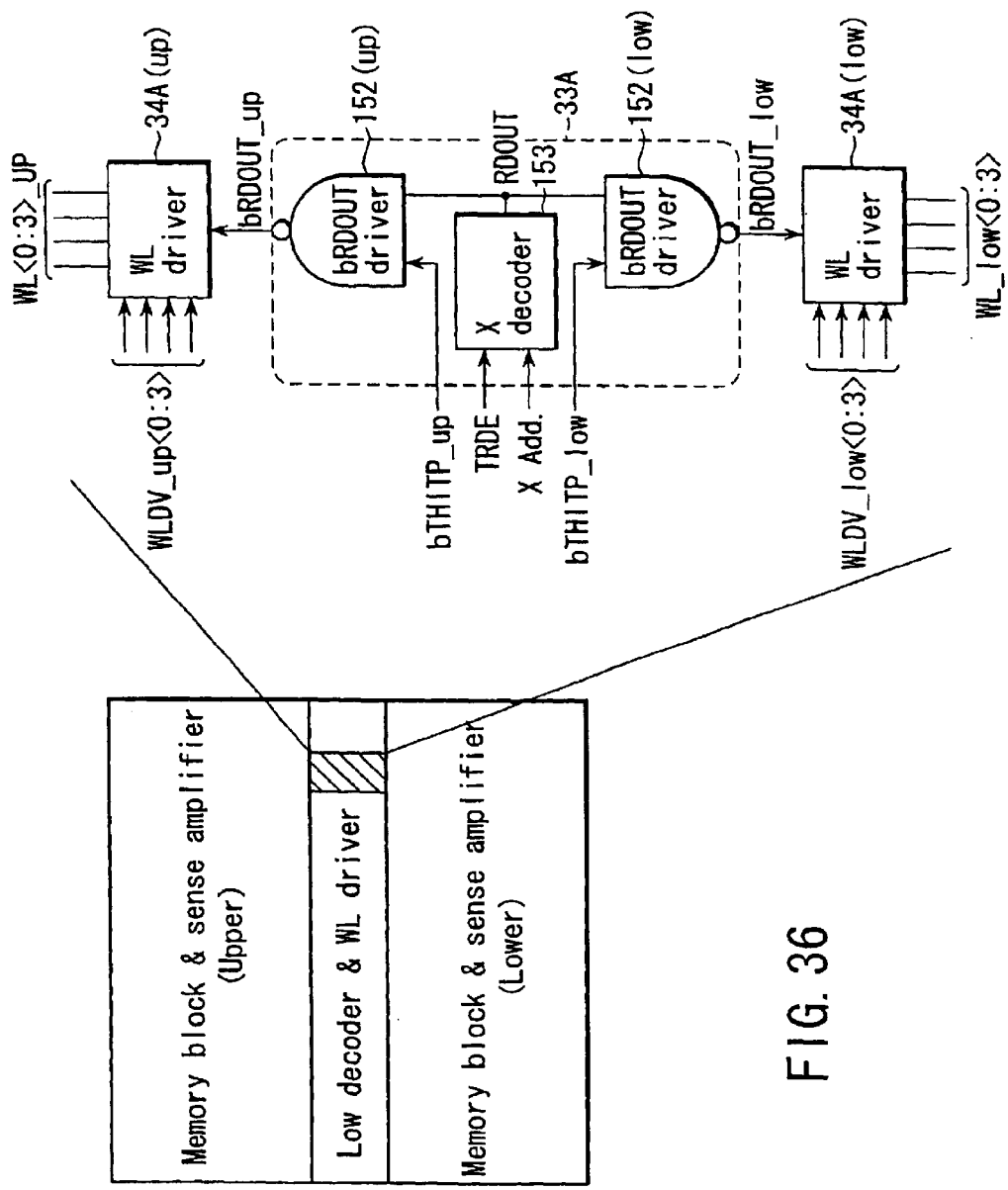
FIG. 36 is a circuit diagram showing an example of the configuration of extracted portions of row decoders and word line drivers in the semiconductor storage device according to the fifth embodiment.

FIGS. 34 to 36 show an example of the configuration of the semiconductor storage device according to the fifth embodiment. As shown in FIGS. 34, 35, the fifth embodiment is obtained by forming the memory cell array (cell array unit) configuration of each of the third and fourth embodiments into a bank configuration which has upper and lower memory blocks and sense amplifiers commonly using the row decoders. That is, as shown in FIG. 36, a row decoder 33A is configured by a NAND gate (bRDOUT driver) 152(low), NAND gate (bRDOUT driver) 152(up) and X decoder 153 and the X decoder 153 is commonly used by the upper and lower sections. An output signal RDOUT of the X decoder 153 and signals bTHITP_up, bTHITP_low each having redundancy information are input to the bRDOUT drivers 152(low), 152(up).

The signal bTHITP is a signal output from a HIT control circuit 131 provided in the array control circuit and has two sets of circuits for dealing with the upper and lower memory blocks. Global redundancy signals HIT_up/low and DWA_up/low output from the redundancy control circuit are independent for the upper and lower sections.

Figure 37:
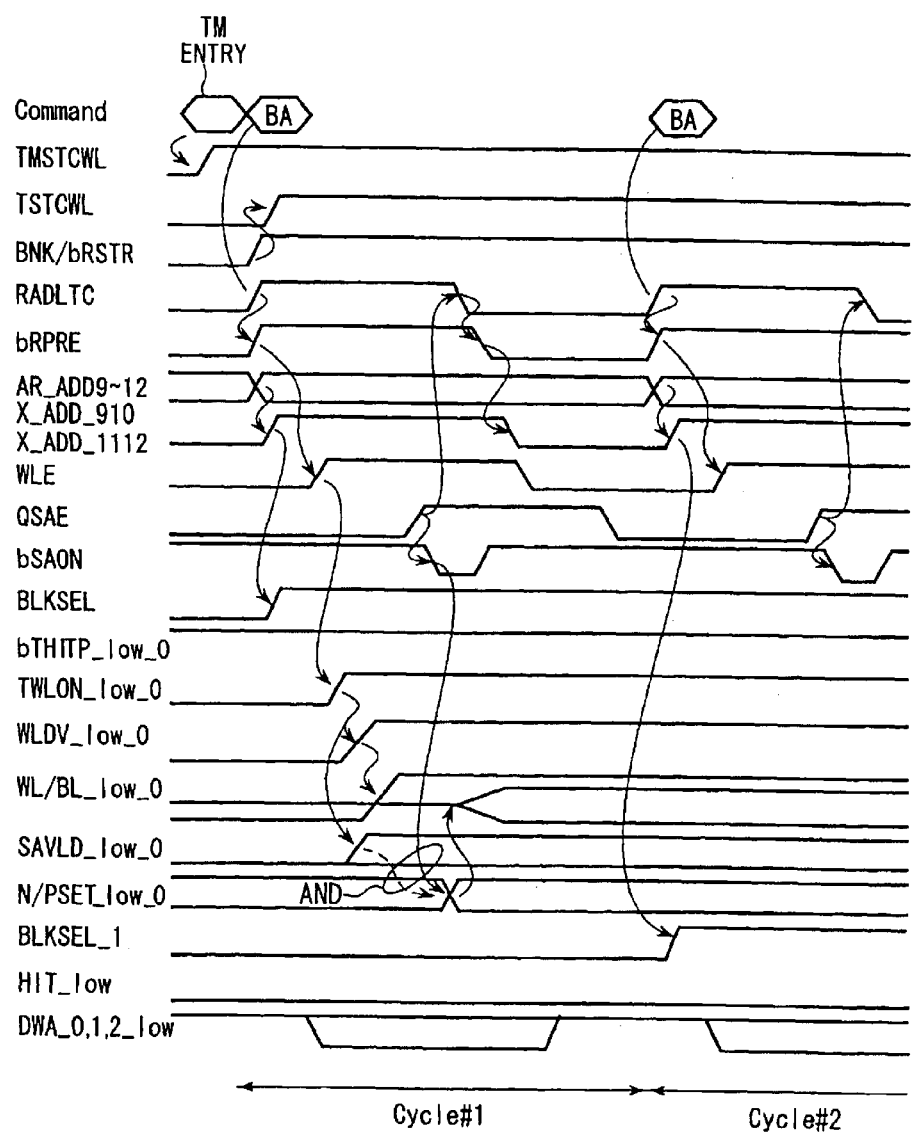
FIG. 37 is a timing chart for illustrating the operation of the semiconductor storage device according to the fifth embodiment.
Figure 38:
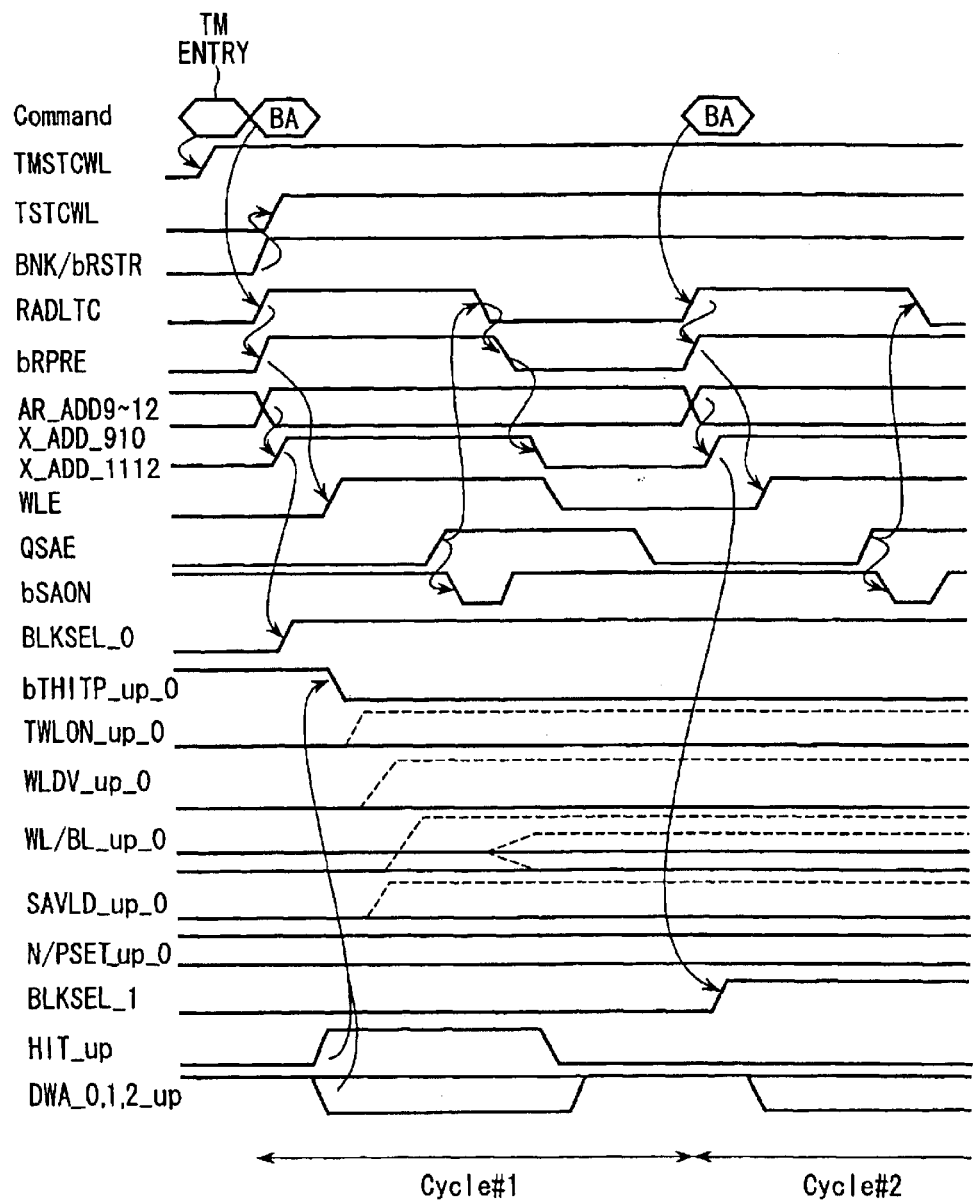
FIG. 38 is a timing chart for illustrating the operation of the semiconductor storage device according to the fifth embodiment.

Next, the operation of the semiconductor storage device according to the fifth embodiment is explained with reference to the timing chart shown in FIGS. 37 and 38. In this case, it is assumed that the number of word lines activated in the memory block is two like the case of the fourth embodiment. As in the case of the fourth embodiment, entry (TM ENTRY) is made into the stacked-word-line test mode, then a bank active command BA is received and a row address is fetched to activate X_ADD.

A case wherein a redundancy hit occurs in the upper memory block and a redundancy miss occurs in the lower memory block is considered. The redundancy control circuit outputs HIT_up which is changed from "L" to "H" and HIT_low of "L" and the HIT control circuit 131 outputs bTHITP_up which is changed from "H" to "L" and bTHITP_low of "H" in response to the above signals. At this time, since TSTCWL is set at "H", bTHITP_up of "L" is held and the state is not changed until TSTCWL is set to "L".

When the bRDOUT driver 152(up) receives bTHITP_low of "L", it refuses reception of the signal RDOUT and holds bRDOUT_up of "H". As a result, the word line driver 34A(up) of the upper memory block is not activated and even if WLDV_up is changed from "L" to "H" afterward, the word line WL_up is set at "L" and keeps the deactivated state.

In the lower memory block, since bTHITP_low is set at "H", bRDOUT_low which changes from "H" to "L" is output to activate the word line driver 34A(low) in response to the signal RDOUT determined by the X decoder 153 (low). As a result, like the fourth embodiment, WLDV is changed from "L" to "H" and the word line WL_low which is determined by the selected word line driver is changed from "L" to "H" and the word line WL_low is activated.

The sense amplifier performs the same operation as in the fourth embodiment.

Likewise, when a redundancy miss occurs in the upper memory block and a redundancy hit occurs in the lower memory block, the HIT control circuit 131 receives HIT_up of "L" and HIT_low which changes from "L" to "H" and sets bTHITP_up to "H" and changes bTHITP_low from "H" to "L". Thus, the word line WL_up is set into the activated state and the word line WL_low is set into the deactivated state.

Sixth Embodiment

A semiconductor storage device according to a sixth embodiment of this invention is explained. The sixth embodiment is obtained by modifying the memory array configurations of the third to fifth embodiments so as to simultaneously activate eight word lines in the cell array unit at (in) the stacked-word-line test mode.

The sixth embodiment has the same limitation as in the third and fourth embodiments in the stacked-wordline test mode.

FIG. 39 shows the state of a memory cell array when two word lines in the cell array unit are simultaneously activated in the stacked-word-line test mode. The number of word lines simultaneously activated is the same as that in the case of the normal write/read mode. A case wherein the state in which 16 word lines are activated in the cell array unit is set is considered. AR_ADD0 to AR_ADD9 among addresses AR_ADD0 to AR_ADD12 which are required to be input are set to hold the same address until the 16 word lines are set into the activated state. Each time a bank active command BA is input, AR_ADD10, AR_ADD11, AR_ADD12 are sequentially added to set the 16 word lines into the activated state by inputting eight bank active commands in total.

Figure 40:
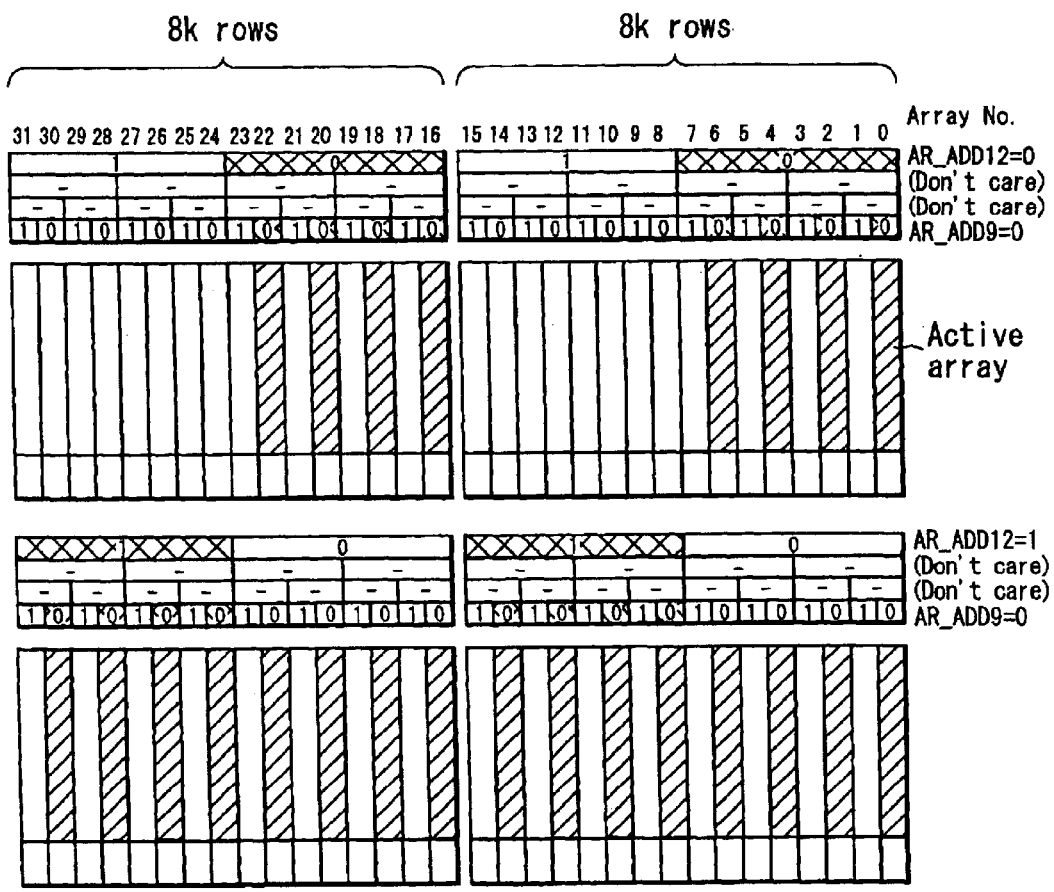
FIG. 40 is a schematic diagram showing the state of a bank when eight word lines are simultaneously activated in the stacked-word-line test mode.

FIG. 40 shows the state of the memory cell array when eight word lines in the cell array unit are simultaneously activated in the stacked-word-line test mode. The state is obtained by neglecting (bypassing) information of AR_ADD10, AR_ADD11 and setting the number of word lines to be simultaneously activated to four times that in the case of the normal write/read mode.

Figure 41A:
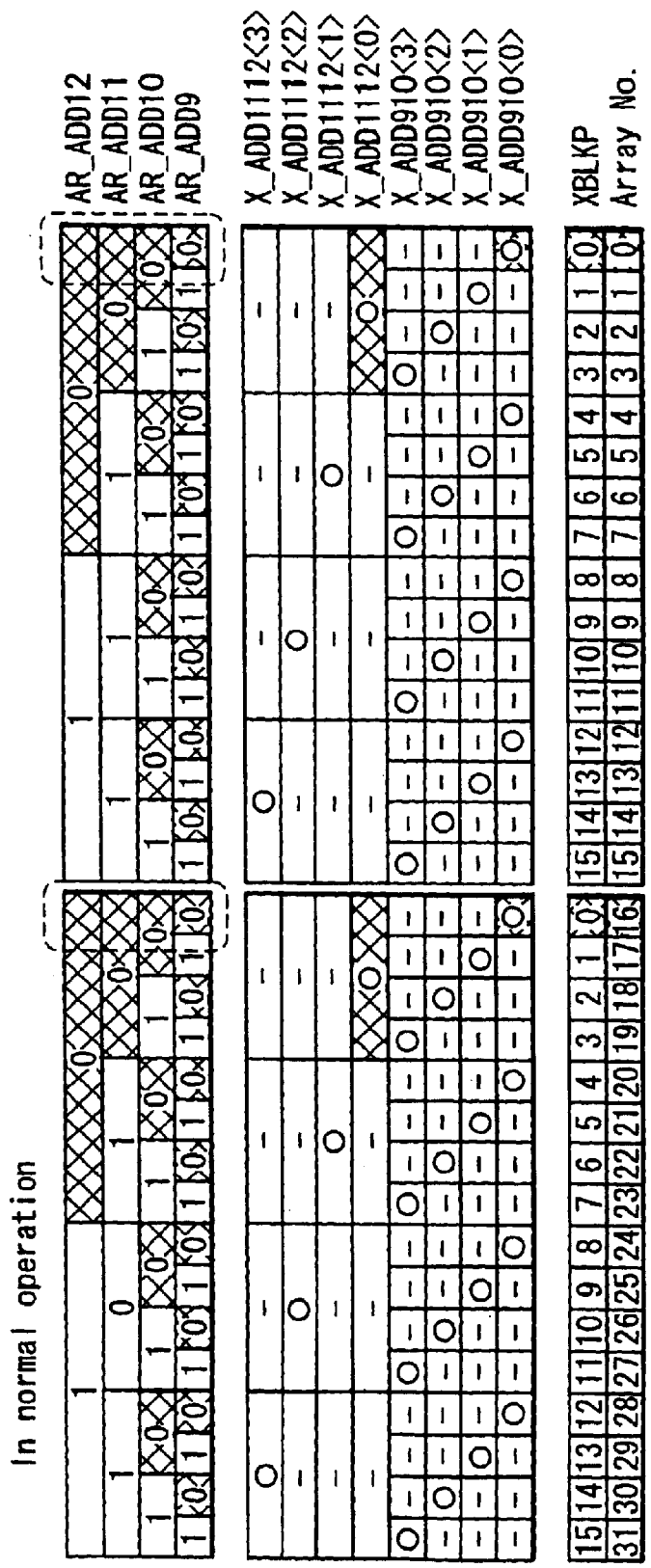
FIG. 41A is a schematic diagram showing the correspondence relation between the row address AR_ADD, signal X_ADD, signal XBLKP and memory block array No. in the normal operation.
Figure 41B:
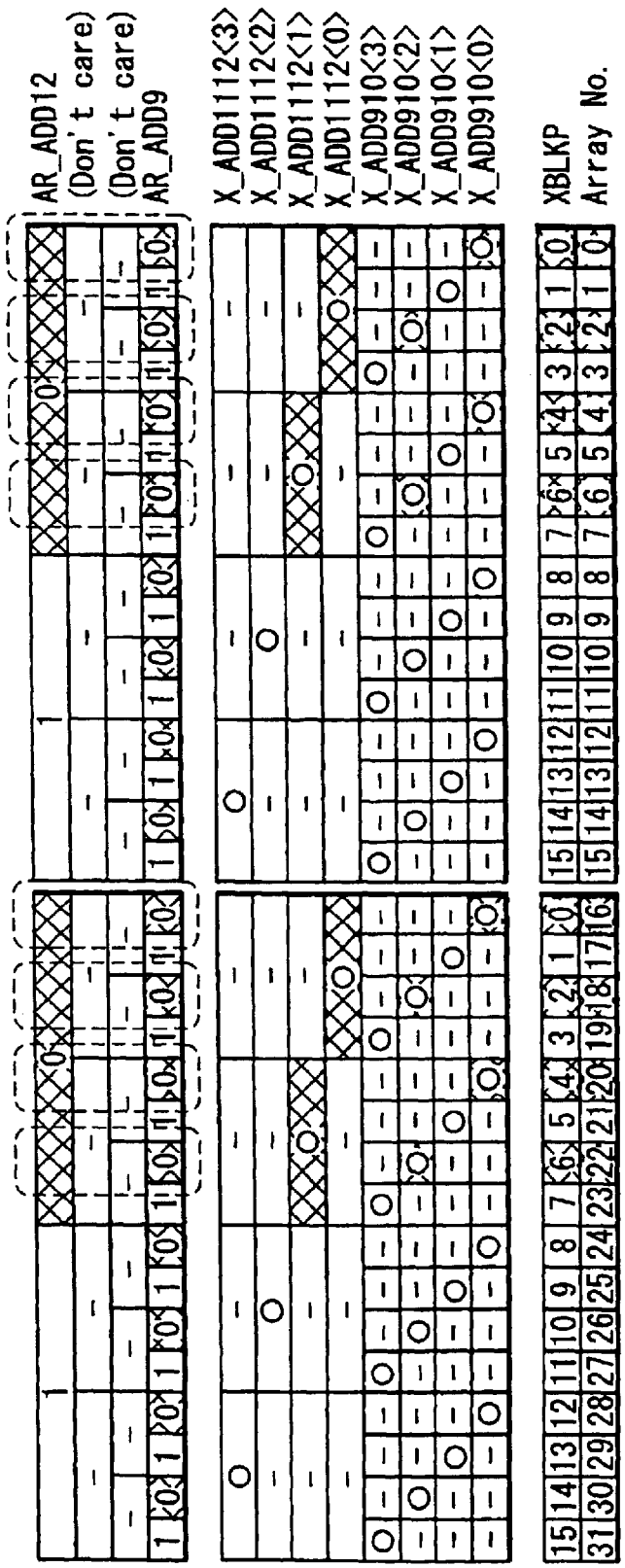
FIG. 41B is a schematic diagram showing the correspondence relation between the row address AR_ADD, signal X_ADD, signal XBLKP and memory block array No. in the fourfold word line test mode (at the time of TM1011MUSI entry)

FIGS. 41A and 41B are schematic diagrams showing the correspondence relation between the row address AR_ADD, signal X_ADD, signal XBLKP and memory block array No. FIG. 41A shows a case in the normal operation and FIG. 41B shows a case in the fourfold word line test mode (at the time of TM1011MUSI entry).

Figure 42:
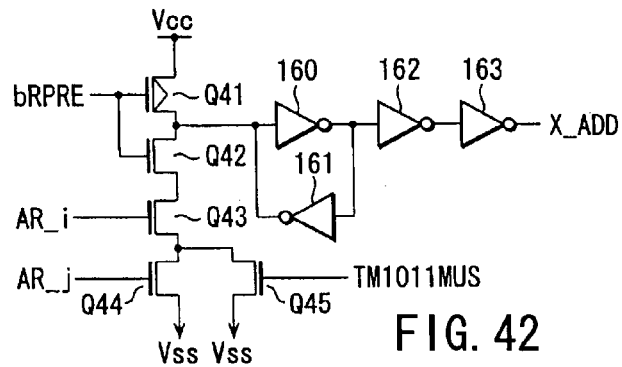
FIG. 42 is a circuit diagram for illustrating an example of the configuration of an X pre-decoder to realize the fourfold word line test mode.
Figure 43:
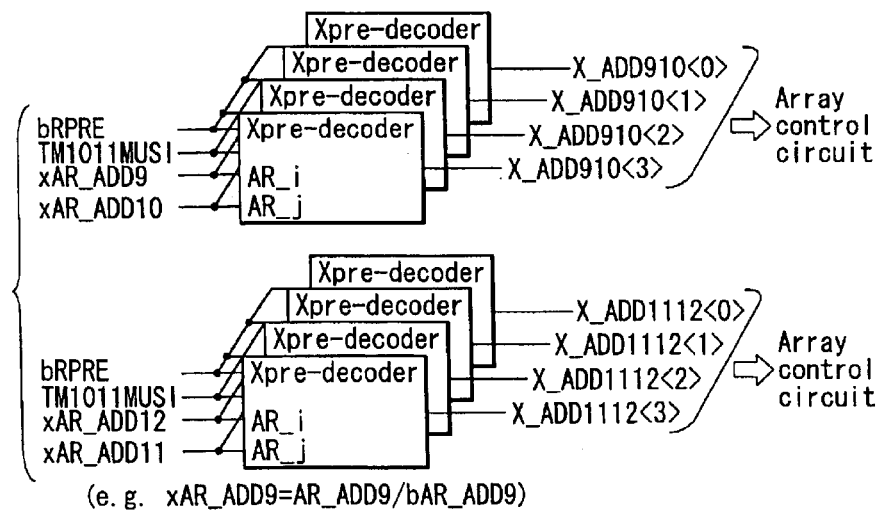
FIG. 43 is a schematic view for illustrating an example of the arrangement of an X pre-decoder to realize the fourfold word line test mode.
Figure 44:
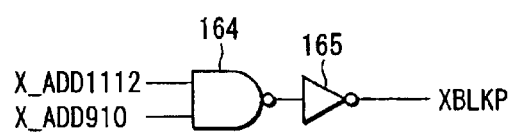
FIG. 44 is a circuit diagram for illustrating an example of the configuration of an X pre-decoder to realize the fourfold word line test mode.

FIGS. 42 to 44 are diagrams for illustrating an X predecoder to realize the fourfold word line test mode. As shown in FIG. 42, the X pe-decoder is configured by a P-channel MOS transistor Q41, N-channel MOS transistors Q42 to Q44 and inverters 160 to 163. The current paths of the MOS transistors Q41 to Q44 are serially connected between a power supply Vcc and a ground node Vss. A signal bRPRE is supplied to the gates of the MOS transistors Q41, Q42, an address signal AR_i is supplied to the gate of the MOS transistor Q43, and an address signal AR_j is supplied to the gate of the MOS transistor Q44. Further, the current path of the MOS transistor Q45 is connected between a connection node of the current paths of the MOS transistors Q43 and Q44 and the ground node Vss and a test mode signal TM1011MUSI is supplied to the gate of the MOS transistor Q45. The input terminal of the inverter 160 is connected to a connection node of the current paths of the MOS transistors Q41 and Q42 and the output terminal of the inverter 160 is connected to the input terminals of the inverters 161, 162. Further, the output terminal of the inverter 161 is connected to the input terminal of the inverter 160 and the output terminal of the inverter 162 is connected to the input terminal of the inverter 163. A signal X_ADD is output from the output terminal of the inverter 163. That is, the configuration is made such that the MOS transistor Q45 which causes input of the signal AR_j to be neglected is added to the X pre-decoder shown in FIG. 10.

The X pre-decoder shown in FIG. 42 is arranged as schematically shown in FIG. 43 to perform the decode operation. As shown in FIG. 44, signals X_ADD1112 and X_ADD910 formed by the X pre-decoders are supplied to a NAND gate 164 and an output signal of the NAND gate 164 is inverted by an inverter 165 to form a signal XBLKP.

In the semiconductor storage device according to the sixth embodiment, entry is made into the fourfold word line test mode in addition to the stacked-word-line test mode and xAR_ADD10/xAR_ADD11 input to the X pre-decoder is neglected. Therefore, as shown in FIGS. 39 and 40, all of the word lines can be selected (stacked) in a period of time which is ¼ times that of the normal operation and time for the test operation can be reduced.

Seventh Embodiment

In a seventh embodiment, the operation which is performed by the TWLON control circuit shown in FIG. 20 to fetch address information and redundancy miss information and hold the redundancy miss information is performed in each row decoder. RDOUT which contains address information, and is used to select the WL driver and a signal bTHIT which has part of address information and redundancy information and is reset in each cycle are fetched in each cycle. Therefore, it becomes possible to activate two or more word lines in the memory block.

Figure 45:
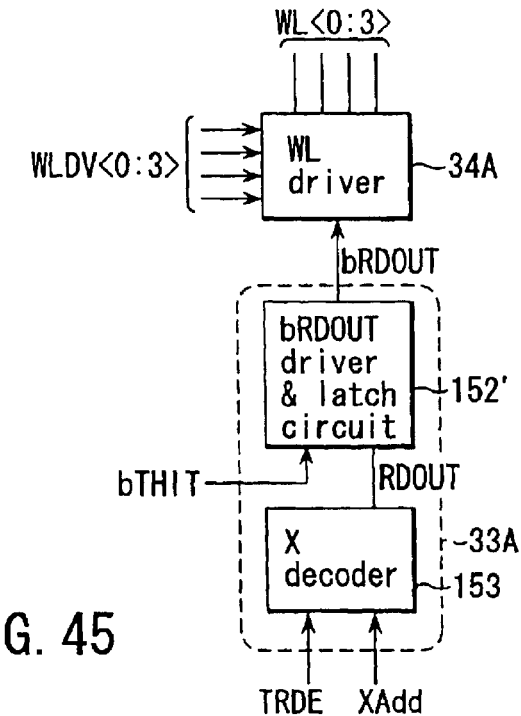
FIG. 45 is a block diagram showing extracted portions of a row decoder and word line driver, for illustrating a semiconductor storage device according to a seventh embodiment of this invention.
Figure 46:
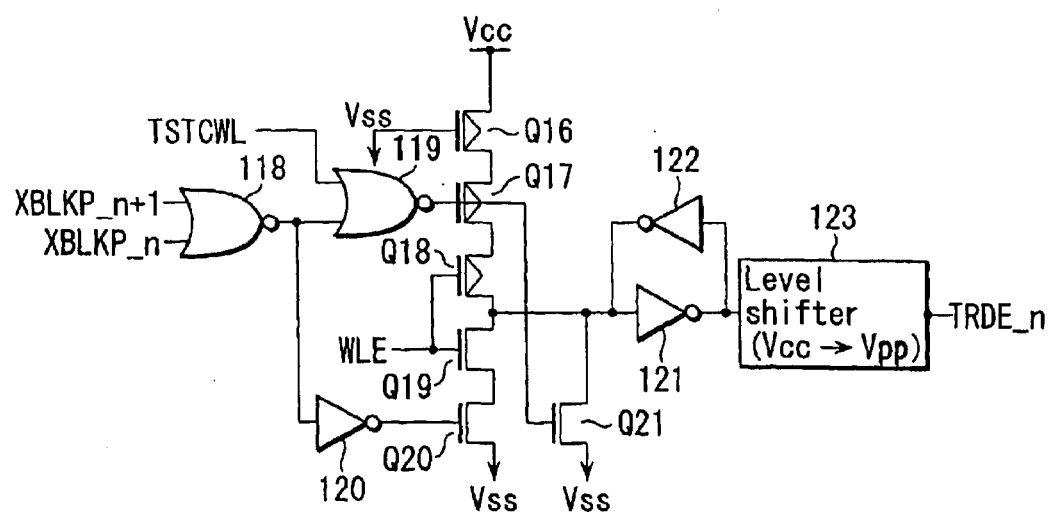
FIG. 46 is a circuit diagram showing an example of the configuration of a TRDE control circuit.
Figure 47:
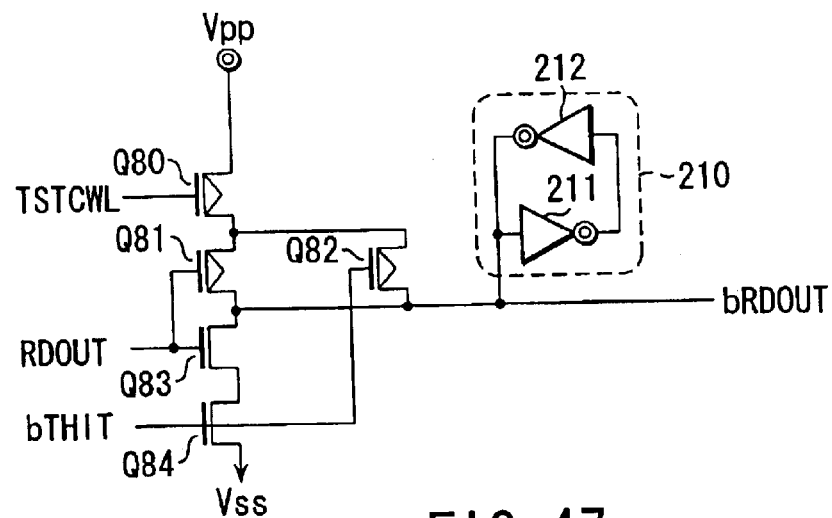
FIG. 47 is a circuit diagram showing an example of the configuration of a bRDOUT driver & latch circuit in the circuit shown in FIG. 45.
Figure 48:
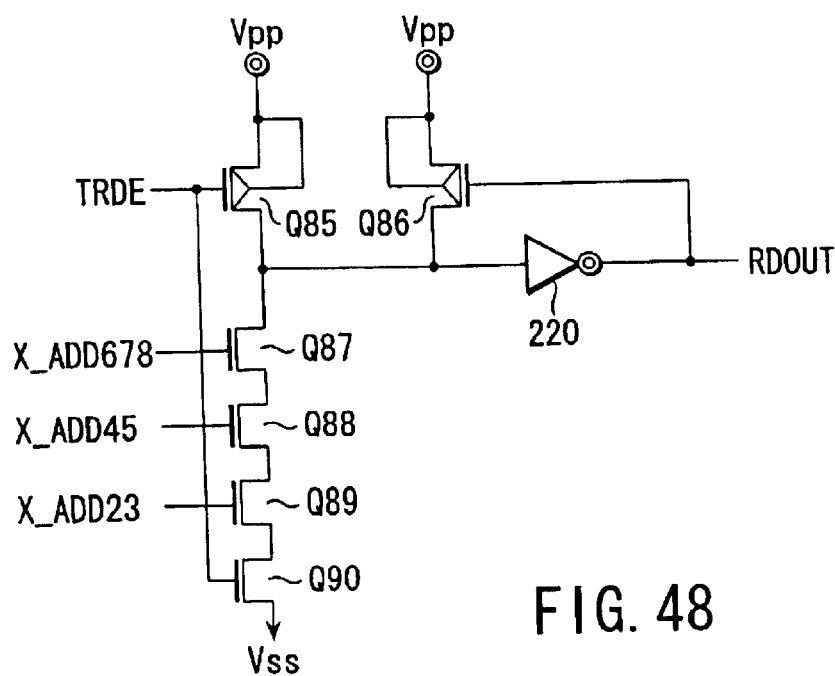
FIG. 48 is a circuit diagram showing an example of the configuration of an X decoder in the circuit shown in FIG. 45.
Figure 49:
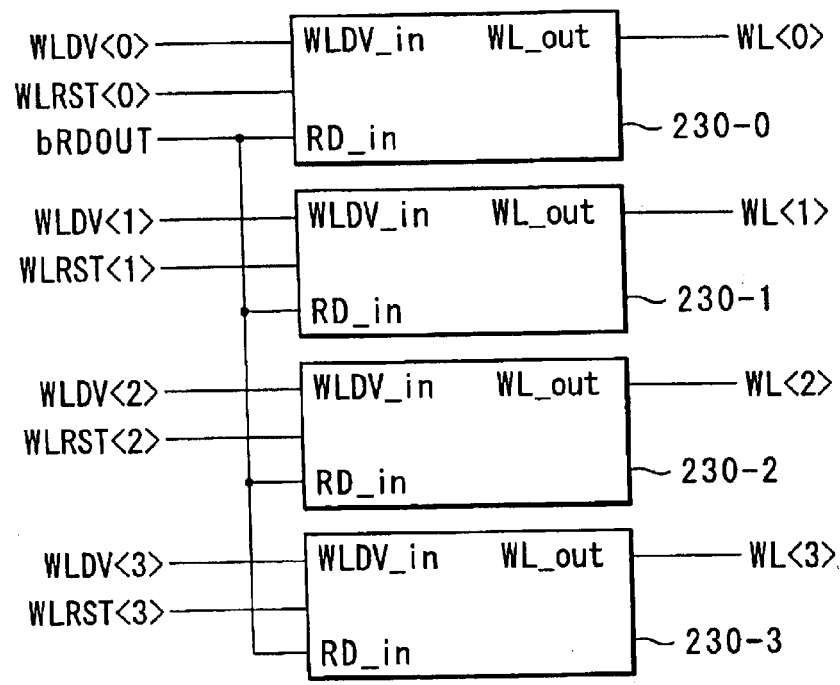
FIG. 49 is a block diagram showing an example of the configuration of a word line driver in the circuit shown in FIG. 45.
Figure 50:
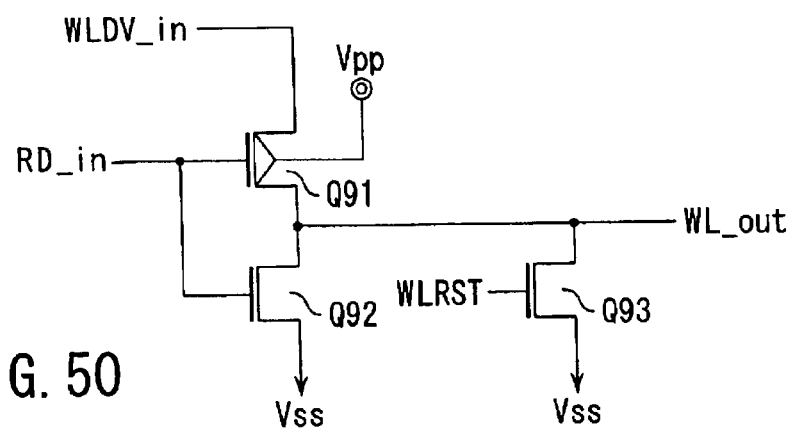
FIG. 50 is a circuit diagram showing an example of the configuration of each of the word line drivers shown in FIG. 49.

FIGS. 45 to 50 illustrate the semiconductor storage device according to a seventh embodiment, FIG. 45 being a block diagram showing an extracted portion of row decoders and WL drivers and FIG. 46 being a circuit diagram showing an example of the configuration of a TRDE control circuit. FIG. 47 is a circuit diagram showing an example of the configuration of a bRDOUT driver & latch circuit 152' in the circuit shown in FIG. 45 and FIG. 48 is a circuit diagram showing an example of the configuration of an X decoder 153 in the circuit shown in FIG. 45. Further, FIG. 49 is a block diagram showing an example of the configuration of a word line (WL) driver 34A and FIG. 50 is a circuit diagram showing an example of the configuration of each driver circuit of the word line driver 34A shown in FIG. 49.

As shown in FIG. 45, a row decoder 33A is configured by the X decoder 153 and bRDOUT driver & latch circuit 152'. The X decoder 153 is supplied with signals TRDE and XAdd and supplies an output signal RDOUT to the bRDOUT driver & latch circuit 152'. The bRDOUT driver & latch circuit 152' is supplied with a signal bTHIT and supplies an output signal bRDOUT to the word line driver 34A.

The signal bTHITP in the circuit shown in FIG. 33 is a signal which continuously holds hit information if a redundancy hit once occurs, but the signal bTHIT in the circuit shown in FIG. 45 is a signal expressing redundancy information (hit or miss) in each cycle.

A TRDE control circuit shown in FIG. 46 is basically the same as the TRDE latch circuit shown in FIG. 23, but it is different in that the gate of the MOS transistor Q16 is not supplied with the signal TSTCWL and is connected to the ground node Vss. Therefore, it becomes possible to reset the signal TRDE without holding the signal TRDE and fetch an address into the row decoder 33A in each cycle. Since the other configuration is the same as that of FIG. 23, portions which are the same as those of FIG. 23 are denoted by the same reference numerals and the explanation therefore is omitted.

As shown in FIG. 47, the bRDOUT driver & latch circuit 152' in the circuit shown in FIG. 45 is configured by P-channel MOS transistors Q80 to Q82, N-channel MOS transistors Q83, Q84 and latch circuit 210. The current paths of the MOS transistors Q80, Q81, Q83, Q84 are serially connected between a power supply Vpp and the ground node Vss. Further, the current paths of the MOS transistors Q81, Q82 are connected in parallel. A signal TSTCWL is supplied to the gate of the MOS transistor Q80, a signal RDOUT is supplied to the gates of the MOS transistors Q81, Q83, and a signal bTHIT is supplied to the gates of the MOS transistors Q82, Q84. The latch circuit 210 is configured by cross-coupling the input and output terminals of inverters 211, 212 which operate on voltage between the power supply Vpp and the ground node Vss and is connected to a connection node of the current paths of the MOS transistors Q81, Q82, Q83. A signal bRDOUT is output from the connection node of the current paths of the MOS transistors Q81, Q82, Q83.

It is assumed that the "H" level of the signal TSTCWL/bTHIT input to the above circuit is shifted from Vcc to Vpp.

As shown in FIG. 48, the X decoder 153 in the circuit shown in FIG. 45 is configured by P-channel MOS transistors Q85, Q86, N-channel MOS transistors Q87 to Q90 and inverter 220. The current paths of the MOS transistors Q85, Q87 to Q90 are serially connected between the power supply Vpp and the ground node Vss. Further, the current path of the MOS transistor Q86 is connected between a connection node of the current paths of the MOS transistors Q85 and Q87 and the power supply Vpp. A signal TRDE is supplied to the gates of the MOS transistors Q85, Q90, a signal X_ADD678 is supplied to the gate of the MOS transistor Q87, a signal X_ADD45 is supplied to the gate of the MOS transistor Q88, and a signal X_ADD23 is supplied to the gate of the MOS transistor Q89. The inverter 220 operates on voltage between the power supply Vpp and the ground node Vss, the input terminal thereof is connected to a connection node of the current paths of the MOS transistors Q85, Q86, Q87 and the output terminal thereof is connected to the gate of the MOS transistor Q86. A signal RDOUT is output from the output terminal of the inverter 220.

FIG. 49 is a block diagram showing an example of the configuration of the word line driver 34A in the circuit shown in FIG. 45. The word line driver 34A is configured by driver circuits 230-0 to 230-3. Signals WLDV<0> to WLDV<3> are respectively supplied to first input terminals WLDV_in of the driver circuits 230-0 to 230-3, signals WLRST<0> to WLRST<3> are respectively supplied to second input terminals thereof, a signal bRDOUT is supplied to third input terminals RD_in thereof, and drive signals WL<0> to WL<3> of the word lines are respectively output from output terminals WL_out thereof.

As shown in FIG. 50, each of the driver circuits 230-0 to 230-3 shown in FIG. 49 is configured by a P-channel MOS transistors Q91 and N-channel MOS transistors Q92, Q93. One end of the current path of the MOS transistor Q91 corresponds to the first input terminal WLDV_in and is supplied with a corresponding one of the signals WLDV<0> to WLDV<3>. Further, the current path of the MOS transistor Q92 is connected between the other end of the current path of the MOS transistor Q91 and the ground node Vss. The gates of the MOS transistors Q91, Q92 correspond to the third input terminal RD_in and are supplied with the signal bRDOUT. A connection node of the current paths of the MOS transistors Q91, Q92 corresponds to the output terminal WL_out and outputs a corresponding one of the signals WL<0> to WL<3>. Further, the current path of the MOS transistor Q93 is connected between a connection node of the current paths of the MOS transistors Q91, Q92 and the ground node Vss, and the gate of the MOS transistor Q93 corresponds to the second input terminal and is supplied with the signal WLRST used to reset the word line.

The X decoder 153 and word line drivers 34A, 34A(low), 34A(up) in the circuits shown in FIGS. 33 and 36 can be formed with the same configurations as those of the X decoder shown in FIG. 48 and the word line driver shown in FIG. 50.

Next, the operation of the semiconductor storage device according to the seventh embodiment is explained.

After entry is made into the test mode, TSTCWL is set to "H". If a bank active command is received in the first cycle, XBLKP_n is set to "H" (or XBLKP_n+1 may be set to "H"), WLE is set to "H" and TRDE is set to "H". An address X_ADD is output from the X pre-decoder and the X decoder 153 determined by the address outputs RDOUT of "H".

In the case of redundancy miss, since bTHIT is set at "H", the bRDOUT driver & latch circuit 152' outputs bRDOUT of "L" to activate the word line driver 34A and causes the latch circuit 210 to hold the state of redundancy miss. Then, a word line WL determined by a signal WLDV obtained by decoding the address X_ADD01 is activated. The activation operation and holding operation of the sense amplifier are the same as those of the third embodiment.

Like the third embodiment, a self-resetting operation is performed to set WLE and TRDE to "L". In response to this, the X decoder outputs RDOUT of "L", but since TSTCWL is set at "H" at this time, bRDOUT of "L" is held in the latch circuit 210 in the circuit shown in FIG. 47. That is, the word line activation signal bRDOUT generated is held. If the state of redundancy miss is once held in the latch circuit 210, the information is continuously held in a period of TSTCWL of "H" even if a redundancy hit occurs and bTHIT is set to "L" in the next or succeeding cycle. Further, since WLDV is kept at "H" like the case of the third embodiment, the word line WL is kept in the activated state even if WLE is set to "L".

A bank active command is received in the second cycle and next address information is received. At this time, WLE is set to "H" and TRDE is set to "H". An address X_ADD is output from the X pre-decoder and the X decoder 153 determined by the address outputs RDOUT of "H". Like the case of the first cycle, in the case of redundancy miss, the bRDOUT driver & latch circuit 152' outputs bRDOUT of "L" to activate the word line driver 34A and causes the latch circuit 210 to hold the state of redundancy miss. Then, the word line WL determined by a signal WLDV obtained by decoding the address X_ADD01 is activated as in the case of the first cycle.

On the other hand, in the case of redundancy hit, since bTHIT is set at "L", the bRDOUT driver & latch circuit 152' outputs bRDOUT of "H" irrespective of input of the signal RDOUT to deactivate the word line driver 34A. Although a signal WLDV obtained by decoding the address X_ADD01 is set to "H", the word line WL keeps the deactivated state.

Since an output RDOUT of the X decoder which is hit in the past is reset to the "L" level in each cycle even if a redundancy miss occurs and bTHIT is set to "H" in the next or succeeding cycle, a signal bRDOUT for a defective word line will not be erroneously set to the "L" level.

It is necessary to wait to output the signal RDOUT from the X decoder 153 in the fourth to seventh embodiments until redundancy information becomes stable. In order to attain this, activation timing of the X decoder 153 may be delayed by delaying the timing for setting TRDE to "H" so as to wait until redundancy information becomes stable (bTHIT is set to "L" or "H"). However, delaying of the timing for setting TRDE to "H" in the normal operation causes a rise of the word line WL to be delayed and degrades the speed of access (performance) to the memory cell. Therefore, in this invention, it is made possible to delay the timing for setting TRDE to "H" only in the test mode.

That is, in the TRDE control circuit shown in FIG. 31 or 46, TRDE is set to "H in response to XBLKP_n of "H" (or XBLKP_n+1 of "H") when TSTCWL is set at "L", that is, in the normal operation. However, when TSTCWL is set at "H" or in the test mode, TRDE is set to "H" in response to WLE of "H".

The signal WLE is a signal which rises after X_ADD is stably determined and redundancy information is determined. Therefore, the signal TRDE which rises in response to a change of the signal WLE inevitably rises after determination of redundancy information. Thus, the signal RDOUT will be activated after redundancy information is determined.

The output timing of the signal RDOUT can be set by delaying activation of X_ADD as a means for waiting until redundancy information is determined, and in this case, the same effect can be attained.

For example, the X pre-decoder 89 (refer to FIG. 15) which outputs X_ADD23, X_ADD45, X_ADD678 input to the row decoders 33A is replaced by an X pre-decoder 88 which resets the addresses to the low level in each cycle. Then, the precharge release timing of X_ADD23, X_ADD45, X_ADD678 set by bRPRE of "H" is set after determination of redundancy information to delay activation of X_ADD. Thus, the signal RDOUT will be activated after redundancy information is determined.

Further, it is need for the semiconductor storage devices according to the third to seventh embodiments to satisfy the following conditions (A), (B).

(A) The number of WLDVs activated in one memory block is set to only one (this is a condition required for preventing a word line which is not originally accessed or a defective word line which is replaced and should not be selected from being selected).

(B) Likewise, the number of WLDVs activated in the memory block act as the spare cell array is set to only one (this is a condition required for preventing a spare word line which is not used for replacement in a certain cession of stacked WL test mode from being selected).

In order to satisfy the condition (A), it is necessary to fixedly set input addresses AR_ADD0, AR_ADD1, that is X_ADD01, to select WLDV.

To select a word line, one of the signals WLDV<0:3> is selected in accordance with an input address, as is illustrated in FIGS. 33, 36, 45 and 49, and one of the row decoders 33A is selected. Hence, two or more word lines will be simultaneously activated in the memory block if a new row decoder 33A is selected (bRDOUT="H" to "L") in accordance with a new address input while two or more WLDV signals remain active in the stacked-word-line test mode. Nonetheless, only one of the word lines has been accessed.

Assume that a WLDV signal and a row decoder have been activated in a certain memory block. If another WLDV signal is newly selected while selecting another row decoder, the row decoder already activated and the newly selected WLDV signal will activate a word line. The word line thus activated is, however, one that has not been accessed. This word line will be selected even if it is a defective one.

When a defective word line is accessed, bRDOUT is not "L" in the circuit of FIG. 33 or the circuit of FIG. 36 because THITP="L," or in the circuit of FIG. 45 because bTHIT="L." Therefore, the defective word line will not be activated. This holds true of the case where only one WLDV signal is activated in one memory block in the stacked-word-line test mode.

This is not true for the case where two or more WLDV signals are activated in one memory block in the stacked-word-line test mode and the word line selected by the row decoder 33A associated with a defective word line and a WLDV signal other than the one corresponding to the defective word line has not been replaced by a redundant word line. More specifically, the case above is the case where one row decoder 33A can select four word lines by use of four WLDV signals as show in FIGS. 33, 36 and 45, one or two word lines are simultaneously replaced as a unit for replacement. If a word line, which is selected by a row decoder 33A associated with a defective word line and a WLDV signal other than the WLDV signal corresponding to the defective word line, is not included in the unit for replacement (i.e., defective elements) which should be replaced, the word line can be selected and activated. This means that the output bRDOUT of the row decoder 33A associated with the defective word line can be at level "L." That is, if two or more WLDV signals are activated in one memory block in the stacked-word-line test mode, it is possible to set the output bRDOUT associated with a defective word line at level "L" in one cycle and to activate the WLDV signal corresponding to the defective word line in another cycle.

To avoid the selection of the defective word line, only one WLDV signal must be activated in one memory block. The address for selecting one WLDV signal from many should be fixed before two or more word lines are accessed in the memory block.

By the way, when it is assumed that a defective word line is replaced in the unit of two word lines, an address to select one of the two spare word lines of one unit for replacement is the same as the address AR_ADD0 which is used for the normal word line, but the other address RAR_ADD1 is different from the address AR_ADD1 which is used for the normal word line. Therefore, in order to satisfy the condition (B), a plurality of spare elements used for replacement must have the same value of RAR_ADD1 when a plurality of defective word lines to be simultaneously activated in the stacked word lines are replaced by a plurality of spare word lines in one spare cell array.

The defective ones (defective elements) of the word lines that are to be activated together in the stacked-word-line test mode may be replaced by spare word lines (spare elements) provided in a memory block that is a spare array. In this case, unless the spare word lines (spare elements) thus used are associated with one and the same WLDV signal, the other spare word lines that are not used in this session of the stackedword-line test mode will be inevitably activated by the combination of the plurality of MLPV signals that are activated in the memory block (spare array) and the selected redundant row decoders.

Eighth Embodiment

Figure 51:
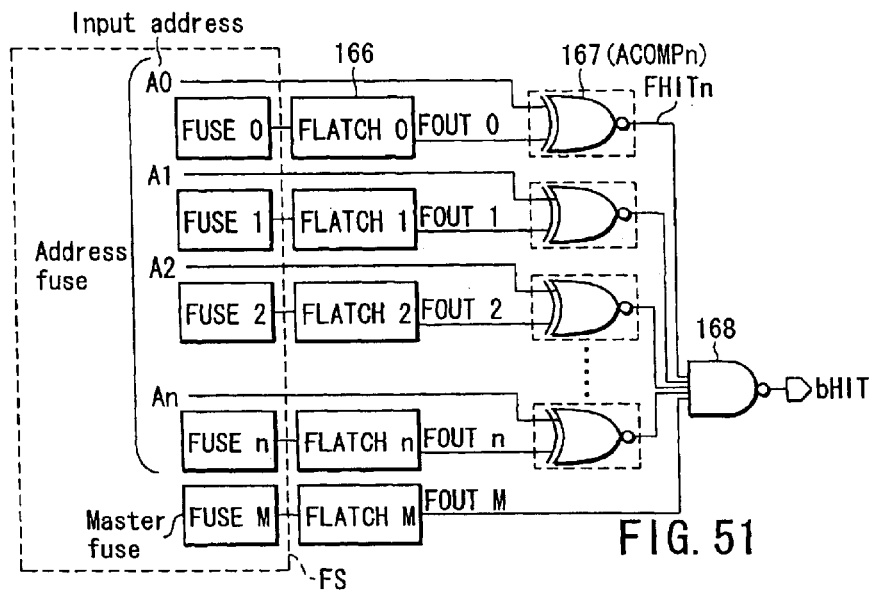
FIG. 51 is a schematic diagram of a redundancy system, for illustrating a semiconductor storage device according to an eighth embodiment of this invention.
Figure 52:
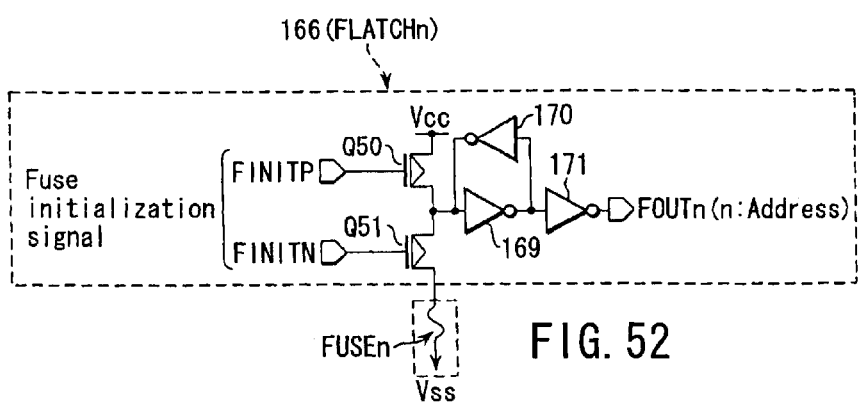
FIG. 52 is a circuit diagram showing an example of the concrete configuration of a fuse latch circuit in the circuit shown in FIG. 51.
Figure 53:
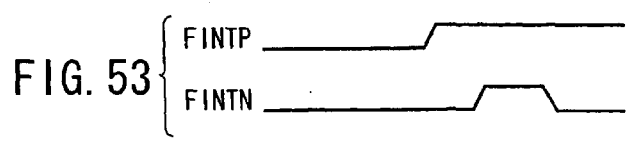
FIG. 53 is a timing chart for illustrating a fuse initialization signal.

FIG. 51 is a schematic diagram of a redundancy system, for illustrating a semiconductor storage device according to an eighth embodiment of this invention. The whole portion of address fuses (FUSEn: n is an address) to program a defective address and a master fuse (FUSEM) to prevent a redundant element from being selected when the redundant element is not used are called a fuse set FS. Each of fuse latch circuits (FLATCHn) 166 in FIG. 51 is a circuit which is configured by a P-channel MOS transistor Q50, N-channel MOS transistor Q51 and inverters 169 to 171 as specifically shown in FIG. 52. In the circuit, an output FOUTn obtained after fuse initialization signals FINITP, FINITN are changed as shown in FIG. 53 is determined according to the fuse state (fuses are blown off or not). After this, each input address An and a corresponding output FOUTn are compared with each other by a corresponding one of address comparators (ACOMPn) 167 to detect coincidence or non-coincidence therebetween for each address. Then, if input addresses and program addresses coincide with each other for all of the addresses and the master fuse is blown off, a hit detector 168 activates a signal bHIT indicating a redundancy mode.

Figure 54:
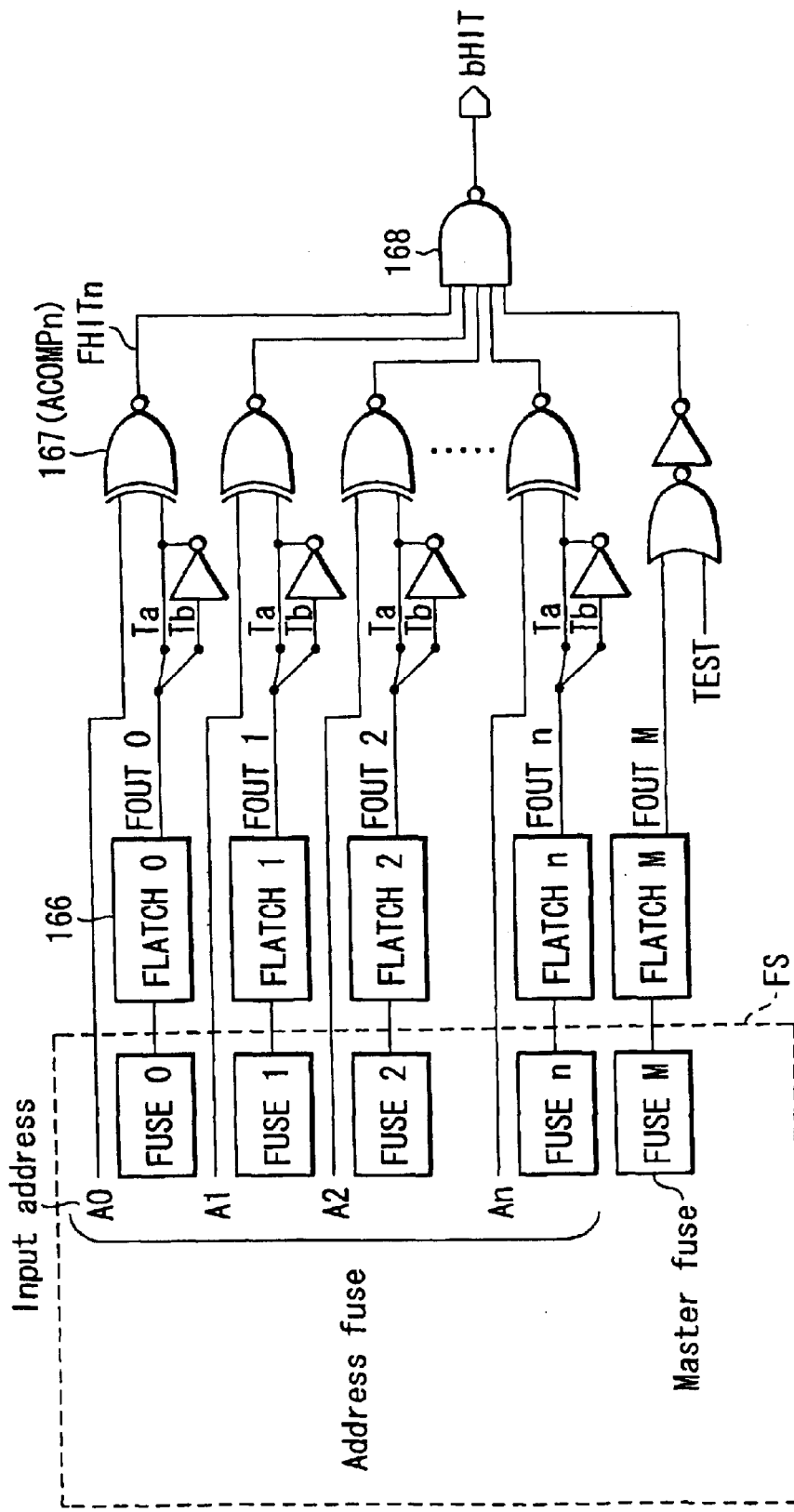
FIG. 54 is a schematic diagram of a redundancy system having redundancy test function of testing whether or not at least one of redundant elements is defective before fuse blow.

FIG. 54 is a schematic diagram of a redundancy system having redundancy test function of testing whether or not at least one of redundant elements is defective before the fuse blow process. The output FOUTn (n: address) of each of fuse latch circuits 166 is selectively connected to an input terminal Ta or Tb of a corresponding one of address comparators 167 according to each fuse set FS. The difference in the above connection makes it possible to change the state of the input address An of each address comparator 167 for each address when a corresponding output FHITn is activated (set to "H") before the fuse blow process. That is, since the output FOUTn after fuse initialization becomes "L" if the fuse latch circuit 166 is configured as shown in FIG. 52, FHITn becomes "H" when the input address An is set at "L" in the state in which FOUTn is connected to the input terminal Ta. On the other hand, if FOUTn is connected to the input terminal Tb, FHITn becomes "H" when the input address An is set at "H". In this case, the ways of connections for all of the address fuses in the fuse set are made unique for each fuse set. At the time of redundancy test, the master fuse is simulatively blown off by setting the test signal to "H" to set up the same state as that in which FOUTM is set at "H". Then, only a specified fuse set is selectively hit to test corresponding redundant element by inputting a corresponding address (pre-programmed address) determined by the way of connections to the input terminals of the address comparators 167.

Next, in a column redundancy system in which a defective column selection line (defective CSL) is set into the disabled state and a spare CSL is activated and used instead of the defective column selection line, the relation between the redundant element and the corresponding repair region is explained by using one example of the system in which a plurality of spare cells selected by the spare CSL are divided into several redundant elements according to an input row address.

The column redundancy system is configured to access a spare cell for redundancy (subject a spare cell to the read/write process by activating a spare CSL) on a row instead of accessing a cell corresponding to a column address (subject a cell of the same column address as a defective cell to the read/write process by activating a normal CSL) on the same row in a case where the column address corresponding to a defect in a memory cell array is input in a state in which a row corresponding to an input row address is accessed in the memory cell array (in a state in which a word line is activated). In the column redundancy system, a plurality of cells containing a defective cell is simultaneously substituted by a plurality of spare cells. In this case, the group of spare cells as a unit for replacement is called a 'redundant element'. The column redundant element contains cells corresponding to a plurality of rows.

If a word line is activated and CSL is activated, the read/write process is performed for a cell designated by the activated word line and activated CSL irrespective of whether the CSL is a normal CSL or space CSL. Assume now that a plurality of word lines are set in a simultaneously activated state and one of the word lines is defective and replaced by performing a column redundancy process. When a column address corresponding to the defect is input and a spare CSL is activated instead of a normal CSL corresponding to the column address to perform the read/write process, the read/write process is performed for a cell corresponding to a spare CSL without performing the read/write process for a cell corresponding to the input column address for another word line which does not contain a defect.

Thus, in a case where cells on the simultaneously activated word lines are replaced by column redundancy, they are replaced all together without fail. Therefore, spare cells corresponding (belonging) to rows (word lines) which are set in the simultaneously activated state and simultaneously subjected to the read/write process belong to the same column redundant element. From the different point of view, there occurs no problem even if spare cells corresponding (belonging) to rows (word lines) which are not simultaneously read/written do not belong to the same column redundant element.

Figure 55:
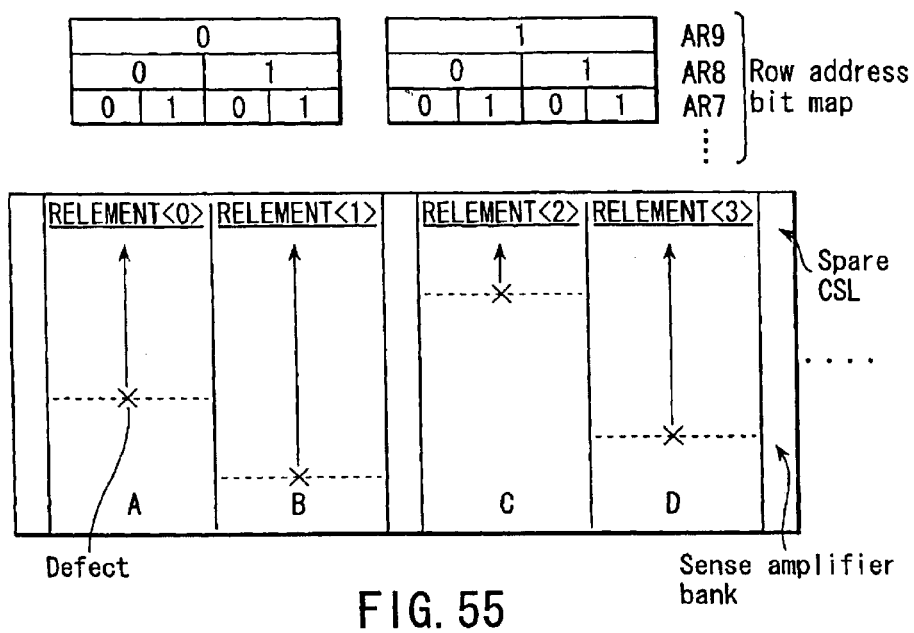
FIG. 55 is a schematic diagram showing two memory blocks which are extracted from the memory cell array and in which each sense amplifier is commonly utilized by bit line pairs in adjacent memory blocks.

FIG. 55 shows two memory blocks which are extracted from the memory cell array and in which each sense amplifier is commonly utilized by bit line pairs in the two adjacent memory blocks. Assume that the two memory blocks are divided into four regions A, B, C, D determined by row addresses AR8, AR9, for example. If a row address is input and only one word line is activated in the two memory blocks, the word line to be activated lies in one of the regions A, B, C, D. Since spare cells corresponding (belonging) to rows (word lines) which are not simultaneously read/written do not necessarily belong to the same column redundant element, a plurality of spare cells selected by the spare CSL are divided into four portions by use of the row addresses AR8, AR9 and the respective sets of spare cells can be used as column redundant elements. As a result, a plurality of spare cells selected by one spare CSL is configured by four redundant elements RELEMENT<0:3> determined by the addresses AR8, AR9. Therefore, the column redundancy system is a redundancy system with high area efficiency since the number of redundant elements can be increased without increasing the number of spare columns (spare cells) (without increasing the number of spare CSLs).

If the fuse sets are provided to respectively correspond to the spare elements RELEMENT<0:3>, each of the redundant elements of RELEMENT<0:3> can be programmed to replace different addresses. If addresses of all CSLs in the two memory blocks can be programmed in the respective fuse sets, RELEMENT<0:3> can be used to replace all of defective cells respectively in the regions A, B, C, D. A region in which any element in the region can be replaced by a redundant element which can be programmed by use of the fuse set is called a repair region for the fuse set (in this case, it is not necessary to fixedly set the correspondence relation between the fuse sets and the redundant elements). That is, the repair regions corresponding to the respective fuse sets of RELEMENT<0:3> are the regions A, B, C, D.

In the memory blocks shown in FIG. 55, bit line pairs extending in the same direction as CSLs in the memory block surrounded by sense amplifier regions (sense amplifier banks) are alternately connected to sense amplifiers on the right and left sides for each bit line pair (not shown). Therefore, since four column repair regions are set in the two memory blocks by use of the row addresses AR8, AR9, a plurality of memory cells connected to one bit line pair are classified into the two repair regions. That is, the repair regions are set so as to divide the bit line.

Since spare cells corresponding to the rows (word lines) which are simultaneously read/written belong to the identical redundant element, the rows (word lines) which are set in the simultaneously activated state and simultaneously read/written must be present in the identical repair region. On the other hand, since different defective column addresses may be programmed into fuse sets corresponding to the column redundant elements in different repair regions, data cannot be simultaneously read/written with respect to word lines belonging to the different repair regions. That is, the operation for inputting a defective column address and replacing the defective element by a redundant element in a certain column repair region is incompatible with the operation for selecting a normal element when the input address is not a defective column address in another repair region. This is because an actual replacement operation is performed by replacing a normal CSL extending across a plurality of repair regions over the entire memory cell array by a spare CSL and elements belonging to CSLs or spare CSLs which are different for each repair region cannot be simultaneously accessed.

Figure 56:
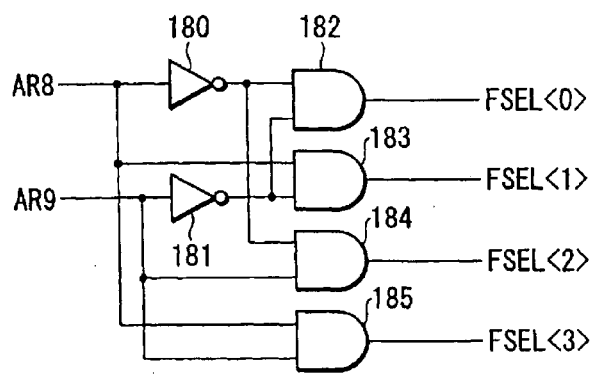
FIG. 56 is a circuit diagram showing an example of the configuration of a fuse set selection signal generating circuit.
Figure 57:
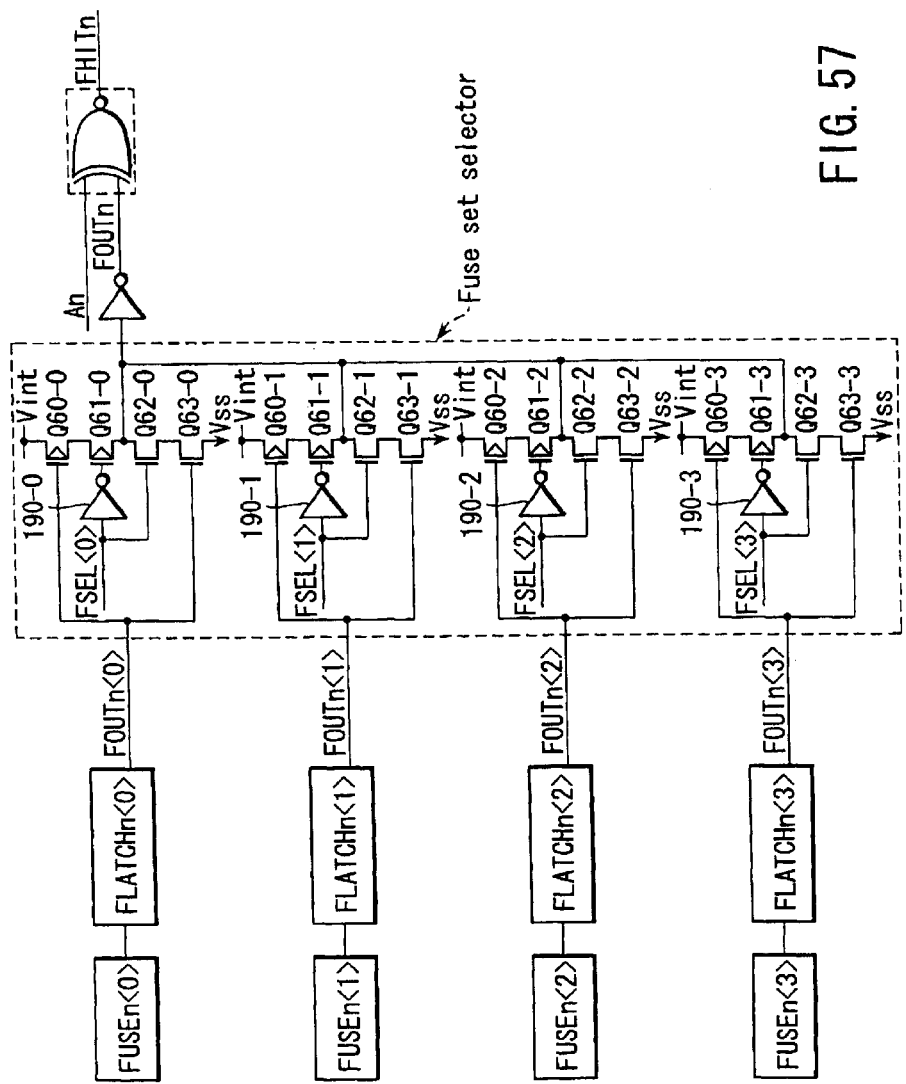
FIG. 57 is a circuit diagram showing an example of the configuration of a fuse set selection circuit.

In the actual control operation, a fuse set which corresponds to a redundant element in the column repair region in which a least one word line is activated and may be hit is selected in advance (before the column address is input) by use of outputs FSEL<0:3> of a fuse set selection signal generation circuit shown in FIG. 56 and a circuit connected in the latter stage of the address comparators 167 is commonly used by a plurality of fuse sets by use of a fuse set selection circuit shown in FIG. 57.

The fuse set selection signal generation circuit shown in FIG. 56 is configured by inverters 180, 181 and AND gates 182 to 185. A signal AR8 is supplied to the input terminal of the inverter 180 and one-side input terminals of the AND gates 183, 185. A signal AR9 is supplied to the input terminal of the inverter 181, one input terminal of the AND gate 184 and the other input terminal of the AND gate 185. An output signal of the inverter 180 is supplied to one input terminal of the AND gate 182 and the other input terminal of the AND gate 184. An output signal of the inverter 181 is supplied to the other input terminal of the AND gate 182 and the other input terminal of the AND gate 183. Then, fuse selection signals FSEL<0> to FSEL<3> are output from the output terminals of the AND gates 182 to 185.

The fuse set selection circuit shown in FIG. 57 is configured by inverters 190-0 to 190-3, P-channel MOS transistors Q60-0 to Q60-3, Q61-0 to Q61-3 and N-channel MOS transistors Q62-0 to Q62-3, Q63-0 to Q63-3.

The current paths of the MOS transistors Q60-0, Q61-0, Q62-0, Q63-0 in the circuit section corresponding to a fuse latch circuit FLATCHn<0> are serially connected between an internal power supply Vint and a ground node Vss. An output FOUTn<0> of the fuse latch circuit (FLATCHn<0>) is supplied to the gates of the MOS transistors Q60-0, Q63-0. The fuse set selection signal FSEL<0> is supplied to the gate of the MOS transistor Q62-0. Further, the fuse set selection signal FSEL<0> is supplied to the gate of the MOS transistor Q61-0 via the inverter 190-0.

Circuit sections corresponding to fuse latch circuits FLATCHn<1> to FLATCHn<3> are formed with the same configuration as the circuit section corresponding to the fuse latch circuit FLATCHn<0>.

Figure 58:
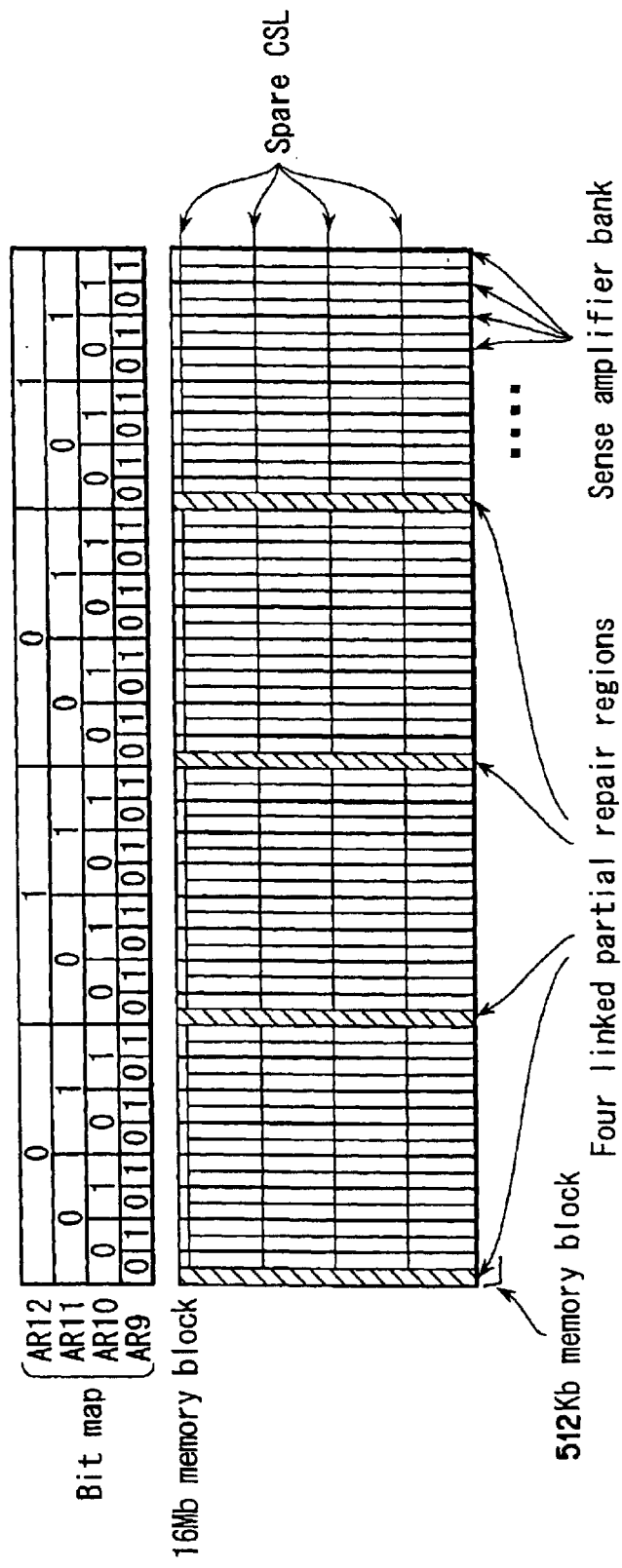
FIG. 58 is a schematic diagram for illustrating a method for determining repair regions in the semiconductor storage device according to the eighth embodiment.

Next, a method for defining the repair regions is explained with reference to FIGS. 55 and 58. In this case, assume that a 16-Mbit memory cell array is used and the memory cell array is configured by 32 512-kbit memory blocks. Bit line pairs in adjacent memory blocks commonly utilize sense amplifiers which are repeatedly arranged in sense amplifier bank lying on the boundaries between the memory blocks. Further, a bit map (AR9 to AR12) of upper row addresses of the memory cell array is assigned as shown in FIG. 58, 16k word lines selectively designated by the row addresses AR0 to AR12 are present and four spare CSLs for redundancy replacement are provided. Since only the row addresses up to the row address AR12 are used for the 16k word lines, two word lines are simultaneously activated in the memory cell array in the normal operation.

The method for setting redundancy repair regions by use of row addresses is performed according to the following procedure. If a column redundancy system having a repair efficiency of four redundant elements for each 1-Mbit repair region is required based on prediction of the distribution of defects in the memory cell array, the whole portion of the 16-Mbit memory cell array is divided into 16 repair regions <0:15> by use of four row address bits ($2^4 = 16$). The scale of the whole portion of one repair region is 1 Mbit.

If it is required to simultaneously read/write independent data items with respect to cells on four word lines by simultaneously activating the four word lines (for example, simultaneously activating the four word lines by bypassing information of AR12) in a special operation mode such as the test mode and activating CSL, the four word lines which are simultaneously activated must lie in the identical column repair region. Further, the simultaneously activated four word lines cannot be activated in the identical memory block in order to prevent occurrence of data destruction and they cannot be activated in the adjacent blocks in which the bit line pairs in the memory blocks commonly utilize the sense amplifier.

In practice, the number of word lines which can be used to simultaneously read/write independent data items in the memory cell array is determined by the data line configuration in the memory cell array. This is explained by taking the hierarchical data line configuration shown in FIG. 59 as an example. The hierarchical data line configuration is described in U.S. Pat. No. 5,546,349 and IEEE JOURNAL OF SOLID-STATE CIRCUITS, VOL.31, NO.4, APRIL 1996, pp.567–574, "A 286 mm² 256 Mb DRAM with X32 Both-Ends DQ", Watanabe et al., the entire contents of these references being incorporated herein by reference. A total of 16 pairs of master DQ line pairs (MDQP: Master DQ Pair) of MDQPa<0:3>, MDQPb<0:3>, MDQPc<0:3>, MDQPd<0:3> which are used to read/write data are provided on the memory cell array. Therefore, 16-bit independent data can be read/written by use of the whole array portion. MDQPs are connected to corresponding local DQ line pairs (not shown) extending in the sense amplifier banks via MDQ switches in the sense amplifier banks indicated by dots in the drawing. Assume now that a word line is activated in the 512-kbit memory block on the leftmost side in the region "a" which is ¼ of the whole portion of the memory cell array. Then, the sense amplifier banks on both sides of the memory block are activated to amplify data items on the word lines. If CSL is activated at this time, data of four bits on the four bit line pairs is transmitted to LDQ line pairs two (two bits) of which extend in each of the sense amplifier banks on both sides of the memory block and then transmitted to MDQPa<0:3> via the MDQP switches.

Since the read/write operation for all of the memory blocks in the region "a" is performed by use of the same MDQPa<0:3>, independent (different) data items cannot be read/written with respect to a plurality of word lines even if the plurality of word lines are activated in the region "a". Therefore, the number of word lines used to simultaneously read/write independent data in the region "a" is one. If the idea is applied to the other regions, the number of word lines used to simultaneously read/write independent data in the whole portion of the memory cell array is four.

Since only data lines of the least sufficient number are arranged on the memory cell array, it is required to correctly and simultaneously read/write independent data with respect to cells on the four word lines even when the column redundancy replacement process is performed if the data line configuration which permits independent data to be simultaneously read/written with respect to cells on the four word lines is used.

FIG. 58 shows a repair region which satisfies the above condition, a 1-Mbit repair region is configured by four linked 256-kbit partial repair regions and the repair region is set so as to divide one bit line into two portions. That is, all of the spare cells are divided by use of column repair region setting row addresses AR11, AR10, AR9, AR8 and the divided spare cell portions are used as column redundant elements. In other words, a cell designated by a different combination of the column repair region setting row addresses AR11, AR10, AR9, AR8 belongs to a different repair region. Each of the redundant elements for the respective repair regions is configured by four partial redundant elements which belong to the identical spare CSL in each of the four partial repair regions configuring the repair region. The four linked partial redundant elements configuring one redundant element can be simultaneously substituted for four partial normal elements (which belong to the same CSL and have the same column address) configuring a normal element containing a defect.

Thus, the method for selecting the column repair region setting row addresses in the eighth embodiment is to sequentially assign addresses as the repair region setting row addresses in order from the upper address in a condition that word lines which are simultaneously activated in the memory cell array and determined by the data line configuration and can be used to read/write independent data belong to the same repair region. That is, since four word lines which are simultaneously activated by bypassing information of AR12 lie in the same repair region, AR12 is omitted from the column repair region setting row addresses and the other addresses AR1, AR10, AR9, AR8 are sequentially assigned in order from the upper address as column repair region setting row addresses.

The reason why the addresses are sequentially selected from the upper address is to prevent the partial repair regions linked to configure one repair region from being divided into more minute regions than necessary. For example, in the example of FIGS. 55 and 58, cells on one bit line pair are divided into two different repair regions at the center of the memory block by the row address AR8. For example, if a middle scale defect occurs on a specified bit line pair to extend over the boundary between the above two repair regions (for example, a cluster-like defect), two redundant elements one from each repair region are necessary in order to repair (compensate for) the defect. Since the number of boundaries between the repair regions on one bit line pair is increased if lower addresses which are equal to or lower than AR7 are used as the column repair region setting row addresses, the probability that a middle scale defect occurs to extend over the boundary between the repair regions and two redundant elements are required becomes high. This is generalized as follows. That is, unless the column repair region setting row addresses are sequentially assigned in order from the upper address, each repair region is divided into unnecessarily minute partial repair regions and the probability that a defect which extends over the repair regions occurs becomes high and the repair efficiency and the repair efficiency of the whole portion of the memory cell array is lowered to some extent. By taking the above condition into consideration, the addresses are sequentially assigned in order from the upper address as the column repair region setting row addresses.

Ninth Embodiment

Next, a semiconductor storage device according to a ninth embodiment of this invention is explained. The method for setting the repair regions for column redundancy according to the eighth embodiment imposes a limitation on the stacked-word-line test mode (Multiple WL Test Mode). That is, in the stacked-word-line test mode, a large number of word lines into which data is previously programmed are sequentially activated over several cycles and this is attained by sequentially incrementing the upper address (stack address) in each cycle. In the above example, selection of AR8 as the stack address means that two word lines connected to the same bit line via cell transistors are sequentially activated (although they can be simultaneously activated, if possible). In practice, one word line which is selected from one half section of the 512-kbit memory block and another word line which is selected from the other half section are activated.

Figure 60:
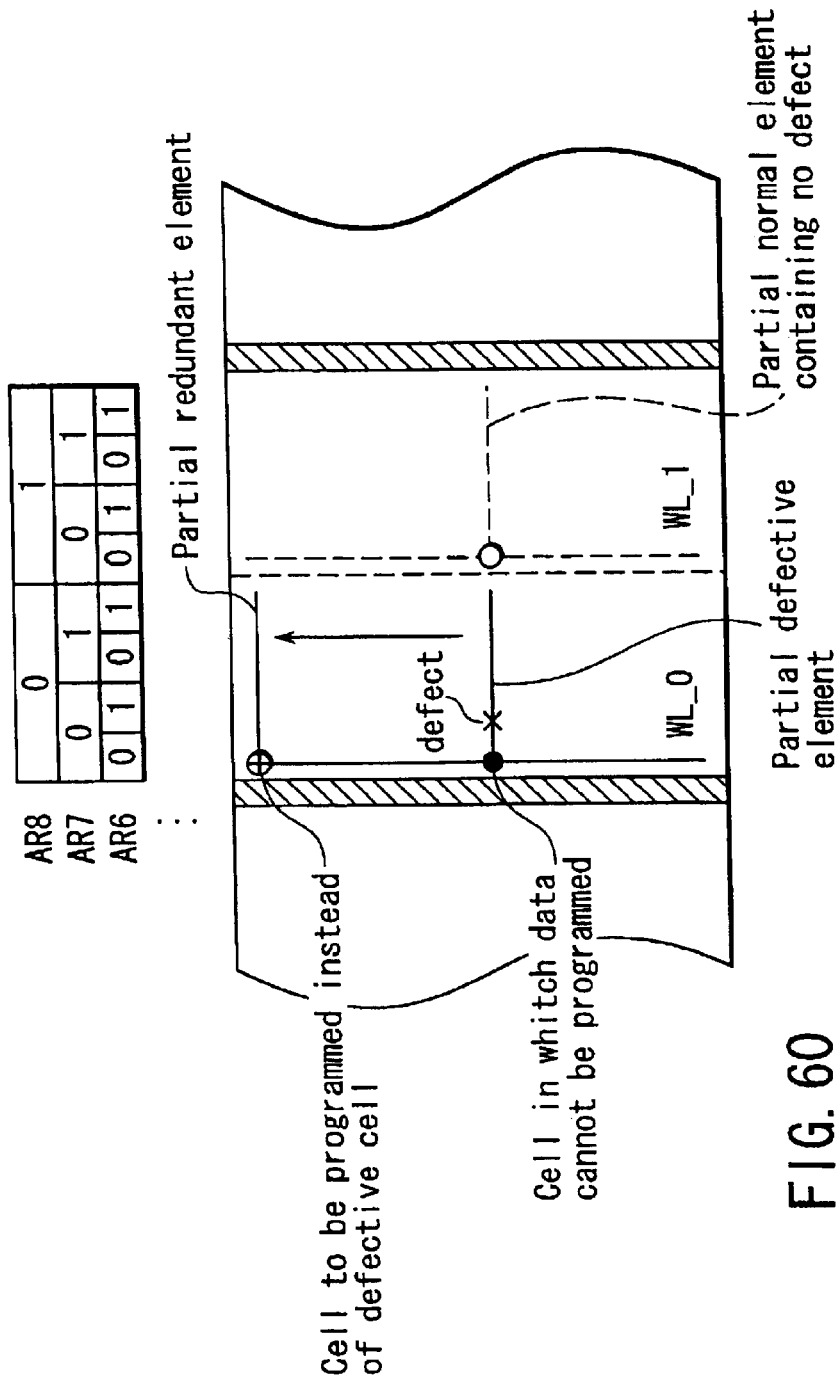
FIG. 60 is a schematic diagram for illustrating data destruction by an unsteady-state cell on the word line which is first activated.

Since collision of data will occur on each bit line pair if data items previously programmed into cells on the two word lines have opposite polarities, an attempt is made to program the same data into two cells connected to the same bit line pair via cell transistors on the stacked two word lines. However, as is clearly seen from FIG. 60, a cell (the column address of which is an address of a partial defective element containing a defect) which is replaced by a partial redundant element in the partial repair region containing a first activated word line WL_0 and into which no data is programmed is present on the word line WL_0 in some cases. Since the cell data is indeterminate, the resultant data amplified (restored) by a sense amplifier after the word line WL_0 is activated and data is read out from the cell onto the bit line pair is also indeterminate. Therefore, if the polarity of the data restored on this bit line pair and the polarity of data programmed in a word line WL_1 next accessed on the identical bit line pair are different from each other, there occurs a possibility that data programmed in the word line WL_1 will be destroyed by opposite data already restored on the bit line pair when the word line WL_1 is next activated. The state occurs when a partial normal element lying in the partial repair region to which the word line WL_1 belongs and having the same column address as a partial defective element replaced by a partial redundant element in the partial repair region to which the word line WL_0 belongs is normal and is not replaced by a partial redundant element in the repair region.

Therefore, in the ninth embodiment, for example, in the stacked-word-line test mode, in a column redundancy system which sets repair regions of column redundancy according to row addresses in a system in which a plurality of word lines connected to the same bit line pair via cell transistors can be activated together, the repair regions are so set that the plurality of word lines activated together will belong to the same repair region when the repair regions are set to divide the bit line.

That is, word lines stacked in the same memory block can be set to belong to the same repair region by changing the column repair region setting row address from AR8 in the eighth embodiment to AR7.

Figure 61:
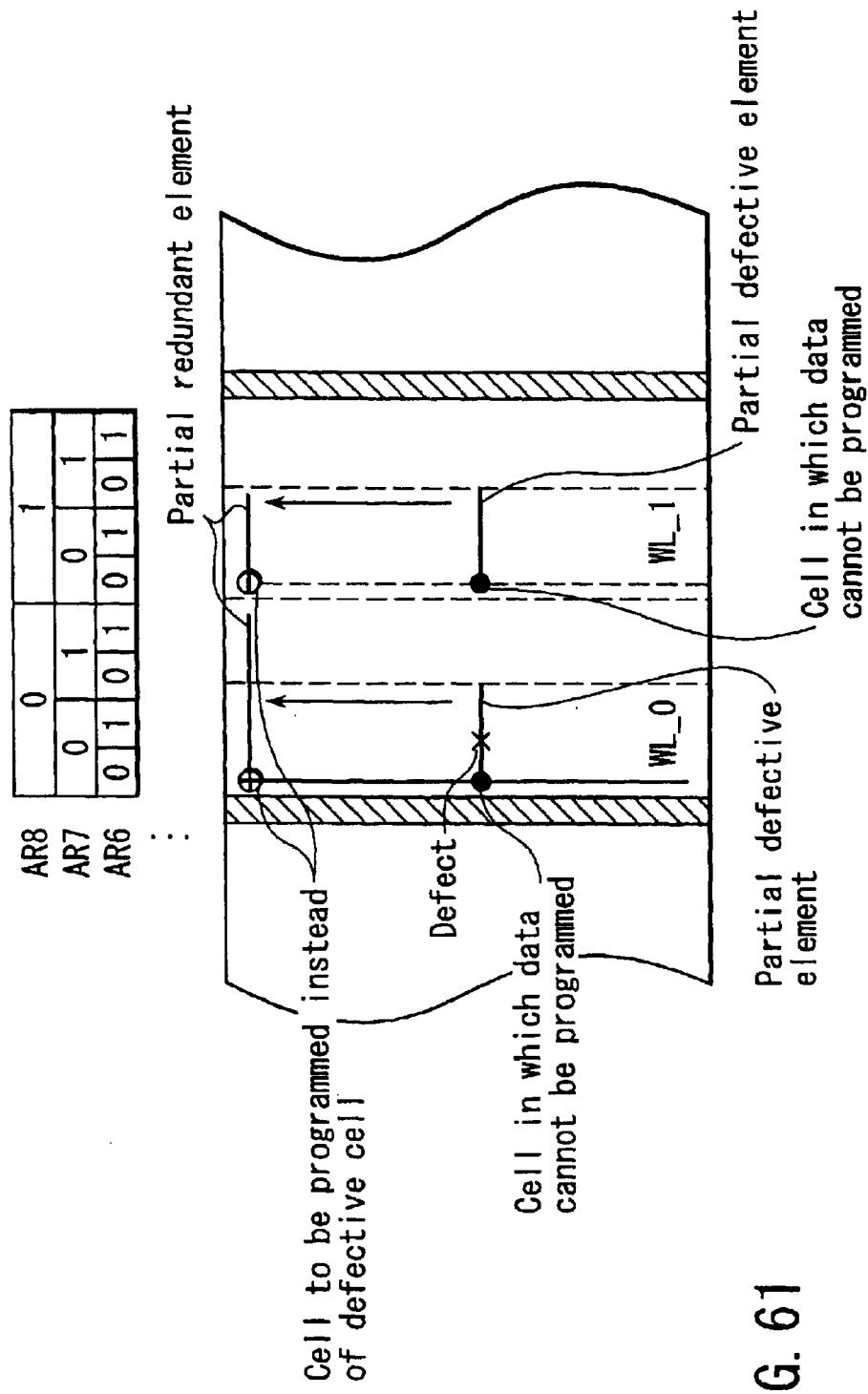
FIG. 61 is a schematic diagram for illustrating a semiconductor storage device according to a ninth embodiment of this invention.

Thus, as shown in FIG. 61, a cell belonging to the word line WL_1 which is secondly activated by incrementing the stack address AR8 and lying on the same bit line pair on which a cell belonging to the first activated word line WL_0, replaced by a partial redundant element and having no data programmed therein lies is also replaced at this time by another linked partial redundant element and has no data programmed therein. Therefore, data destruction by an indeterminate cell on the first activated word line will not occur.

In the ninth embodiment, the repair regions are set according to a plurality of word lines stacked in the same memory block. As is already described, stacked addresses cannot be freely determined due to the restriction on the system (layout), but the column repair region setting row address can be freely changed. This is because the change can be made simply by changing a row address input to the fuse set selection circuit as shown in FIG. 56.

Thus, according to the ninth embodiment, even when the repair regions are set to divide the bit line, two word lines connected to the same bit line pair can be sequentially (or simultaneously) activated together.

Tenth Embodiment

A semiconductor storage device according to a tenth embodiment of this invention is associated with a column redundancy system which sets repair regions of column redundancy according to row addresses in a system in which a plurality of word lines connected to the same bit line pair via cell transistors can be activated together. The semiconductor storage device is so configured that the repair regions may be set to suppress the number of linked partial repair regions which configure one repair region to minimum in a case where the repair region are so set that a plurality of word lines activated together will belong to the same repair region when the repair regions are set to divide the bit line.

In the ninth embodiment, in a column redundancy system which sets repair regions of column redundancy according to row addresses in a system in which a plurality of word lines connected to the same bit line pair via cell transistors can be activated together, the address AR7 is used as the repair region setting row address without using AR8 so that a plurality of word lines activated together will belong to the same repair region when the repair regions are set to divide the bit line. As a result, the width of each of the linked partial repair regions (or each of linked partial redundant elements) will be ¼ or less times that of the bit line as shown in FIG. 61.

However, if an address which is in the lower order than the address AR7 is selected as another repair region setting row address, the following problems (4), (5) will occur.

(4) Since the number of boundaries between the repair regions on one bit line increases, the probability that a defect which extends over repair regions and requires two elements for repair occurs becomes high.

(5) Since cells on one bit line are distributed in four or more repair regions, four or more elements are required for a repairing process of the column failure in which the whole portion of the column (bit line pair) must be replaced.

In order to solve the above problems by use of an example of the bit map shown in FIG. 58 in which the whole portion of the memory cell array is divided into 16 repair regions according to column repair region setting row addresses of four bits, column repair region setting row addresses of three bits other than AR7 may be selected from AR12, AR11, AR10, AR9.

In a case where the address AR7 is used as the repair region setting row address without using AR8 so that a plurality of word lines activated together will belong to the same repair region when the repair regions are set to divide the bit line, the width of each partial repair region will be ¼ or less times that of the bit line, and therefore, the number of linked partial repair regions configuring one repair region becomes eight or more in this example. This is because the whole portion of the memory cell array is divided into 16 repair regions and the whole portion of one repair region has a width of two memory blocks or two bit lines in total. That is, in the tenth embodiment, the width of the partial repair region is set to ¼ times that of the bit line and the number of linked partial repair regions configuring one repair region is set to eight. This is generalized as follows. That is, in a case where the repair regions are so set that a plurality of word lines activated together will belong to the same repair region when the repair regions are set to divide a bit line in a system in which a plurality of word lines connected to the same bit line pair via cell transistors can be activated together, the repair region setting row address is selected so as to suppress the number of linked partial repair regions configuring one repair region to minimum.

As a result, the repair region can be prevented from being divided into partial repair regions more minutely than necessary, the probability of occurrence of a defect which extends over the repair regions is lowered, the number of redundant elements required for repairing the column failure/fail is suppressed to minimum, and as a result, a redundancy system with high repair efficiency can be configured.

Eleventh Embodiment

A semiconductor storage device according to an eleventh embodiment of this invention is configured to set repair regions so that word lines activated together in the memory cell array, from and to which independent data can be read and written based on the data line configuration, will belong to the same repair region when a repair region setting row address is selected in the eighth or ninth embodiment.

When column repair region setting row addresses of three bits other than AR7 are selected from AR12, AR11, AR10, AR9 in the example of the tenth embodiment, AR1, AR10, AR9 are selected. In the data line configuration shown in FIG. 59, independent data items can be simultaneously read/written with respect to four word lines in total one selected from each of regions "a", "b", "c", "d". Since activation of four word lines can be attained by bypassing AR12 information, for example, AR12 is omitted from the column repair region setting row addresses.

As described so far, the assigning/to assigning the repair region setting row addresses so that word lines activated together in the memory cell array, from and to which independent data can be read and written based on the data line configuration will belong to the same repair region is to make maximum the number of word lines used for simultaneously reading/writing independent data even when the column redundancy replacement is performed. Therefore, in the eleventh embodiment, an effect that the number of independent data items which can be simultaneously read/written in one memory cell array becomes maximum and a memory cell array configuration with high data transfer rate can be attained can be obtained in addition to the effects of the eighth and tenth embodiments.

Twelfth Embodiment

A semiconductor storage device according to a twelfth embodiment of this invention is associated with a column redundancy system which sets repair regions of column redundancy according to row addresses and configured to set the repair regions so as to make maximum the number of word lines which can be activated together in one of the repair regions in a stacked-word-line test mode under a condition that the scale of the column repair region (determined by the defect distribution in the array) is constant and the lower limit of the scale of each of partial repair regions linked to configure one column repair region is determined, that is, under a condition that the scale of each of the linked partial repair regions is constant or larger than the constant scale.

When taking replacement by row redundancy into consideration, the maximum number of word lines which can be activated together in the memory cell array in the stacked-word-line test mode has a limitation depending on the system and an unlimitedly large number of word lines cannot be activated. Assume now a system as an example in which two word lines are selected from each of every two 512-kbit memory blocks and 32 word lines in total can be activated together in the stacked-word-line test mode in the memory cell array shown in FIG. 58. This means that AR12, AR11, AR10, AR8 are selected as stack addresses, and as a result, it is possible to consider that information items of AR12, AR11, AR10, AR8 are bypassed to select 32 word lines.

Next, assuming that four redundant elements are required for the repair region of 2 Mbits based on the defect distribution in the memory cell array, then the whole portion of the memory cell array may be divided into eight column repair regions by use of column repair region setting row addresses of three bits since four spare CSLs are provided in the memory cell array.

Further, it is assumed that the scale of the partial repair region is prevented from becoming smaller than ¼ times that of the memory block in order to prevent one partial repair region from becoming excessively small. This means that addresses which are lower than AR7 are not selected as the column repair region setting row addresses. That is, the column repair region setting row addresses of three bits are selected from AR12, AR11, AR10, AR9, AR8, AR7.

Specifically, in the twelfth embodiment, an attempt is made to avoid, as far as possible, selection of row addresses whose information is bypassed in order to activate the maximum number of word lines (determined depending on the system) in the stacked-word-line test mode when the column repair region setting row addresses are selected. That is, when three bits are selected from the candidates AR12, AR11, AR10, AR9, AR8, AR7 of the column repair region setting row addresses, two bits of AR9, AR7 and one bit from AR12, AR11, AR10, AR8 are selected in order to avoid selection of the stack addresses AR12, AR11, AR10, AR8 as far as possible.

If the number of bits of an address which is contained in the row addresses whose information items are bypassed in order to activate the maximum number of word lines in the stacked-word-line test mode and is also used as an column repair region setting row address is n, the number of repair regions to which a maximum number of activated word lines belong becomes $2^n$. Therefore, since 32 word lines are distributed into $2^n$ (n=1) repair regions, the number of word lines which can be activated together in the same repair region is 16.

With the above configuration, since the number of word lines which can be activated together in the same repair region becomes maximum and the number of word lines which can be used for simultaneously writing data in the stacked-word-line test mode becomes maximum, test time can be reduced.

Figure 59:
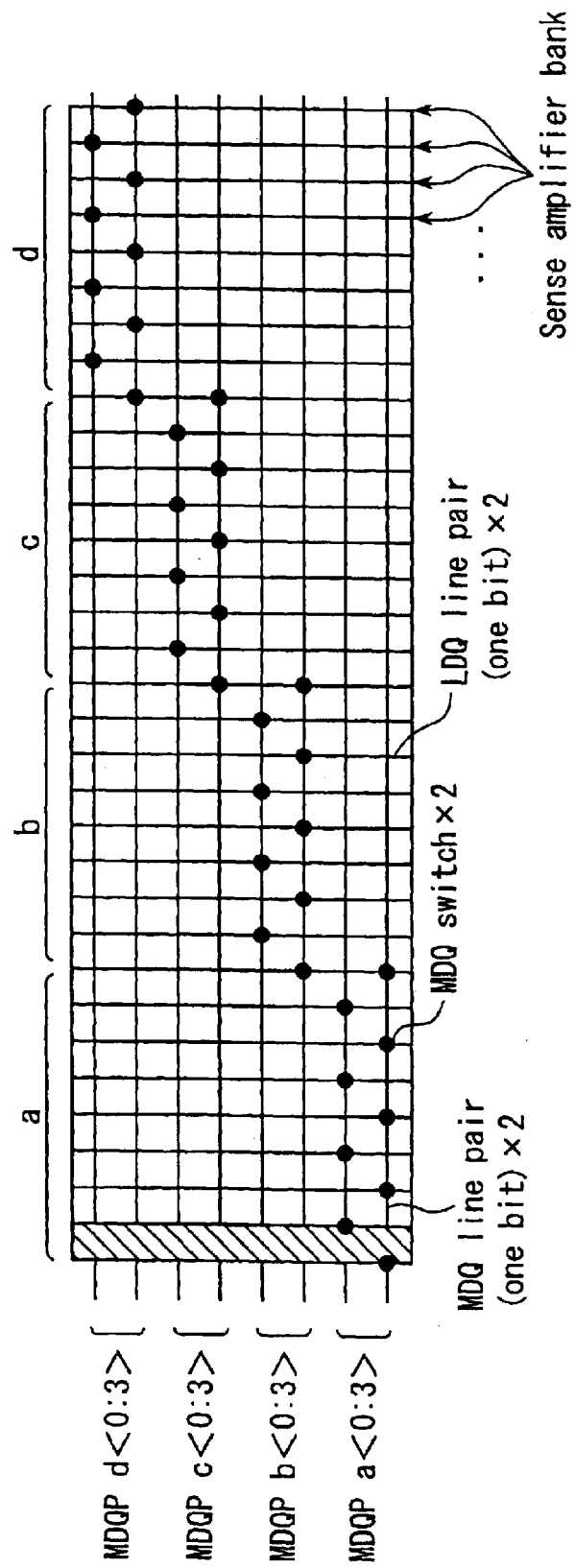
FIG. 59 is a schematic diagram for illustrating the number of word lines for which independent data items can be simultaneously read/written in the memory cell array in a hierarchical data line configuration.

It should be noted here that data can be simultaneously written into a plurality of word lines activated together in the same repair region in the stacked-word-line test mode, but independent data items (respectively different data items) cannot be necessarily written. This is because word lines into which independent data items can be simultaneously written are four word lines which are respectively selected one at a time from each of the regions "a", "b", "c", "d" in the data line configuration as shown in FIG. 59. Therefore, when a plurality of word lines are selected in each of the regions "a", "b", "c", "d", the same data is written in the same region.

Thirteenth Embodiment

A semiconductor storage device according to a thirteenth embodiment of this invention is configured to determine repair regions so that word lines which can be activated together in the memory cell array and used for reading/writing independent data based (depending) on the data line configuration will belong to the same repair region when the repair regions are set as in the twelfth embodiment.

More specifically, in the data line configuration shown in FIG. 59, word lines which can be activated together in the memory cell array and used for reading/writing independent data items based (depending) on the data line configuration are selected one at a time from each of the regions "a", "b", "c", "d" and are four word lines selected by bypassing AR12 information, for example. Therefore, the four word lines will belong to the same repair region by omitting AR12 from the column repair region setting row addresses and it becomes possible to read/write independent data items. Thus, in the thirteenth embodiment, the column repair region setting row addresses are obtained by selecting two bits of AR9, AR7 and one bit from AR11, AR10, AR8 when taking the twelfth embodiment into consideration.

Therefore, in the thirteenth embodiment, the number of word lines with respect to which independent data items can be simultaneously read/written can be set to maximum and test time can be reduced in addition to the effect of the twelfth embodiment.

Fourteenth Embodiment

A semiconductor storage device according to a fourteenth embodiment of this invention is associated with a column redundancy system which sets repair regions of column redundancy according to row addresses and is configured to set the repair regions so that the number of word lines activated together in the repair region in the stacked-word-line test mode will become maximum in a condition that the scale of each of column repair regions determined by the distribution of defects in the array is constant and the upper limit of the number of repair regions dividing one bit line is determined, that is, under a condition that the number of repair regions dividing one bit line is constant or less than the constant when the repair regions are set to divide the bit line.

A semiconductor storage device according to a fourteenth embodiment of this invention is associated with a column redundancy system which sets repair regions of column redundancy according to row addresses and configured to set the repair regions so as to make maximum the number of word lines which can be activated together in one of the repair regions in a stackedword-line test mode under a condition that the scale of the column repair region (determined by the defect distribution in the array) is constant and the upper limit of the scale of each of partial repair regions linked to configure one column repair region is determined, that is, under a condition that the upper limit of the number of repair regions dividing one bit line is determined when the repair regions are set to divide the bit line.

Like the twelfth embodiment, assume a system as an example in which two word lines are selected from each of every two 512-kbit memory blocks and 32 word lines in total can be activated together in the whole portion of the array in the stacked-word-line test mode. Further, assuming that four redundant elements are required for the repair region of 2 Mbits based on the defect distribution in the memory cell array, the whole portion of the memory cell array may be divided into eight column repair regions by use of column repair region setting row addresses of three bits. In addition, assume that the number of repair regions which divide one bit line will not become larger than 2 in order to prevent the number of redundant elements necessary for repairing one column failure from becoming excessively large.

Since the number of word lines which can be activated together in the repair region in the stacked-word-line test mode can be set to maximum if selection of row addresses whose information items are bypassed in order to activate the maximum number of word lines (determined depending on the system) in the stacked-word-line test mode is avoided as far as possible when column repair region setting row addresses are selected, two bits among three bits are AR9, AR7. If another bit other than AR7 is selected from the lower addresses which are equal to or lower than AR8, the bit line will be divided into four or more repair regions and therefore this is not allowed. Accordingly, the other bit is selected from AR12, AR11, AR10.

In the fourteenth embodiment, the number of word lines simultaneously read/written becomes maximum in the stacked-word-line test mode and test time can be reduced.

Fifteenth Embodiment

A semiconductor storage device according to a fifteenth embodiment of this invention is configured to determine repair regions so that word lines which can be activated together in the memory cell array and used for reading/writing independent data based (depending) on the data line configuration will belong to the same repair region when the repair regions are set like the case of the fourteenth embodiment.

Specifically, in the data line configuration shown in FIG. 59, word lines which can be activated together in the memory cell array and used for reading/writing independent data based (depending) on the data line configuration are four word lines each selected from a corresponding one of regions "a", "b", "c", "d" by, for example, bypassing AR12 information. Therefore, four word lines will belong to the same repair region if AR12 is omitted from column repair region setting row addresses and independent data can be read/written. Thus, by taking the present embodiment into consideration together with the fourteenth embodiment, two bits of AR9, AR7 are selected from the column repair region setting row addresses and one bit is selected from AR11, AR10.

As a result, in addition to the effect attained in the fourteenth embodiment, it becomes possible to set the number of word lines which can be used for simultaneously reading/writing independent data to maximum and reduce test time.

Sixteenth Embodiment

A semiconductor storage device according to a sixteenth embodiment of this invention can be attained by combining the techniques of the twelfth and fourteenth embodiments. The semiconductor storage device is associated with a column redundancy system which sets repair regions of column redundancy according to row addresses and configured to set the repair regions so that the number of word lines which can be activated together in the repair region in the stacked-word-line test mode will become maximum in a condition that the scale of each of column repair regions (determined by the distribution of defects in the array) is constant, the scale of each of partial repair regions linked to configure each column repair region is constant or larger than the constant scale and the number of repair regions which divide one bit line is constant or smaller than the constant number.

In the sixteenth embodiment, it is possible to attain the effect which is the same as the effect of the twelfth and fourteenth embodiments that the number of word lines which can be used for simultaneously writing data in the stacked-word-line test mode becomes maximum and test time can be reduced.

Seventeenth Embodiment

A semiconductor storage device according to a seventeenth embodiment of this invention is configured to determine repair regions so that word lines which can be activated together in the memory cell array and used for reading/writing independent data based (depending) on the data line configuration belong to the same repair region when the repair regions are set like the case of the sixteenth embodiment.

Therefore, in addition to the effect of the sixteenth embodiment, it is possible to attain the effect that the number of word lines which can be used for simultaneously reading/writing independent data can be set to maximum and test time can be reduced.

Eighteenth Embodiment

A semiconductor storage device according to an eighteenth embodiment of this invention is associated with a column redundancy system which sets repair regions of column redundancy according to row addresses and configured to set the repair regions so that all of the word lines that can be activated together in the stacked-word-line test mode may belong to the same repair region.

With reference to the examples explained so far, repair region setting row addresses are determined by avoiding selection of stack addresses AR12, AR11, AR10, AR8. As a result, it is possible to attain the effect that the number of word lines which can be used for simultaneously writing data in the stacked-word-line test mode can be set to maximum and test time can be reduced.

Nineteenth Embodiment

In a semiconductor storage device according to a nineteenth embodiment of this invention, addresses are assigned in order from the highest possible address as repair region setting row addresses when repair regions are set as in the eighteenth embodiment.

With the above configuration, in addition to the effect of the eighteenth embodiment, it is possible to avoid the situation that each repair region is divided into unnecessarily minute partial repair regions, and to suppress the possibility that the probability the probability of occurrence of a defect which extends over the repair regions becomes high and the repair efficiency of the whole memory cell array is lowered to some extent. Further, since the number of redundant elements required for repairing a column failure can be suppressed to minimum when the repair regions are set to divide the bit line, a redundancy system with high repair efficiency can be configured.

Twentieth Embodiment

A semiconductor storage device according to a twentieth embodiment of this invention is associated with a column redundancy system which sets repair regions of column redundancy according to row addresses and has function of setting only spare word lines into a disable state in the stacked-word-line test mode in a system in which only defective word lines are set into a non-selected state when a plurality of word lines which are to be activated together in the stacked-word-line test mode are defective, a plurality of spare word lines can be selected instead of the defective word lines and the plurality of spare word lines used for replacement can be connected to the same bit line pair via cell transistors.

If a plurality of word lines which are to be activated together all belong to the same repair region in the system in which only defective word lines are set into the non-selected state when a plurality of word lines which are to be activated together in the stacked-word-line test mode are defective and a plurality of spare word lines can be selected instead of the defective word lines, collision (data destruction) of cell data of the spare word lines used for replacement will not occur on the bit line pairs even when a plurality of defective word lines among the above word lines activated together are replaced by a plurality of spare word lines connected to the same bit line pairs via the cell transistors.

The twentieth embodiment is to disable only the spare word lines which are to be substituted for the defective word lines in a case where all of the word lines which are to be activated together in the stacked-word-line test mode do not belong to the same repair region. The system in which a plurality of spare word lines used for replacement are connected to the same bit line pairs via cell transistors is a system which has a independent array for redundancy replacement corresponding to the normal memory cell array, for example.

In the DRAM test, a test for continuously activating word lines for a long period of time and giving stress to cells around the word lines is provided. By applying the stacked-word-line test mode to the above test, test time can be drastically reduced. Further, at the time of application of stress, it is important not only to activate the word lines but to latch data correctly on the bit line pairs, and therefore, data should not be latched to destroy data on the word lines activated together. If a plurality of defective word lines replaced by a plurality of spare word lines connected to the same bit line pairs via cell transistors do not lie in the same repair region, the column addresses of cells replaced by column redundant elements on the plurality of spare word lines may be different. Therefore, there may occur a possibility that data destruction occurs due to indeterminate cells on the spare word lines previously activated. As a result, since the test becomes meaningless if the test is made as it is, only the spare word lines which are to be substituted for the defective word lines are disabled in this invention.

The operation for setting only the spare word lines into the disable state can be attained by using a redundancy disable test mode which is generally known. The function can be attained by preventing corresponding spare word lines from being activated while the function of disabling the defective word lines is kept effective when a redundancy hit is made.

As a result, no stress is applied to the cells around the spare word lines at the test time. Because of the two reasons (6), (7) described below, however, there occurs, there occurs substantially little possibility that cells which passed the test become defective after shipment and no problem occurs in practice.

(6) The probability that cells are detected to be defective by this test is originally extremely low.

(7) Word lines arranged near the spare word lines used for replacement in the independent array for redundancy are not always used for replacement and there may occur no problem even if no stress is applied to the surroundings thereof.

Thus, it is understood that the usable range of the test mode using the stacked-word-line test mode can be enlarged by use of the twentieth embodiment.

It is also understood that the semiconductor storage devices according to the twentieth embodiments are one example of a semiconductor storage device associated with a column redundancy system which sets repair regions of column redundancy according to row addresses and configured to set only defective word lines into a non-selected state when a plurality of word lines which are to be activated together in the stacked-word-line test mode are defective and deactivate a plurality of spare word lines which are to be used instead of the defective word lines.

Twenty-First Embodiment

A semiconductor storage device according to a twenty-first embodiment of this invention is associated with a column redundancy system which sets repair regions of column redundancy according to row addresses and configured to assign addresses in order from the lowest-order address (least significant bit) as column repair region setting addresses among physical addresses used to distinguish bits on a bit line pair when repair regions are set to divide the bit line.

Since the column redundancy system which sets repair regions of column redundancy according to row addresses permits the number of column redundant elements to be increased without increasing the number of spare columns (spare cells) or without increasing the number of spare CSLs, it is a redundancy system with high area efficiency (refer to FIG. 55 and the description associated with FIG. 55). If the number of column repair region setting row addresses is increased in the column redundancy system, it becomes necessary to set repair regions so as to divide one bit line (bit line pair) in some cases. At this time, a method for selecting row addresses in order from the highest possible address is provided as a method for selecting the row addresses used to set the repair regions from the physical addresses used to distinguish bits on a bit line pair. For example, addresses AR0 to AR8 are used as the physical addresses which are used to distinguish bits on a bit line pair if the physical row addresses of a bit map are assigned in order as shown in FIGS. 55 and 58. The method is to select AR7 and AR8 when, for example, two bits are selected from the physical addresses as row addresses to set the repair regions. The above selection method can suppress the number of boundaries between the repair regions on one bit line pair. Therefore, the probability that a defect which extends over the repair regions and requires two or more elements for repair occurs can be suppressed to minimum and the effect that a lowering in the repair efficiency of the whole memory cell array can be suppressed can be attained (refer to the tenth embodiment).

However, a case wherein the above selection method of the column repair region setting row addresses causes a problem may be considered. If AR7 and AR8 are selected as the repair region setting row addresses, cells on one bit line pair are distributed into four repair regions and cells which belong to the same repair region are successive cells in a range having width which is ¼ times that of the bit line (bit line pair). In this case, if a relatively large defect extending in a direction in which the bit line extends by some causes occurs, only one redundant element is used to compensate for the detect if the defect lies in one repair region at the time of test before shipment.

The problem is that the defect which is recognized as lying within one repair region may be recognized after shipment as a larger defect, that is, a defect in the market may be caused. As the reason for this, the following reasons (8), (9) are considered.

(8) Limitation of Screening:

Since all of the operation conditions by the users cannot be reproduced in the test, there may be a case wherein a defect which is regarded as a larger defect on a specific operation condition may be overlooked. This is because it is difficult to determine what type of test should be effected for screening since the cause of a huge defect is not made clear at the time of test in many cases.

(9) Growth of Defect:

A huge defect may be changed into a larger defect due to deterioration with time in some cases. This is because the cause of the defect cannot be made clear, and when this type of defect occurs, no effective measure can be taken.

In order to solve the above problem caused by the reasons (8), (9), in this embodiment, when column repair region setting addresses are selected from physical addresses used to distinguish bits on a bit line pair, the addresses are selected in order from the low-order address (least significant bit). That is, in this example, AR0 and AR1 are selected instead of selecting AR7 and AR8. In this case, cells having the same addresses AR0 and AR1 belong to the same repair region. Therefore, if a defect having a size larger than the size of four word lines in a direction in which the bit line extends is repaired or compensated for by performing a column redundancy replacement process, four column redundant elements corresponding to the four repair regions are used. This means that only a portion of the bit line pair containing the defect is not replaced, but the whole portion of the bit line pair (Full BL) is replaced when taking into consideration that cells on one bit line pair are distributed in the four repair regions.

That is, the idea of the present embodiment is that column repair region setting addresses are so selected that the whole portion of the bit line pair, if possible, will be replaced when a large defect is repaired in a case where the repair regions are set to divide the bit line. Thus, it is possible to previously prevent occurrence of a defect in the market due to the causes (8), (9).

If the column repair region setting addresses are selected in the manner described above, a plurality of column redundant elements are used without fail to repair a defect which continuously extends over two or more bits in a direction in which the bit line extends. For example, four column redundant elements are used in order to repair a defect which continuously extends over four or more bits. In a case where the addresses are selected as column repair region setting addresses from physical addresses used to distinguish bits on a bit line pair, a plurality of column redundant elements will be used even when a plurality of column redundant elements are not necessarily used to repair the defect if column repair region setting addresses are selected from the high-order address. Therefore, if the probability of occurrence of a defect which continuously extends over two or more bits becomes high, the repair efficiency is lowered.

Therefore, if the probability that a defect in the market occurs because sufficient screening of huge defects cannot be attained is significantly low, the addresses may be assigned as column repair region setting addresses in order from the high-order address from physical addresses used to distinguish bits on a bit line pair in order to suppress a lowering in the repair efficiency. Thus, assignment of addresses from the high-order or low-order address should be determined by sufficiently taking what kind of defect frequently occurs into consideration based on the technology of each generation.

Twenty-Second Embodiment

A semiconductor storage device according to a twenty-second embodiment of this invention is associated with a column redundancy system which sets repair regions of column redundancy according to row addresses and configured to assign addresses in order from the second, third or fourth address from the lowest-order address as column repair region setting addresses among physical addresses used to distinguish bits on a bit line pair when the repair regions are set to divide the bit line.

In the twenty-first embodiment, the addresses are assigned in order from the lowest-order address as the column repair region setting addresses when the repair regions are set to divide the bit line. As described before, if the column repair region setting addresses are selected in the above manner, a plurality of column redundant elements are used without fail to repair a defect which continuously extends over two or more bits in a direction in which the bit line extends. Therefore, if the probability of occurrence of a defect which continuously extends over two or more bits becomes high, the repair efficiency is lowered.

Figure 62:
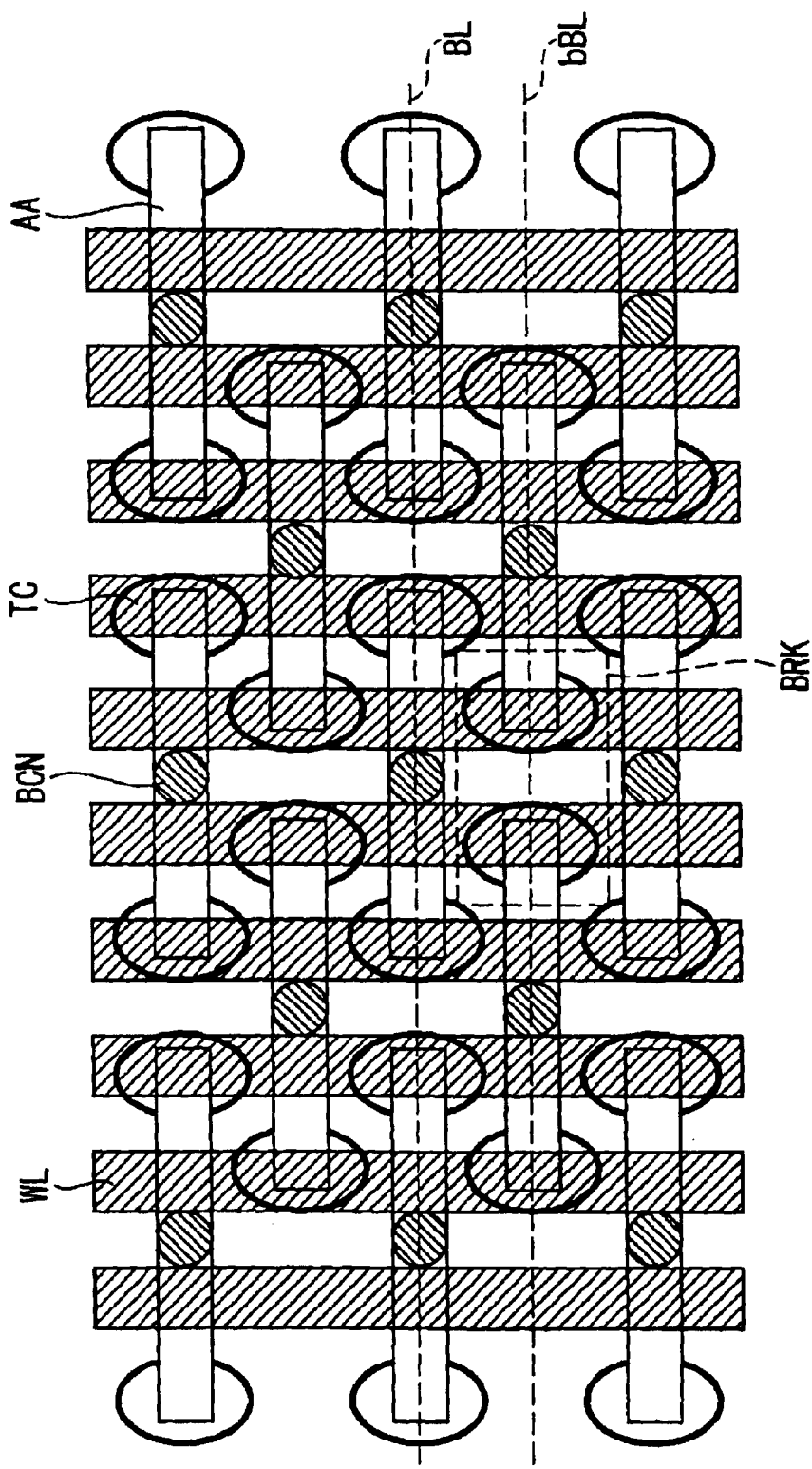
FIG. 62 is a schematic view showing the pattern layout of the ½ pitch cell array configuration of a trench cell.

In some devices, bit line contacts which connect bit lines to active areas (diffused regions) forming source/drain portions of cell transistors are made open in a defective mode in the cell array. The defective mode is explained with reference to FIG. 62. FIG. 62 is a schematic view showing the pattern layout of the ½ pitch cell array configuration of a trench cell. Word lines WL and bit line pairs BL, bBL are arranged to cross one another. In the semiconductor substrate below the bit line pairs BL, bBL, active areas (diffused regions) AA forming source/drain portions of cell transistors are formed in a zig-zag pattern between adjacent bit lines. The bit line pairs BL, bBL and the active areas AA are electrically connected to one another via bit line contacts BCN. Trench cells TC are formed on both sides of each of the active areas AA. The trench cells TC are arranged in a back-to-back pattern as indicated by broken lines BRK.

If an open defect of the bit line contact BCN occurs, two successive bits extending in a direction in which the bit line extends become defective cells. If the above defect occurs with a high probability in the technology of a certain generation, two elements are used to repair the defect as far as the lowest-order address is assigned as the column repair region setting address and the repair efficiency is significantly lowered.

Physical addresses used to distinguish two successive bits which become defective because the bit line contact BCN becomes open are only the lowest-order address AR0 or the lowest-order address AR0 and the second address AR1 from the lowest-order position depending on a bit map. If the above addresses are omitted from the repair region setting addresses (that is, if the addresses are selected in order from the second address (AR1) or third address (AR2) from the lowest-order position as the repair region setting row addresses), it becomes unnecessary to use a plurality of elements in order to repair the defect.

That is, in the twenty-second embodiment, if the probability that successive cells become defective in a specified defective mode (the cause thereof is clearly understood) is high, addresses which distinguish cells in the successive defect are omitted from the column repair region setting addresses and the column repair region setting addresses are selected from the lowest possible address when the repair regions are set to divide the bit line. Thus, occurrence of a defect in the market caused by a huge defect can be previously prevented basically by replacing the whole bit line pair in order to repair the huge defect as in the case of the twenty-first embodiment. Further, if the probability that successive cells become defective in a specified defective mode (the cause thereof is clearly understood) is high, a lowering in the repair efficiency can be suppressed.

In another defective mode, short circuits between cells (indicated by the broken lines BRK) which are arranged in a back-to-back form may frequently occur. As is clearly seen from FIG. 62, if such a defect occurs, a fail bit map becomes . . . pass-pass-fail-passpass-fail-pass-pass- . . . . The physical addresses to distinguish the defective cells in the defective mode are the lowest-order address AR0 and the second address AR1 from the lowest-order position or the lowest-order address AR0, the second address AR1 from the lowest-order position and the third address (AR2) from the lowest-order position depending on assignment of the addresses. Therefore, if the probability of occurrence of the defective mode is high, the addresses may be selected in order from the third address (AR2) or fourth address (AR3) from the lowest-order position as the repair region setting addresses.

The above explanation is made by taking the 1/2 pitch cell array configuration of the trench cells as an example, but the present embodiment can be applied to another array configuration. This is because defects will occur which are inherent to respective array configurations in which successive several bits may become defective, for example, successive two bits may become defective, every other bit or every third bit may become defective or successive three to eight bits may become defective.

Twenty-Third Embodiment

A semiconductor storage device according to a twenty-third embodiment of this invention is associated with a column redundancy system which sets repair regions of column redundancy according to row addresses and configured to assign addresses such that an address which is higher by one bit than the highest-order address in the addresses which are used to distinguish successive word lines among a plurality of word lines which configure a normal element replaced by a row redundant element will be assigned as the highest-order column repair region setting address among physical address used to distinguish bits on a bit line pair when the repair regions are set to divide the bit line.

The basic idea of the semiconductor storage device according to a twenty-first and twenty-second embodiments is that the whole bit line pair is replaced as far as possible when a huge defect which is continuous in a direction in which the bit line extends is repaired. However, it makes this idea meaningless to repair the huge defect by using the row redundancy replacement process instead of the column redundancy replacement process.

No serious problem will occur if the repair algorithm is designed to preferentially deal with the column redundancy replacement process so that the defects are first repaired as far as possible by use of the column redundancy replacement process and then the row redundancy replacement process is used if all column redundant elements are used up. However, if the row redundancy replacement process is preferentially dealt with, a defect of the size contained in successive word lines among a plurality of word lines configuring the normal element replaced by the row redundant element will be basically replaced by use of the row redundancy replacement process. As a result, the possibility of occurrence of a defect in the market caused by the huge defect as described before cannot be avoided.

Therefore, even if the lower-order addresses which are lower than the addresses used to distinguish successive word lines among a plurality of word lines configuring the normal element replaced by the row redundant element are set as the column repair region setting row addresses, the number of boundaries between the repair regions on the bit line pair is increased without making any sense and it cannot be said that it is good for the repair efficiency of the whole memory cell array.

Next, the semiconductor storage device according to the twenty-third embodiment is explained by using a concrete example. For example, in a case where a normal element replaced by use of the row redundancy replacement process is configured by two groups of 16 successive word lines (that is, all of the 32 word lines are simultaneously replaced), physical addresses used to distinguish the 16 successive word lines are four bits of AR0 to AR3. At this time, in the present embodiment, AR4 which is the fifth address from the lowest-order position and the lower-order addresses (if a plurality of addresses are required) are selected when the column repair region setting row address or addresses are selected from physical addresses (AR0 to AR8) used to distinguish bits on a bit line pair. As a result, a huge defect larger than the size of 16 word lines can be repaired without fail by replacing the whole portion of the bit line.

Thus, in the twenty-third embodiment, the possibility of occurrence of a defect in the market caused by the huge defect can be avoided and a lowering in the repair efficiency due to usage of an unnecessarily large number of redundant elements can be suppressed to minimum.

Twenty-Fourth Embodiment

A semiconductor storage device according to a twenty-fourth embodiment of this invention is associated with a column redundancy system which sets repair regions of column redundancy according to row addresses and configured to satisfy the following conditions (a1) to (c1) when the repair regions are set to divide the bit line.

(a1): Word lines which are activated together in the memory cell array and used for reading/writing independent data simultaneously depending on data line configuration are set to belong to the same repair region.

(b1): The number of repair regions which divide the bit line is suppressed to minimum.

(c1): The addresses are assigned in order from the lowest-order address as column repair region setting addresses among physical addresses used to distinguish bits on a bit line pair.

The assigning column repair region setting row addresses so that word lines which are activated together in the memory cell array and used for reading/writing independent data simultaneously based on the data line configuration may belong to the same repair region is to make maximum the number of word lines which can be used to simultaneously read/write independent data items even if the column redundancy replacement process is performed. Therefore, the number of independent data items which can be simultaneously read/written in one memory cell array becomes maximum and it is possible to attain the effect that a memory cell array configuration with high data transfer rate can be made.

For example, in the data line configuration shown in FIGS. 58 and 59, independent data items can be simultaneously read/written with respect to four word lines in total selected one at a time from each of the regions "a", "b", "c", "d". Since the operation for activating the four word lines can be attained by bypassing information of AR12, the address AR12 is omitted from the column repair region setting row addresses.

In this case, the operation for making minimum the number of repair regions which divide the bit line specifically means the following fact. Assume a 16-Mbit memory cell array as shown in FIG. 58. If a column redundancy system having a repair efficiency of four redundant elements for one Mbit of the repair region is necessary, the whole portion of the 16-Mbit memory cell array is divided into 16 repair regions by use of row addresses of four bits. If the column repair region setting row addresses of four bits are all selected from AR0 to AR8 which are physical addresses used to distinguish bits on a bit line pair, cells on one bit line pair are distributed into as many as 16 repair regions. As a result, in order to perform the operation for compensating for the column fail/failure in which the whole portion of the bit line pair must be replaced, for example, it is necessary to use 16 column redundant elements and the repair efficiency may be significantly lowered.

The operation for making minimum the number of repair regions which divide the bit line in the twenty-fourth embodiment means that the largest possible number of physical addresses (AR0 to AR8) used to distinguish bits on a bit line pair are excluded when the column repair region setting addresses are selected. That is, when the column repair region setting addresses of four bits are selected from the addresses which are not higher than AR11, three bits are set to be AR11, AR10, AR9 and only one bit is selected from AR0 to AR8 which are physical addresses used to distinguish bits on a bit line pair. As a result, since cells on one bit line pair are distributed in two repair regions, it is only necessary to use two redundant elements when the whole portion of the bit line pair must be replaced.

Further, in the twenty-fourth embodiment, since the addresses are assigned in order from the lowest-order address as the column repair region setting addresses among the physical addresses (AR0 to AR8) used to distinguish bits on the bit line pair, the remaining one bit of the column repair region setting addresses is set to the lowest-order address AR0. Thus, since a huge defect can be compensated for without fail by replacing the whole portion of the bit line pair, the effect that occurrence of a defect in the market caused by the huge defect can be previously prevented as described in the twenty-first embodiment can also be attained.

Twenty-Fifth Embodiment

A semiconductor storage device according to a twenty-fifth embodiment of this invention is associated with a column redundancy system which sets repair regions of column redundancy according to row addresses and configured to satisfy the following conditions (a2) to (c2) when the repair regions are set to divide the bit line.

(a2): Word lines which are activated together in the memory cell array and used for reading/writing independent data simultaneously based on the data line configuration are set to belong to the same repair region.

(b2): The number of repair regions which divide the bit line is suppressed to minimum.

(c2): The addresses are assigned in order from the second, third or fourth address from the lowest-order position as column repair region setting addresses among physical addresses used to distinguish bits on a bit line pair.

The twenty-fifth embodiment is obtained by adding the factor of the twenty-second embodiment to the twenty-fourth embodiment and it is possible to attain the effect that a lowering in the repair efficiency can be suppressed even when the probability that cells successive in a specified defective mode (the cause thereof is made clear) become defective is high in addition to the effect obtained in the twenty-fourth embodiment.

Twenty-Sixth Embodiment

A semiconductor storage device according to a twenty-sixth embodiment of this invention is associated with a column redundancy system which sets repair regions of column redundancy according to row addresses and configured to satisfy the following conditions (a3) to (c3) when the repair regions are set to divide the bit line.

(a3): Word lines which are activated together in the memory cell array and used for reading/writing independent data simultaneously based on the data line configuration are set to belong to the same repair region.

(b3): The number of repair regions which divide the bit line is suppressed to minimum.

(c3): An address which is higher by one bit than the highest-order address of the addresses used to distinguish successive word lines among a plurality of word lines configuring a normal element replaced by a row redundant element is set as the highest-order column repair region setting address among physical addresses used to distinguish bits on a bit line pair.

The twenty-sixth embodiment is obtained by adding the factor of the twenty-third embodiment to the twenty-fourth embodiment and it is possible to attain the effect that a lowering in the repair efficiency caused by using redundant elements of a larger number than necessary can be suppressed to minimum in addition to the effect obtained in the twenty-fourth embodiment.

Twenty-Seventh Embodiment

A semiconductor storage device according to a twenty-seventh embodiment of this invention is a system in which a plurality of word lines connected to the same bit line via cell transistors can be activated together in an operation mode which holds once activated word lines in the activated state in a plurality of successive word line selection cycles (for example, in a stacked-word-line test mode). The system is associated with a column redundancy system which sets repair regions of column redundancy according to row addresses and configured to satisfy the following conditions (a4) to (d4) when the repair regions are set to divide the bit line.

(a4): Word lines which are activated together in the memory cell array and used for reading/writing independent data simultaneously based on the data line configuration are set to belong to the same repair region.

(b4): The number of repair regions which divide the bit line is suppressed to minimum.

(c4): The number of word lines which can be connected to the same bit line via cell transistors and activated together in the same repair region in an operation mode which holds once activated word lines in the activated state in a plurality of successive word line selection cycles (for example, in a stacked-word-line test mode) is set to maximum.

(d4): The addresses are assigned in order from the lowest possible address as the column repair region setting addresses among physical addresses used to distinguish bits on a bit line pair.

The semiconductor storage device according to the twenty-seventh embodiment is a modification of the twenty-fourth embodiment. In this semiconductor storage device, when the column repair region setting addresses are selected from the physical addresses (AR0 to AR8) used to distinguish bits on a bit line pair, the column repair region setting addresses are selected in order from the lowest possible address while avoiding addresses which are to be bypassed in the stacked-word-line test mode as far as possible. As a result, the number of word lines which can be used to simultaneously write data in the stacked-word-line test mode is set to maximum and test time can be reduced.

Twenty-Eighth Embodiment

A semiconductor storage device according to a twenty-eighth embodiment of this invention is a system in which a plurality of word lines connected to the same bit line via cell transistors can be activated together in an operation mode which holds once activated word lines in the activated state in a plurality of successive word line selection cycles (for example, in a stacked-word-line test mode). This system is associated with a column redundancy system which sets repair regions of column redundancy according to row addresses and configured to satisfy the following conditions (a5) to (d5) when the repair regions are set to divide the bit line.

(a5): Word lines which are activated together in the memory cell array and used for reading/writing independent data simultaneously based on the data line configuration are set to belong to the same repair region.

(b5): The number of repair regions which divide the bit line is suppressed to minimum.

(c5): The number of word lines which can be connected to the same bit line via cell transistors and activated together in the same repair region in an operation mode which holds once activated word lines in the activated state in a plurality of successive word line selection cycles (for example, in a stacked-word-line test mode) is set to maximum.

(d5): The addresses are assigned in order from the second, third or fourth address from the lowest-order position as the column repair region setting addresses among physical addresses used to distinguish bits on a bit line pair.

The semiconductor storage device according to the twenty-eighth embodiment is a modification of the twenty-fifth embodiment, the number of word lines which can be used to simultaneously write data in the stacked-word-line test mode is set to maximum and test time can be reduced.

Twenty-Ninth Embodiment

A semiconductor storage device according to a twenty-ninth embodiment of this invention is a system in which a plurality of word lines connected to the same bit line via cell transistors can be activated together in an operation mode which holds once activated word lines in the activated stat in a plurality of successive word line selection cycles (for example, in a stacked-word-line test mode). This system is associated with a column redundancy system which sets repair regions of column redundancy according to row addresses and configured to satisfy the following conditions (a6) to (d6) when the repair regions are set to divide the bit line.

(a6): Word lines which are activated together in the memory cell array and used for reading/writing independent data simultaneously based on the data line configuration are set to read/write independent data items are set to belong to the same repair region.

(b6): The number of repair regions which divide the bit line is suppressed to minimum.

(c6): The number of word lines which can be connected to the same bit line via cell transistors and activated together in the same repair region in an operation mode which holds once activated word lines in the activated state in a plurality of successive word line selection cycles (for example, in a stacked-word-line test mode) is set to maximum.

(d6): An address which is higher by one bit than the highest-order address of the addresses used to distinguish successive word lines among a plurality of word lines configuring a normal element replaced by a row redundant element is set as the highest-order column repair region setting address among physical addresses used to distinguish bits on a bit line pair.

The semiconductor storage device according to the twenty-ninth embodiment is a modification of the twenty-sixth embodiment, the number of word lines which can be used to simultaneously write data in the stacked-word-line test mode is set to maximum and test time can be reduced.

As described above, according to one aspect of this invention, a semiconductor storage device in which the test technique and redundancy technology are optimized at a high level can be attained.

Further, a semiconductor storage device in which test time can be reduced and the function test can be simplified can be attained.

Also, a semiconductor storage device in which the redundancy technology with high efficiency and low cost can be realized can be attained.

In addition, a semiconductor storage device in which test time can be reduced and the function test can be simplified even when the redundancy technology with high efficiency and low cost is applied can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device in which a plurality of word lines are activated together by causing each of the word lines which is once activated to hold the activated state during a plurality of successive word line selection cycles, comprising:

a latch circuit which is configured to derive the logical AND of a signal activated when a corresponding memory block is accessed and a redundancy miss is first made and a signal generated in each cycle to determine timing for activating a sense amplifier in each cycle, and generates and holds a sense amplifier activation signal.

2. The semiconductor storage device in which a claim 1, wherein a plurality of word line memory block are activated together.

* * * * *